(12) United States Patent
Kurokawa

(10) Patent No.: US 9,768,174 B2
(45) Date of Patent: Sep. 19, 2017

(54) SEMICONDUCTOR DEVICE

(71) Applicant: Semiconductor Energy Laboratory Co., Ltd., Atsugi-shi, Kanagawa-ken (JP)

(72) Inventor: Yoshiyuki Kurokawa, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/210,068

(22) Filed: Jul. 14, 2016

(65) Prior Publication Data

US 2017/0025415 A1    Jan. 26, 2017

(30) Foreign Application Priority Data

Jul. 21, 2015 (JP) ................................. 2015-143919
Jun. 16, 2016 (JP) ................................. 2016-119551

(51) Int. Cl.
| | |
|---|---|
| G11C 11/04 | (2006.01) |
| H01L 27/105 | (2006.01) |
| H01L 29/786 | (2006.01) |
| H01L 27/12 | (2006.01) |
| G11C 5/06 | (2006.01) |
| G11C 7/06 | (2006.01) |
| G11C 7/12 | (2006.01) |
| G11C 11/404 | (2006.01) |

(52) U.S. Cl.
CPC ............ *H01L 27/1052* (2013.01); *G11C 5/06* (2013.01); *G11C 7/062* (2013.01); *G11C 7/12* (2013.01); *G11C 11/4045* (2013.01); *H01L 27/124* (2013.01); *H01L 27/1225* (2013.01); *H01L 27/1255* (2013.01); *H01L 29/7869* (2013.01)

(58) Field of Classification Search
CPC .................................................. G11C 11/4045
USPC ......................................................... 365/149
See application file for complete search history.

(56) References Cited

U.S. PATENT DOCUMENTS

| | | |
|---|---|---|
| 6,754,439 B1 | 6/2004 | Hensley et al. |
| 8,482,974 B2 | 7/2013 | Saito et al. |
| 8,547,753 B2 | 10/2013 | Takemura et al. |
| 9,065,438 B2 | 6/2015 | Aoki et al. |

(Continued)

OTHER PUBLICATIONS

Kawashima.S et al., "13.3-in. 8K×4K 664-ppi OLED Display Using CAAC-OS FETs", SID Digest '14 : SID International Symposium Digest of Technical Papers, Jun. 3, 2014, pp. 627-630.

*Primary Examiner* — Hoai V Ho
(74) *Attorney, Agent, or Firm* — Robinson Intellectual Property Law Office; Eric J. Robinson

(57) ABSTRACT

A semiconductor device for efficiently compressing a large volume of image data is provided. The semiconductor device includes a memory cell array, an analog processing circuit, a writing circuit, and a row driver, whereby highly efficient compressing of image data can be performed. A first current corresponding to first data and a second current corresponding to one of a plurality of second data that is a target for comparison with the first data are generated in the writing circuit. A differential current between the first current and the second current is supplied to the analog processing circuit, so that the first data and the plurality of second data are compared. Accordingly, a piece of the second data that has the same content as the first data is detected, and a displacement from the first data to the second data can be calculated.

16 Claims, 39 Drawing Sheets

(56) References Cited

U.S. PATENT DOCUMENTS

| | | |
|---|---|---|
| 9,135,880 B2 | 9/2015 | Koyama |
| 9,172,370 B2 | 10/2015 | Ikeda et al. |
| 2001/0035548 A1* | 11/2001 | Wahlstrom ............ G11C 11/405 257/296 |
| 2007/0040890 A1 | 2/2007 | Morioka et al. |
| 2009/0027254 A1 | 1/2009 | Troxel |
| 2016/0064443 A1 | 3/2016 | Inoue et al. |
| 2016/0064444 A1 | 3/2016 | Inoue et al. |

* cited by examiner

FIG. 6A

| |
|---|
| 1S; A current $i_b[j]$ corresponding to the pixel column 31[j] of region 31 is generated by the current supply circuit 301[j] and the current $i_b[j]$ is supplied to the memory cell [i, j]. |

↓

| |
|---|
| 2S; A charge corresponding to the current $i_b[j]$ is stored in memory cell [i, j], and determines the amount of a current that can be flown in the transistor Tr1. |

↓

| |
|---|
| 3S; A current $i_c[j]$ corresponding to the pixel column 41[j] is generated and flows from the current supply circuit 301[j] to the wiring BL[j]. |

↓

| |
|---|
| 4S; A differential current between the current $i_b[j]$ and the current $i_c[j]$ discharged from the wiring BL[j] to the rectifier circuit 201[j] or sunk from the rectifier circuit 201[j] to the wiring BL[j]. The differential current is input to/output from the comparison circuit 202, whereby the comparison circuit 202 outputs an analog value as the correspondence degree. |

FIG. 6B

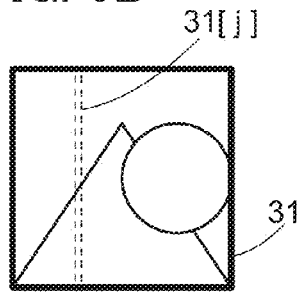

FIG. 6C

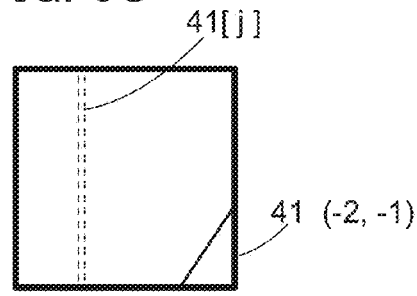

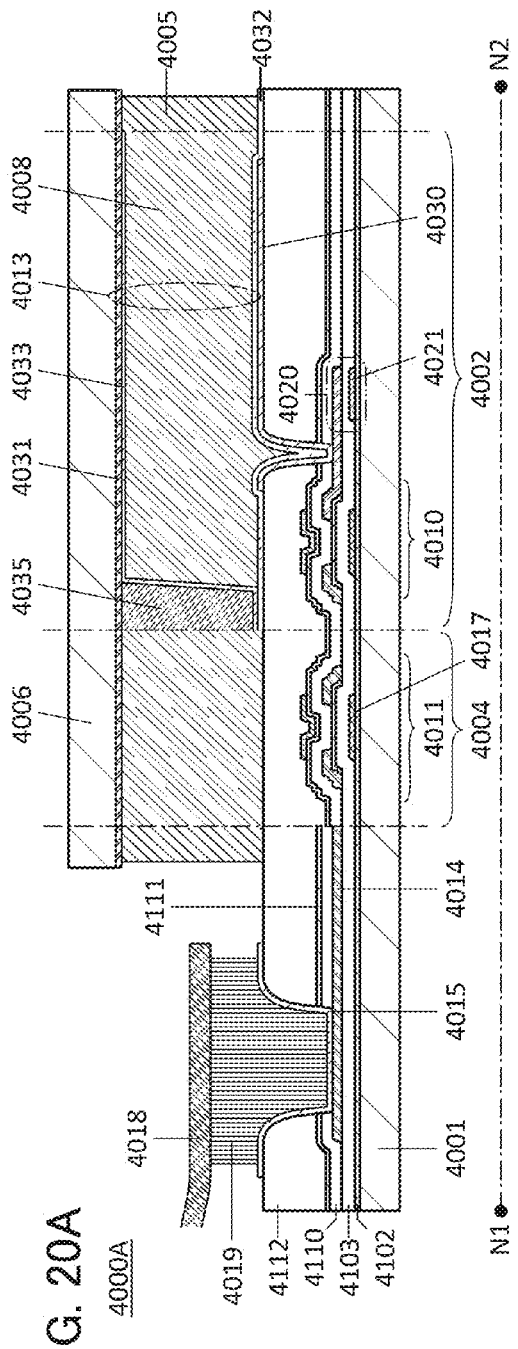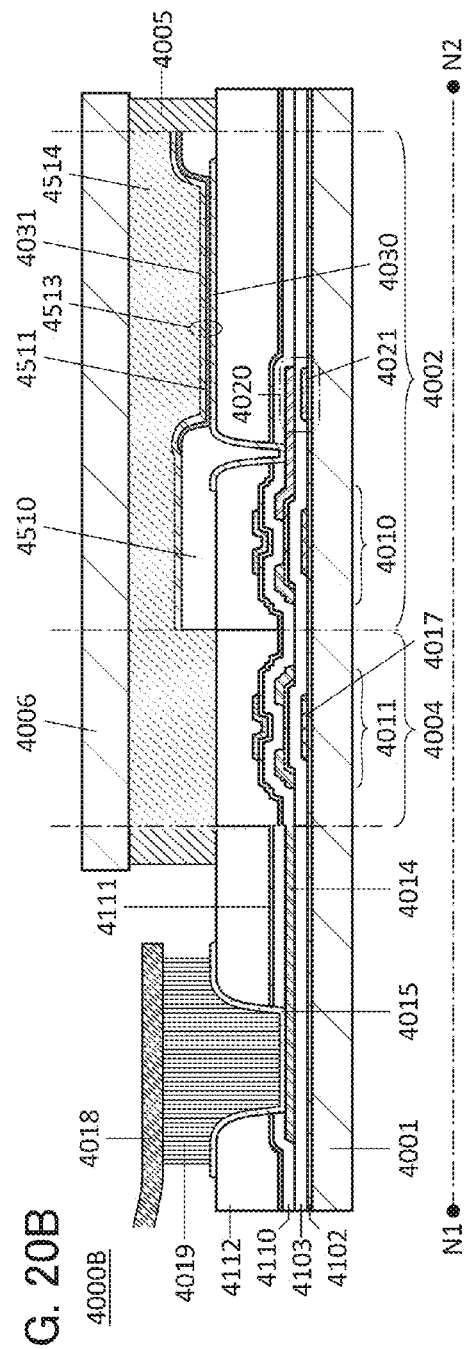

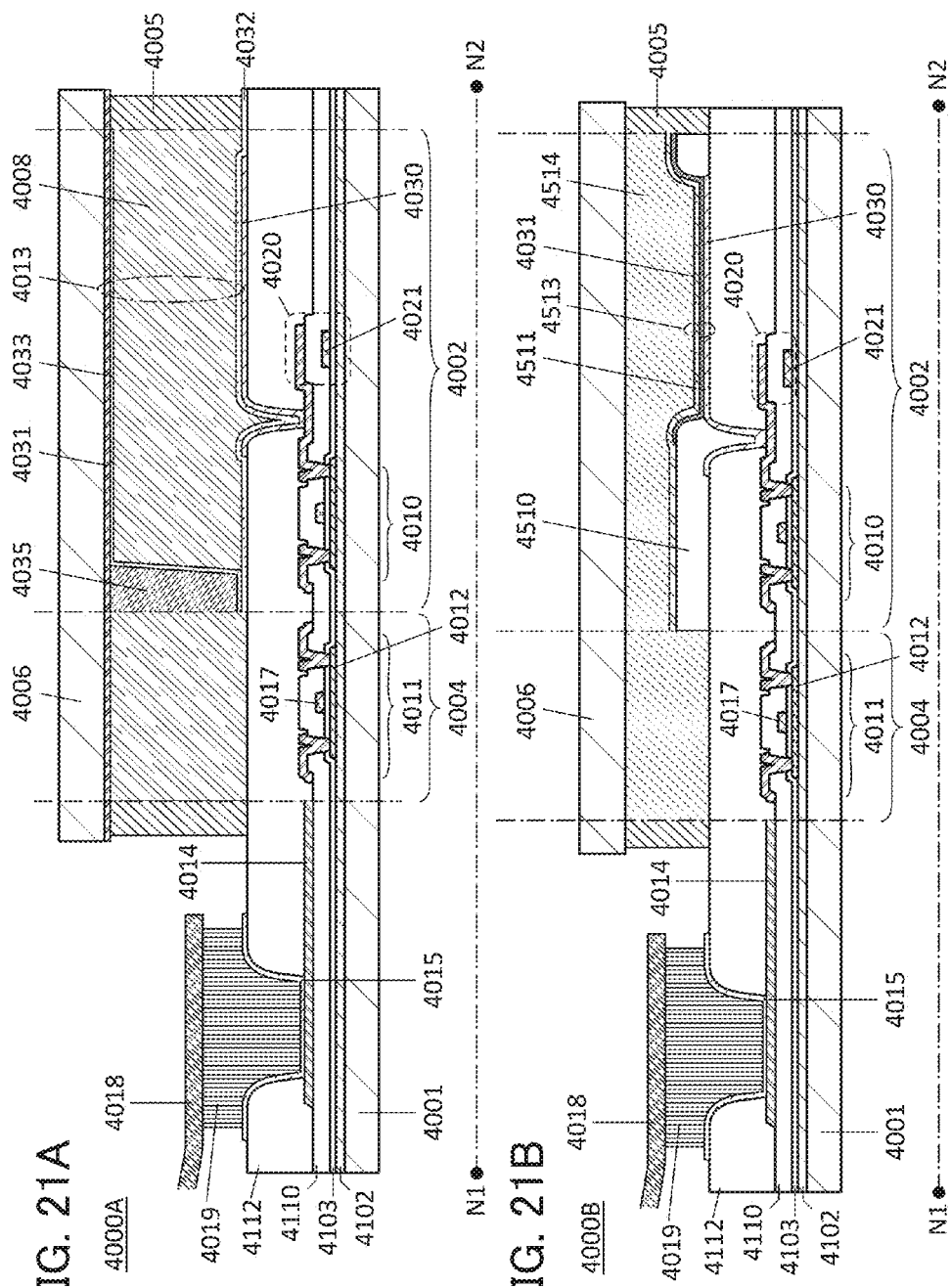

FIG. 26A
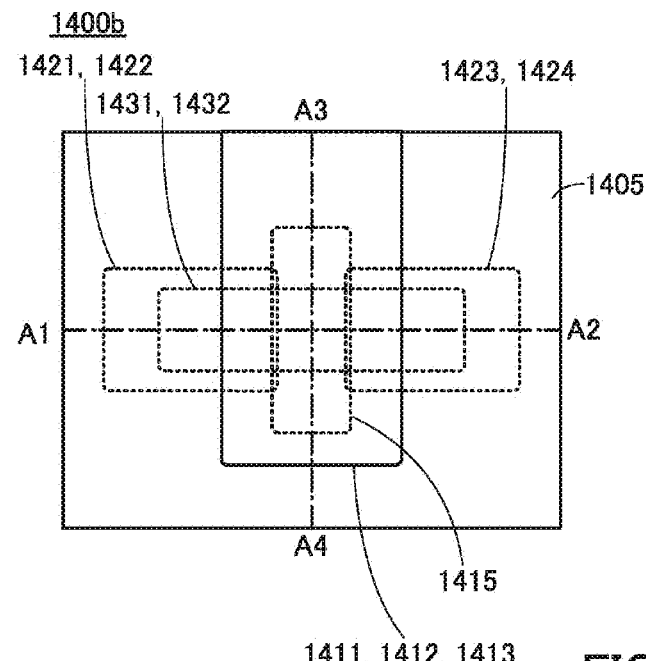
FIG. 26B
FIG. 26C
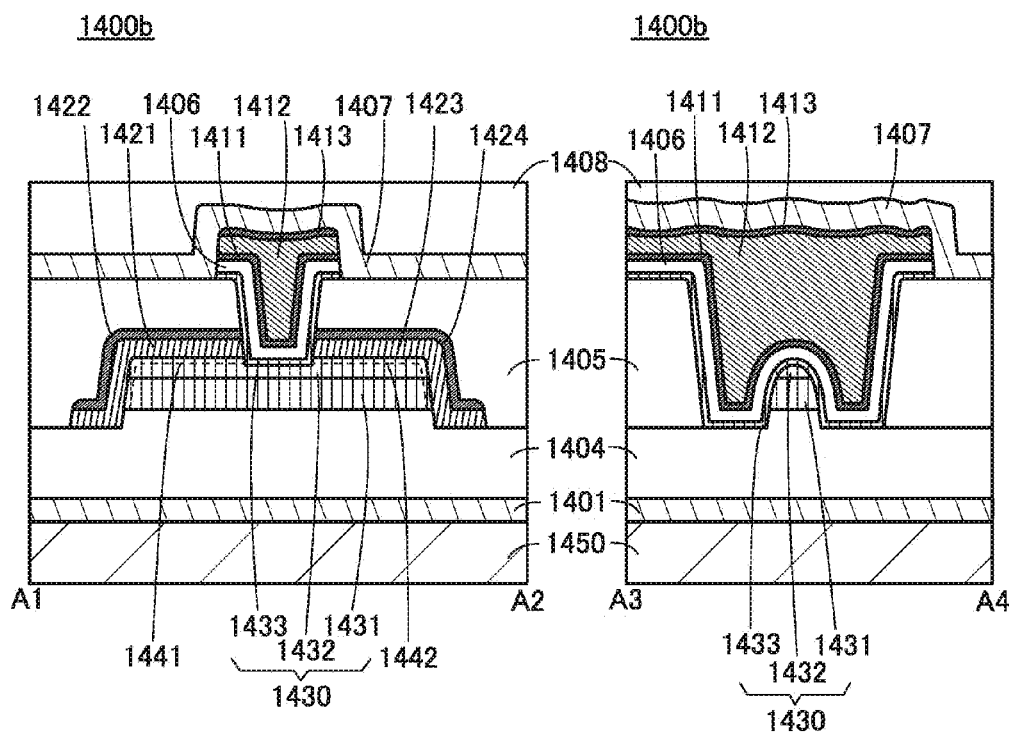

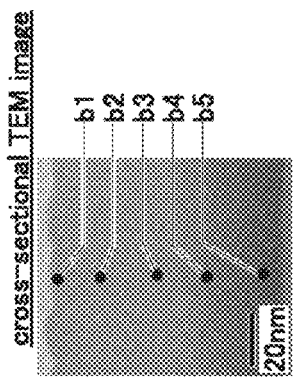
FIG. 38A
plan-view TEM image
FIG. 38B
cross-sectional TEM image

SEMICONDUCTOR DEVICE

BACKGROUND OF THE INVENTION

1. Field of the Invention

One embodiment of the present invention relates to a semiconductor device.

Note that one embodiment of the present invention is not limited to the above technical field. The technical field of the invention disclosed in this specification and the like relates to an object, a method, or a manufacturing method. Another embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, a converter, an encoder, a decoder, a tuner, an electronic device, a method for driving any of them, a method for manufacturing any of them, a method for testing any of them, and a system including any of them.

2. Description of the Related Art

As a screen of a television (TV) becomes larger, it is desired to be able to watch high-definition video. For this reason, ultra-high definition TV (UHDTV) broadcast has been increasingly put into practical use. Japan, which has promoted UHDTV broadcast, started 4K broadcast services utilizing a communication satellite (CS) and an optical line in 2015. The test broadcast of UHDTV (4K and 8K) by a broadcast satellite (BS) will start in the future. Therefore, various electronic devices which correspond to 8K broadcast are developed (see Non-Patent Document 1). In practical 8K broadcasts, 4K broadcasts and 2K broadcasts (full-high vision broadcast) will be also employed.

REFERENCE

Non-Patent Document

[Non-Patent Document 1]
S. Kawashima, et al., "13.3-In. 8K×4K 664-ppi OLED Display Using CAAC-OS FETs," SID 2014 DIGEST, pp. 627-630.

SUMMARY OF THE INVENTION

As a video encoding method in 8K broadcast, a new standard of H.265 MPEG-H high efficiency video coding (HEVC) is employed. The resolution (the number of pixels in the horizontal and perpendicular directions) of an image in 8K broadcast is 7680×4320, which is 4 times as high as those in 4K (3840×2160) broadcast and is 16 times as high as those in 2K (1920×1080) broadcast. Thus, a large volume of image data are required to be processed in 8K broadcast.

In order to transmit a large volume of image data for 8K broadcast in a limited broadcast band, compression (encoding) of the image data is important. An encoder enables the compression of image data by intra-frame prediction (acquisition of differential data between adjacent pixels), inter-frame prediction (acquisition of differential data in each pixel between frames), motion-compensated prediction (acquisition of differential data in each pixel between a predicted image of a moving object based on a predicted motion and an actual image of the object based on the actual motion, orthogonal transform (discrete cosine transform), encoding, or the like.

Highly efficient compression of image data is required to transmit broadcast signals in real time. That is, a highly efficient encoder is required to transmit a large volume of image data for 8K broadcast.

An object of one embodiment of the present invention is to provide a novel semiconductor device. Another object of one embodiment of the present invention is to provide a module including the novel semiconductor device. Another object of one embodiment of the present invention is to provide an electronic device using the module including the novel semiconductor device. Another object of one embodiment of the present invention is to provide a novel semiconductor device, a novel memory device, a novel module, a novel electronic device, a novel system, and the like.

Another object of one embodiment of the present invention is to provide a method for compressing a large volume of data by a novel semiconductor device. Another object of one embodiment of the present invention is to provide a method for efficiently compressing data by a novel semiconductor device.

Note that the objects of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention solves at least one of the above objects and the other objects. One embodiment of the present invention need not solve all the aforementioned objects and the other objects.

(1) One embodiment of the present invention is a semiconductor device performing first to fourth steps. The semiconductor device includes a memory cell, a first circuit, a second circuit, and a first wiring. The memory cell is electrically connected to the first wiring. The first circuit is electrically connected to the first wiring. The second circuit is electrically connected to the first wiring. The first step has a step in which the first circuit supplies the memory cell with a first current corresponding to first data. The second step has a step in which the memory cell stores a charge corresponding to the first current and the amount of the stored charge determines a current amount to be flown from the first wiring to the memory cell. The third step has a step in which the first circuit supplies the first wiring with a second current corresponding to second data. The fourth step has a step in which the second circuit is supplied with a difference between the current amount and the amount of the second current so that the first data and the second data are compared.

(2) One embodiment of the present invention is the semiconductor device according to (1) in which the memory cell includes first to third transistors and a capacitor. One of a source and a drain of the first transistor is electrically connected to one of a source and a drain of the second transistor and one of a source and a drain of the third transistor. The other of the source and the drain of the first transistor is electrically connected to a first electrode of the capacitor. A gate of the first transistor is electrically connected to the other of the source and the drain of the third transistor and a second electrode of the capacitor. The other of the source and the drain of the second transistor is electrically connected to the first wiring. The other of the source and the drain of the first transistor is supplied with a first potential.

(3) One embodiment of the present invention is the semiconductor device according to (2) in which each of the first to third transistors includes an oxide semiconductor in a channel formation region.

(4) One embodiment of the present invention is the semiconductor device according to any one of (1) to (3) in which the second circuit includes fourth to sixth transistors, a second wiring, and a third wiring. One of a source and a drain of the fourth transistor is electrically connected to one of a source and a drain of the fifth transistor, one of a source and a drain of the sixth transistor, and a gate of the sixth transistor. The other of the source and the drain of the fourth transistor is electrically connected to the first wiring. The other of the source and the drain of the fifth transistor is electrically connected to a gate of the fifth transistor and the second wiring. The other of the source and the drain of the sixth transistor is electrically connected to the third wiring.

(5) One embodiment of the present invention is the semiconductor device according to (4) in which the second circuit further includes seventh to eleventh transistors, a first comparator, a second comparator, a first current mirror circuit, and a fourth wiring. An inverting input terminal of the first comparator is supplied with a second potential. A non-inverting input terminal of the first comparator is electrically connected to the second wiring and one of a source and a drain of the seventh transistor. An output terminal of the first comparator is electrically connected to a gate of the seventh transistor and a gate of the eighth transistor. One of a source and a drain of the eighth transistor is electrically connected to an output terminal of the first current mirror circuit, one of a source and a drain of the eleventh transistor, and the fourth wiring. An inverting input terminal of the second comparator is supplied with a third potential. A non-inverting input terminal of the second comparator is electrically connected to the third wiring and one of a source and a drain of the ninth transistor. An output terminal of the second comparator is electrically connected a gate of the ninth transistor and a gate of the tenth transistor. One of a source and a drain of the tenth transistor is electrically connected to an input terminal of the first current mirror circuit. The other of the source and the drain of the seventh transistor, the other of the source and the drain of the eighth transistor, and a potential input terminal of the first current mirror circuit are supplied with a fourth potential. The other of the source and the drain of the ninth transistor and the other of the source and the drain of the tenth transistor are supplied with a fifth potential. The other of the source and the drain of the eleventh transistor is supplied with a sixth potential. The seventh transistor and the eighth transistor are p-channel transistors. The ninth transistor, the tenth transistor, and the eleventh transistor are n-channel transistors. The fourth wiring outputs an analog value.

(6) One embodiment of the present invention is the semiconductor device according to (4) in which the second circuit further includes seventh to eleventh transistors, a first comparator, a second comparator, a first current mirror circuit, and a fourth wiring. An inverting input terminal of the first comparator is supplied with a second potential. A non-inverting input terminal of the first comparator is electrically connected to the second wiring and one of a source and a drain of the seventh transistor. An output terminal of the first comparator is electrically connected to a gate of the seventh transistor and a gate of the eighth transistor. An inverting input terminal of the second comparator is supplied with a third potential. A non-inverting input terminal of the second comparator is electrically connected to the third wiring and one of a source and a drain of the ninth transistor. An output terminal of the second comparator is electrically connected a gate of the ninth transistor and a gate of the tenth transistor. One of a source and a drain of the tenth transistor is electrically connected to an output terminal of the first current mirror circuit, one of a source and a drain of the eleventh transistor, and the fourth wiring. One of a source and a drain of the eighth transistor is electrically connected to an input terminal of the first current mirror circuit. The other of the source and the drain of the seventh transistor and the other of the source and the drain of the eighth transistor are supplied with a fourth potential. The other of the source and the drain of the ninth transistor, the other of the source and the drain of the tenth transistor, and a potential input terminal of the first current mirror circuit are supplied with a fifth potential. The other of the source and the drain of the eleventh transistor is supplied with a sixth potential. The seventh transistor and the eighth transistor are p-channel transistors. The ninth transistor, the tenth transistor, and the eleventh transistor are n-channel transistors. The fourth wiring outputs an analog value.

(7) One embodiment of the present invention is the semiconductor device according to any one of (1) to (6) in which the first circuit includes twelfth[1] to twelfth[s] transistors, a second current mirror circuit, and fifth[1] to fifth[s] wirings (s is an integer number of 1 or greater). The channel width ratio of the twelfth[1] transistor to the twelfth[t] transistor is $1:2^{t-1}$ (t is an integer number greater than or equal to 1 and less than or equal to s). An input terminal of the second current mirror circuit is electrically connected to one of a source and a drain of each of the twelfth[1] to twelfth[s] transistors. An output terminal of the second current mirror circuit is electrically connected to the first wiring. The other of the source and the drain of each of the twelfth[1] to twelfth[s] transistors is supplied with the first potential. Gates of the twelfth[1] to twelfth[s] transistors are electrically connected to the fifth[1] to fifth[s] wirings, respectively. Each of the fifth[1] to fifth[s] wirings is supplied with a plurality of potentials constituting the first data or the second data.

(8) One embodiment of the present invention is the semiconductor device according to any one of (1) to (6) in which the first circuit includes $2^u-1$ twelfth[1] to twelfth $[2^u-1]$ transistors, a second current mirror circuit, and u fifth[1] to fifth[u] wirings (u is an integer number of 1 or greater). An input terminal of the second current mirror circuit is electrically connected to one of a source and a drain of each of the twelfth[1] to twelfth[$2^u-1$] transistors. An output terminal of the second current mirror circuit is electrically connected to the first wiring. Gates of the twelfth[$2^{v-1}$] to twelfth[$2^v-1$] transistors are electrically connected to the fifth[v] wiring (v is an integer number greater than or equal to 1 and less than or equal to u). The other of the source and the drain of each of the twelfth[1] to twelfth[$2^u-1$] transistors is supplied with the first potential. Each of the fifth[1] to fifth[u] wirings is supplied with a plurality of potentials constituting the first data or the second data.

According to one embodiment of the present invention, a novel semiconductor device can be provided. According to one embodiment of the present invention, a module including the novel semiconductor device can be provided. According to one embodiment of the present invention, an electronic device using the module including the novel semiconductor device can be provided. According to one embodiment of the present invention, a novel semiconductor device, a novel memory device, a novel module, a novel electronic device, a novel system, and the like can be provided.

According to one embodiment of the present invention, a method for compressing a large volume of data by a novel semiconductor device can be provided. According to one embodiment of the present invention, a method for efficiently compressing data by a novel semiconductor device can be provided.

Note that the effects of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

FIG. 6A is a flow chart illustrating operation of a semiconductor device, and FIGS. 6B and 6C are diagrams for supplemental explanation of the flow chart in FIG. 6A.

FIGS. 20A and 20B are cross-sectional views illustrating structural examples of a display panel.

FIGS. 21A and 21B are cross-sectional views illustrating structural examples of a display panel.

FIGS. 26A to 26C are a top view and cross-sectional views showing a structure example of a transistor.

FIGS. 38A and 38B are TEM images of samples and FIGS. 38C to 38L are electron diffraction patterns thereof.

DETAILED DESCRIPTION OF THE INVENTION

In this specification, an encoder is referred to as a semiconductor device in some cases.

In this specification, an oxide semiconductor is referred to as an OS in some cases. A transistor including an oxide semiconductor in a channel formation region is referred to as an OS transistor in some cases.

Embodiment 1

In this embodiment, an example of a semiconductor device according to the disclosed invention will be described.

Structure Example

Figure 1:
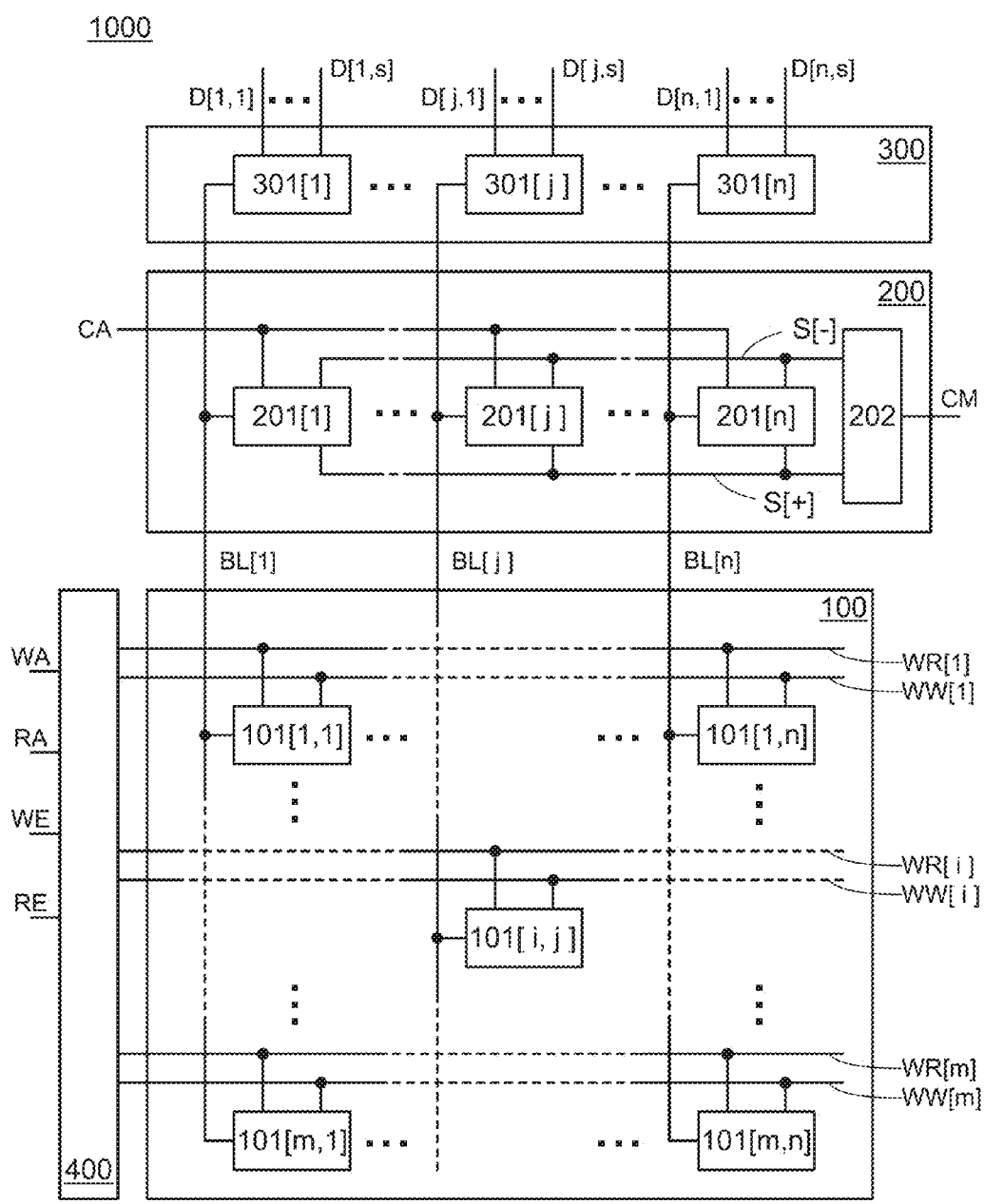
FIG. 1 is a block diagram illustrating a semiconductor device.

FIG. 1 illustrates a semiconductor device of one embodiment of the present invention. A semiconductor device 1000 includes a memory cell array 100, an analog processing circuit 200, a writing circuit 300, and a row driver 400. The memory cell array 100 is electrically connected to the row driver 400, and the writing circuit 300 is electrically connected to the memory cell array 100 through the analog processing circuit 200.

The memory cell array 100 includes memory cells 101[1, 1] to 101[m, n]. Specifically, m×n memory cells 101 are arranged in total in a matrix of n columns by m rows (m and n are each an integer number of 1 or greater). The memory cell 101[i, j] (i is an integer number greater than or equal to 1 and less than or equal to m, and j is an integer number greater than or equal to 1 and less than or equal to n) is electrically connected to the row driver 400 through a wiring WR[i] and a wiring WW[i], and is electrically connected to the analog processing circuit 200 and the writing circuit 300 through a wiring BL[j].

The analog processing circuit 200 includes rectifier circuits 201[1] to 201[n] and a comparison circuit 202. The rectifier circuit 201[j] is electrically connected to the wiring BL[j], a wiring CA, a wiring S[+], and a wiring S[−]. The comparison circuit 202 is electrically connected to a wiring CM, the wiring S[+], and the wiring S[−].

The writing circuit 300 includes current supply circuits 301[1] to 301[n]. The current supply circuit 301[j] is electrically connected to the wiring BL[j] and wirings D[j, 1] to D[j, s] (s is an integer number of 1 or greater).

The row driver 400 is electrically connected to a wiring WA, a wiring RA, a wiring WE, and a wiring RE.

In FIG. 1, only the memory cells 101[1, 1], 101[m, 1], 101[1, n], 101[m, n], and 101[i, j], the rectifier circuits 201[1], 201[n], and 201[j], the current supply circuits 301 [1], 301[n], and 301[j], and the wirings WR[1], WR[m], WR[i], WW[1], WW[m], WW[i], BL[1], BL[n], BL[j], D[1, 1], D[1, s], D[n, 1], D[n, s], D[j, 1], D[j, s], WA, RA, WE, RE, CA, CM, S[+], and S[−] are described, and description of the other circuits, wirings, and numerals are omitted.
<<Memory Cell 101>>

Next, a circuit configuration of the memory cells 101[1, 1] to 101[m, n] is described with reference to FIG. 2A.

Figure 2A:
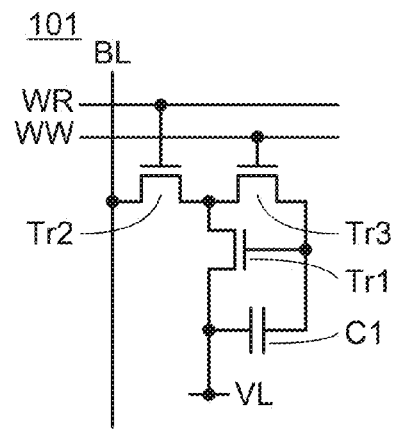
FIGS. 2A to 2D each illustrate an example of a circuit in a semiconductor device.

A memory cell 101 in FIG. 2A shows a circuit configuration of each of the memory cells 101[1, 1] to 101[m, n], and includes transistors Tr1 to Tr3 and a capacitor C1. Note that the transistors Tr1 to Tr3 are n-channel transistors.

A wiring BL corresponds to any one of the wirings BL[1] to BL[n] in FIG. 1, a wiring WW corresponds to any one of the wirings WW[1] to WW[m] in FIG. 1, and a wiring WR corresponds to any one of the wirings WR[1] to WR[m] in FIG. 1.

One of a source and a drain of the transistor Tr1 is electrically connected to one of a source and a drain of the transistor Tr2 and one of a source and a drain of the transistor Tr3. The other of the source and the drain of the transistor Tr1 is electrically connected to a first terminal of the capacitor C1 and a wiring VL. A gate of the transistor Tr1 is electrically connected to a second terminal of the capacitor C1 and the other of the source and the drain of the transistor Tr3. The other of the source and the drain of the transistor Tr2 is electrically connected to the wiring BL, and a gate of the transistor Tr2 is electrically connected to the wiring WR. A gate of the transistor Tr3 is electrically connected to the wiring WW. The wiring VL supplies a lower potential than a potential of a wiring VH that is described later.

The transistors Tr1 to Tr3 are preferably OS transistors described in Embodiment 4. OS transistors have an extremely low off-state current, and thus deterioration of data stored in the second terminal side of the capacitor C1 because of a leakage current can be suppressed.
<<Rectifier Circuit 201>>

A circuit configuration of the rectifier circuits 201[1] to 201[n] is described with reference to FIG. 2B.

Figure 2B:
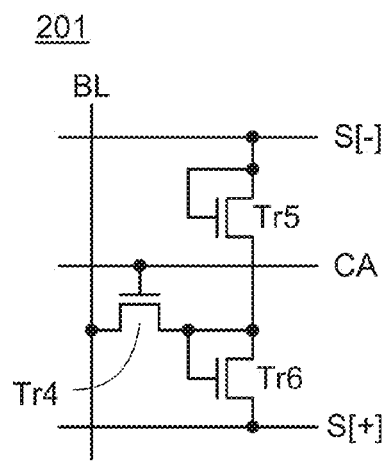

A rectifier circuit 201 in FIG. 2B shows a circuit configuration of each of the rectifier circuits 201[1] to 201[n], and includes transistors Tr4 to Tr6. Note that the transistors Tr4 to Tr6 are n-channel transistors.

A wiring BL corresponds to any one of the wirings BL[1] to BL[n] in FIG. 1. The wiring S[+] and the wiring S[−] are electrically connected to the comparison circuit 202 described later.

One of a source and a drain of the transistor Tr4 is electrically connected to one of a source and a drain of the transistor Tr5, one of a source and a drain of the transistor Tr6, and a gate of the transistor Tr6. The other of the source and the drain of the transistor Tr4 is electrically connected to the wiring BL. A gate of the transistor Tr4 is electrically connected to the wiring CA. The other of the source and the drain of the transistor Tr5 is electrically connected to a gate of the transistor Tr5 and the wiring S[−]. The other of the source and the drain of the transistor Tr6 is electrically connected to the wiring S[+].
<<Comparison Circuit 202>>

A circuit configuration of the comparison circuit 202 is described with reference to FIG. 2C.

Figure 2C:
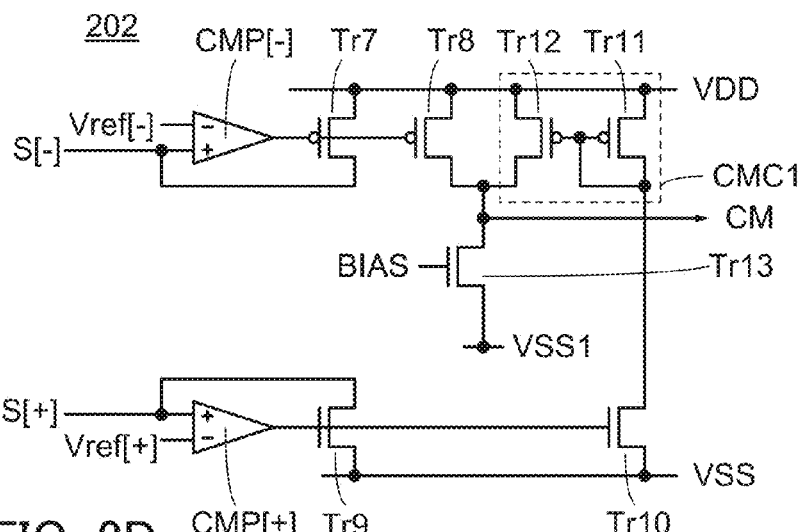

The comparison circuit 202 in FIG. 2C includes transistors Tr7 to Tr13, a comparator CMP[−], and a comparator CMP[+]. The transistors Tr7, Tr8, Tr11, and Tr12 are p-channel transistors while the transistors Tr9, Tr10, and Tr13 are n-channel transistors.

An inverting input terminal of the comparator CMP[−] is electrically connected to a wiring Vref[−]. A non-inverting input terminal of the comparator CMP[−] is electrically connected to one of a source and a drain of the transistor Tr7 and the wiring S[−]. An output terminal of the comparator CMP[−] is electrically connected to a gate of the transistor Tr7 and a gate of the transistor Tr8.

An inverting input terminal of the comparator CMP[+] is electrically connected to a wiring Vref[+]. A non-inverting input terminal of the comparator CMP[+] is electrically connected to one of a source and a drain of the transistor Tr9 and the wiring S[+]. An output terminal of the comparator CMP[+] is electrically connected to a gate of the transistor Tr9 and a gate of the transistor Tr10.

The other of the source and the drain of the transistor Tr7 is electrically connected to a wiring VDD. One of a source and a drain of the transistor Tr8 is electrically connected to one of a source and a drain of the transistor Tr12, one of a source and a drain of the transistor Tr13, and the wiring CM. The other of the source and the drain of the transistor Tr8 is electrically connected to the wiring VDD. The other of the source and the drain of the transistor Tr12 is electrically connected to the wiring VDD. A gate of the transistor Tr12 is electrically connected to a gate of the transistor Tr11, one of a source and a drain of the transistor Tr11, and one of a source and a drain of the transistor Tr10. The other of the source and the drain of the transistor Tr11 is electrically connected to the wiring VDD. The other of the source and the drain of the transistor Tr9 and the other of the source and the drain of the transistor Tr10 are electrically connected to a wiring VSS. The other of the source and the drain of the transistor Tr13 is electrically connected to a wiring VSS1, and a gate of the transistor Tr13 is electrically connected to a wiring BIAS.

The wiring VDD supplies a high level potential, the wiring VSS supplies a lower potential than the potential of the wiring VDD (hereinafter such a low potential is referred to as a low level potential), and the wiring VSS1 supplies a lower potential than the potential of the wiring VDD. Note that the potential of the wiring VSS may be lower or higher than the potential of the wiring VSS1. Alternatively, the potential of the wiring VSS may be the same as the potential of the wiring VSS1.

The comparison circuit 202 supplies the wiring CM with a higher potential than a low level potential when a current flows in at least one of the wirings S[−] and S[+] (the operation of the comparison circuit 202 is detailed later). The potential output to the wiring CM is heightened with an increase in the amount of a current flowing in the wiring S[−] or S[+].

The circuit configuration of the comparison circuit 202 is not limited to one in FIG. 2C. For example, it may have a circuit configuration of a comparison circuit 203 in FIG. 3.

The comparison circuit 203 includes the transistors Tr7 to Tr13, the comparator CMP[−], and the comparator CMP[+]. The transistors Tr7, Tr8, and Tr13 are p-channel transistors while the transistors Tr9 to Tr12 are n-channel transistors.

The inverting input terminal of the comparator CMP[−] is electrically connected to the wiring Vref[−]. The non-inverting input terminal of the comparator CMP[−] is electrically connected to one of the source and the drain of the transistor Tr7 and the wiring S[−]. The output terminal of the comparator CMP[−] is electrically connected to the gate of the transistor Tr7 and the gate of the transistor Tr8.

The inverting input terminal of the comparator CMP[+] is electrically connected to the wiring Vref[+]. The non-inverting input terminal of the comparator CMP[+] is electrically connected to one of the source and the drain of the transistor Tr9 and the wiring S[+]. The output terminal of the comparator CMP[+] is electrically connected to the gate of the transistor Tr9 and the gate of the transistor Tr10.

The wiring Vref[−] supplies a reference potential to the inverting input terminal of the comparator CMP[−], and the wiring Vref[+] supplies a reference potential to the inverting input terminal of the comparator CMP[+].

The other of the source and the drain of the transistor Tr9 is electrically connected to the wiring VSS. One of the source and the drain of the transistor Tr10 is electrically connected to one of the source and the drain of the transistor Tr12, one of the source and the drain of the transistor Tr13, and the wiring CM. The other of the source and the drain of the transistor Tr10 is electrically connected to the wiring VSS. The other of the source and the drain of the transistor Tr12 is electrically connected to the wiring VSS. The gate of the transistor Tr12 is electrically connected to the gate of the transistor Tr11, one of the source and the drain of the transistor Tr11, and one of the source and the drain of the transistor Tr8. The other of the source and the drain of the transistor Tr11 is electrically connected to the wiring VSS. The other of the source and the drain of the transistor Tr7 and the other of the source and the drain of the transistor Tr8 are electrically connected to the wiring VDD. The other of the source and the drain of the transistor Tr13 is electrically connected to a wiring VDD1, and the gate of the transistor Tr13 is electrically connected to the wiring BIAS.

The wiring VDD supplies a high level potential, the wiring VSS supplies a low level potential, and the wiring VDD1 supplies a higher potential than the potential of the wiring VSS. Note that the potential of the wiring VDD may be lower or higher than the potential of the wiring VDD1. Alternatively, the potential of the wiring VDD may be the same as the potential of the wiring VDD1.

The comparison circuit 203 supplies the wiring CM with a lower potential than a high level potential when a current flows in at least one of the wirings S[−] and S[+]. The potential output to the wiring CM is lowered with an increase in the amount of a current flowing in the wiring S[−] or S[+]. Although the output from the comparison circuit 203 is different from that from the comparison circuit 202, the comparison circuit 203 can determine whether or not a current flows in the wiring S[−] or S[+].

In the comparison circuit 202, the transistors Tr11 and Tr12 and the wiring VDD form a current mirror circuit CMC1. That is, when the transistor Tr10 is on, a current equivalent to that flowing between the source and the drain of the transistor Tr11 flows between the source and the drain of the transistor Tr12. The current mirror circuit CMC1 is not limited to the circuit formed with the transistors Tr11 and Tr12 and the wiring VDD, and any circuit where a current value on the input side is equivalent to that on the output side may be used instead.

<<Current Supply Circuit 301>>

A circuit configuration of the current supply circuits 301[1] to 301[n] is described with reference to FIG. 2D.

Figure 2D:
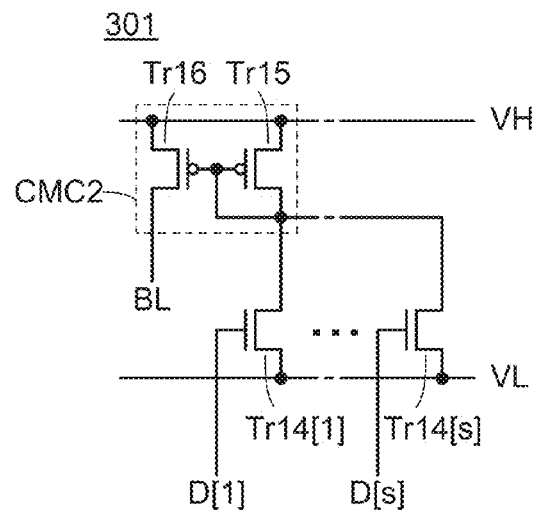

A current supply circuit 301 in FIG. 2D shows a configuration of any one of the current supply circuits 301[1] to 301[n], and includes transistors Tr14[1] to Tr14[s], a transistor Tr15, and a transistor Tr16. The transistors Tr15 and Tr16 are p-channel transistors, and the transistors Tr14[1] to Tr14[s] are n-channel transistors. The channel width ratio of the transistor Tr14[1] to the transistor Tr14[k] is $1:2^{k-1}$ (k is an integer number greater than or equal to 1 and less than or equal to s).

A gate of the transistor Tr14 [k] is electrically connected to a wiring D [k]. One of a source and a drain of the transistor Tr14[k] is electrically connected to one of a source and a drain of the transistor Tr15, a gate of the transistor Tr15, and a gate of the transistor Tr16. The other of the source and the drain of the transistor Tr14[k] is electrically connected to the wiring VL. The other of the source and the drain of the transistor Tr15 is electrically connected to the wiring VH. One of a source and a drain of the transistor Tr16 is electrically connected to the wiring BL. The other of the source and the drain of the transistor Tr16 is electrically connected to the wiring VH.

The wiring VH has a higher potential than those of the wirings VL and VSS. The wiring VL supplies the same potential as that of the wiring VL connected to the memory cell 101. The wirings VH and VL are supplied with desired potentials to operate the semiconductor device 1000.

Figure 4:
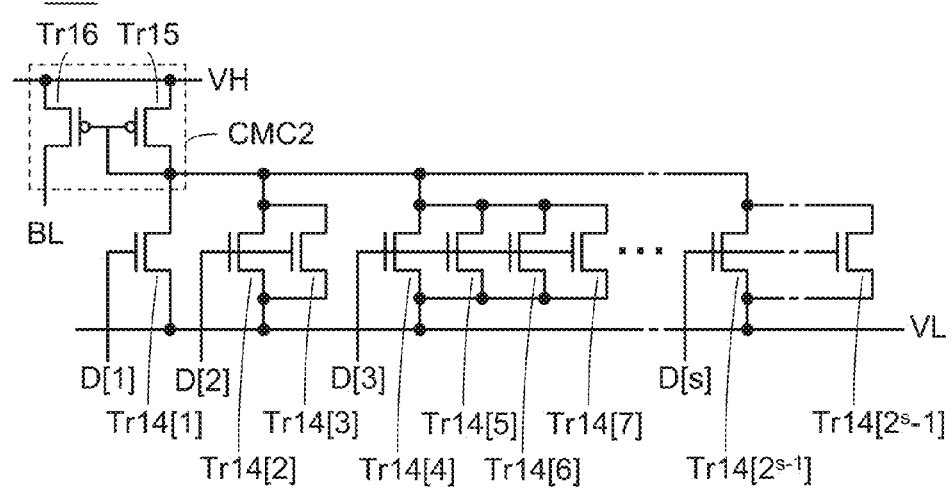
FIG. 4 illustrates an example of a circuit in a semiconductor device.

Instead of setting the channel width ratio of the transistor Tr14[1] to the transistor Tr14[k] to $1:2^{k-1}$, $2^s-1$ transistors with the same channel length and the same channel width may be used. In that case, there is a circuit where the $2^{k-1}$ transistors are connected in parallel on the k-th column, and the circuits are arranged on s columns in total. The current supply circuit in that case is shown in FIG. 4. A current supply circuit 302 includes transistors Tr14[1] to Tr14[$2^s$−1], the transistor Tr15, and the transistor Tr16. The transistors Tr15 and Tr16 are p-channel transistors, and the transistors r14[1] to Tr14[$2^s$−1] are n-channel transistors. FIG. 4 only shows the transistors Tr14[1], Tr14[2], Tr14[3], Tr14[4], Tr14[5], Tr14[6], Tr14[7], Tr14[$2^s$−1], Tr14[$2^s$−1], Tr15, and Tr16, the wirings D[1], D[2], D[3], D[s], VL, VH, and BL, and a current mirror circuit CMC2 that is described later; the other numerals are omitted.

One of a source and a drain of each of the transistors Tr14[1] to Tr14[$2^s$−1] is electrically connected to one of the source and the drain of the transistor Tr15, the gate of the transistor Tr15, and the gate of the transistor Tr16. A gate of each of the transistors Tr14[$2^{k-1}$] to Tr14[$2^k$−1] is electrically connected to the wiring D[k], the other of the source and the drain of each of the transistors Tr14[1] to Tr14[$2^s$−1] is electrically connected to the wiring VL. The other of the source and the drain of the transistor Tr15 is electrically connected to the wiring VH. One of the source and the drain of the transistor Tr16 is electrically connected to the wiring BL. The other of the source and the drain of the transistor Tr16 is electrically connected to the wiring VH.

Note that in this specification, the wirings D[1] to D[s] in the current supply circuit 301[j] on the j-th column are described as wirings D[j, 1] to D[j, s].

In the current supply circuits 301 and 302, the transistors Tr15 and Tr16 and the wiring VH form the current mirror circuit CMC2. That is, a current equivalent to that input to one of the source and the drain of the transistor Tr15 is output to one of the source and the drain of the transistor Tr16. The current mirror circuit CMC2 is not limited to the circuit formed with the transistors Tr15 and Tr16 and the wiring VH, and any circuit where a current value on the input side is equivalent to that on the output side may be used instead.

<<Row Driver 400>>

The row driver 400 is described below.

The row driver 400 in FIG. 1 has a function of selecting any oneof the rows in the memory cell array 100. When the row driver 400 selects one row in the memory cell array 100, data writing and readout can be performed in the n memory cells 101 on that row. In the memory cell 101 in FIG. 2A, high level potentials should be applied to the corresponding wirings WR and WW to write data to the memory cell 101. To read data from the memory cell 101, a high level potential is applied to the corresponding wiring WR.

The row driver 400 is electrically connected to the memory cells 101[i, 1] to 101[i, n] by the wirings WR[i] and WW[i]. In addition, the outside wirings WA, RA, WE, and RE are connected to the row driver 400. The wirings WA, RA, WE, and RE are wirings for sending control signals from the outside to the row driver 400. Specifically, the wirings WA, RA, WE, and RE send a writing address signal, a reading address signal, a write enable signal, and a read enable signal, respectively. The row driver 400 can select any one of the rows in the memory cell array 100 in accordance with signals from the wirings WA, RA, WE, and RE.

The connection structure of the row driver 400 is not limited to that in FIG. 1. In the semiconductor device 1000, any circuit that can select any one of the rows in the memory cell array 100 can be used instead of the row driver 400.

<Operation Example>

Next, an operation example of the semiconductor device 1000 are described with reference to FIGS. 5A to 5F, FIGS. 6A to 6C, and FIG. 7.

<<Example of Object Motion Detection>>

FIGS. 5A to 5F illustrate an algorithm that the semiconductor device 1000 performs for detection of an object motion in image data.

Figure 5A:
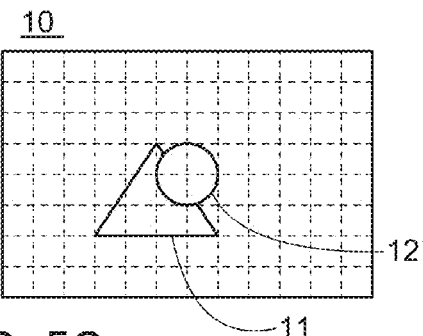
FIGS. 5A to 5F are diagrams illustrating operation of a semiconductor device.
Figure 5B:
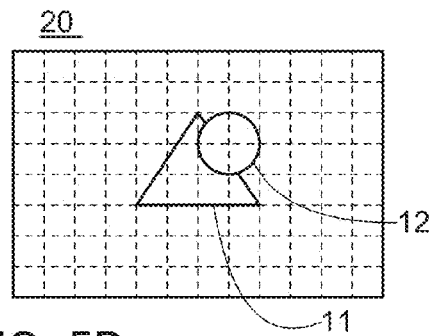

FIG. 5A shows image data 10 that has a triangle 11 and a circle 12. FIG. 5B shows image data 20 where the triangle 11 and the circle 12 of the image data 10 are moved to the upper right.

Figure 5C:
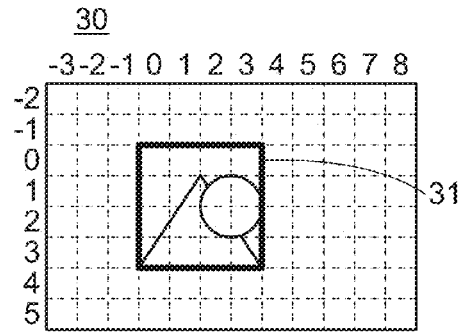

Image data 30 in FIG. 5C shows operation by which a region 31 including the triangle 11 and the circle 12 is extracted from the image data 10. In the image data 30, a cell at the upper left corner of the extracted region 31 is regarded as a reference point (0, 0), and numbers indicating positions in the right/left direction and the upper/lower direction are added to the image data 10. The extracted region 31 of FIG. 5C is shown in FIG. 5E.

Figure 5D:
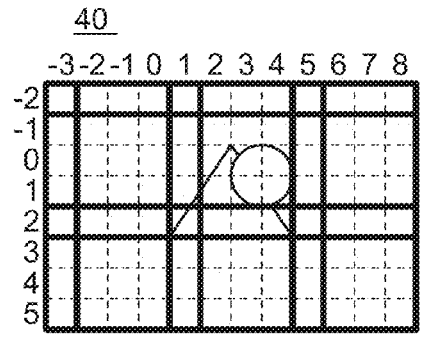
Figure 5E:
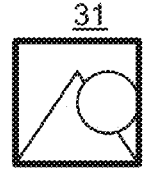
Figure 5F:
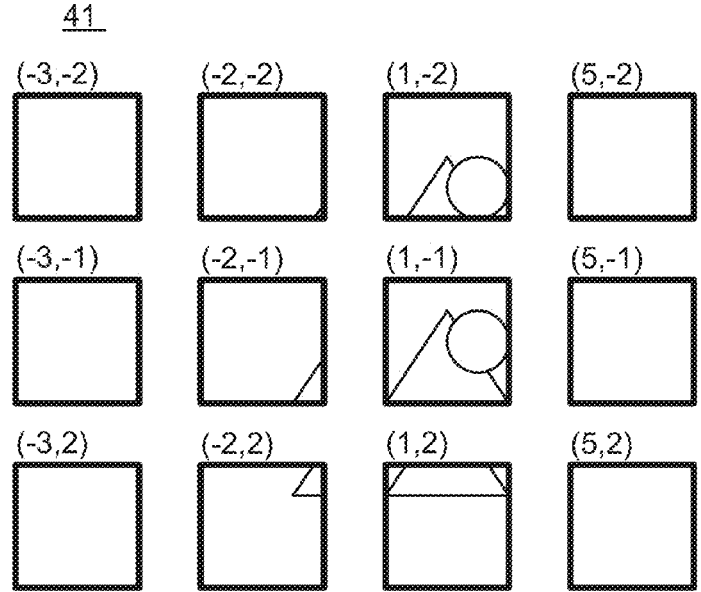

Image data 40 in FIG. 5D shows operation by which a plurality of regions 41 are extracted from the image data 20. The numbers indicating positions in the right/left direction and the upper/lower direction given to the image data 30 are added to the image data 20, which is the image data 40. On the basis of the image data 30 and 40, which position the region 31 moves to can be expressed by a displacement (a motion vector). FIG. 5F shows some of the extracted regions 41.

After the operation of extracting the plurality of regions 41, the regions 41 are sequentially compared with the region 31 to detect a motion of the objects. This comparing operation determines that the region 41 with a motion vector (1, −1) corresponds to the region 31, and that the regions 41 except the one with the motion vector (1, −1) do not correspond to the region 31. Accordingly, the motion vector (1, −1) from the region 31 to the region 41 can be obtained.

In this specification, the data of the region 31 is described as first data in some cases, and the data of one of the plurality of regions 41 is described as second data in some cases.

Although the extraction, comparison, and detection are performed based on the regions each formed of 4×4 cells in FIGS. 5A to 5F, the size of the regions in the present operation example is not limited thereto. The size of the regions may be changed as appropriate in accordance with the size of image data to be extracted. For example, extraction, comparison, and detection may be performed based on the regions each formed of 3×5 cells. There is no limitation on the number of pixels forming a cell; for example, one cell used for forming a region may be formed of 10×10 pixels, or be one pixel. Alternatively, one cell used for forming a region may be formed of 5×10 pixels.

Depending on the video content, image data contained in the region 31 may be changed. For example, the triangle 11 or the circle 12 in the region 31 may be scaled in the image data 40. Alternatively, the triangle 11 or the circle 12 in the region 31 may be rotated in the image data 40. In that case, an effective detection way is as follows: how much degree each of the plurality of regions 41 corresponds to the region 31 is calculated in an analog value (hereinafter referred to as the correspondence degree in some cases) and a displacement (motion vector) of the region 41 with the maximum correspondence degree is obtained. To achieve this, it is preferable that whether or not the region 31 and any of the plurality of regions 41 are identical be determined by characteristics extraction or the like. Motion-compensated prediction becomes possible when image data where the region 31 moves in the motion vector direction is generated from the image data of the region 31 and a difference between the generated data and the plurality of regions 41 is obtained. When the moving amount of the image data of the region 31 is not coincident with an integral multiple of the pixel pitch, the correspondence degree may be detected in an analog value on the basis of comparison between the region 31 and the plurality of regions 41 so that a displacement with the maximum correspondence degree is predicted and detected as a displacement (motion vector) of the objects.

Flow Chart

FIG. 6A is a flow chart showing an operation example of the semiconductor device 1000, and FIGS. 6B and 6C are drawings for supplemental explanation on the flow chart. How the semiconductor device 1000 described as a structure example operates in accordance with the method for object motion detection described as an operation example will be described with reference to the flow chart in FIG. 6A. The flow chart in FIG. 6A focuses on the current supply circuit 301[j], the rectifier circuit 201[j], and the memory cell 101[i, j] on the j-th column of the semiconductor device 1000, and uses the region 31 and the region 41 with (−2, −1) as image data for comparison. The pixel number of each of the region 31 and the region 41 is s×n (s pixels in one column and n pixels in one row).

In a step 1S, data of the region 31 is input to the semiconductor device 1000. Specifically, data corresponding to pixel values on the j-th pixel column of the region 31 (a pixel column 31[j] in FIG. 6B) are respectively input to the wirings D[j, 1] to D[j, s] of the current supply circuit 301[j]. Data corresponding to the pixel column 31[j] is input to the wirings D[j, 1] to D[j, s], whereby a current $i_b[j]$ uniquely corresponding to the pixel column 31[j] is generated and flows from the current supply circuit 301[j] to the wiring BL[j]. The current $i_b[j]$ is supplied to the memory cell 101[i, j].

In a step 2S, a charge is stored in the second terminal of the capacitor C1 of the memory cell 101[i, j] owing to the current $i_b[j]$ generated in the step 1S. When the amount of a current that can be flown in the transistor Tr1 of the memory cell 101[i, j] is larger than the current $i_b[j]$, the potential of the second terminal of the capacitor C1 decreases. When the amount of the current $i_b[j]$ becomes equal to the amount of a current that can be flown in the transistor Tr1 of the memory cell 101[i, j], the potential of the second terminal of the capacitor C1 becomes constant. When the amount of a current that can be flown in the transistor Tr1 of the memory cell 101[i, j] is less than the current $i_b[j]$, the potential of the second terminal of the capacitor C1 increases; when the amount of the current $i_b[j]$ becomes equal to the amount of a current that can be flown in the transistor Tr1 of the memory cell 101[i, j], the potential of the second terminal of the capacitor C1 becomes constant.

The memory cell 101[i, j] stores a charge of when the potential of the second terminal of the capacitor C1 becomes constant. The amount of the stored charge determines the amount of a current that can be flown in the transistor Tr1 of the memory cell 101[i, j]. When a charge is stored in the memory cell 101 [i, j] owing to the current $i_b[j]$, the amount of a current that can be flown in the transistor Tr1 becomes the amount of the current $i_b[j]$.

In a step 3S, data of one of the plurality of regions 41 is input to the semiconductor device 1000. In this example, the data of the region 41(-2, -1) is input. In the step 3S, data corresponding to pixel values on the j-th pixel column of the region 41(-2, -1) (a pixel column 41[j] in FIG. 6C) are respectively input to the wirings D[j, 1] to D[j, s] of the current supply circuit 301[j]. Data corresponding to the pixel column 41[j] is input to the wirings D[j, 1] to D[j, s], whereby a current $i_c[j]$ uniquely corresponding to the pixel column 41[j] is generated and flows from the current supply circuit 301[j] to the wiring BL[j].

In a step 4S, the current $i_c[j]$ generated in the step 3S is to be flown between the source and the drain of the transistor Tr1 of the memory cell 101[i, j]. Here, the amount of a current flown between the source and the drain of the transistor Tr1 is determined by the amount of the charge stored in the step 2S. That is, the amount of a current flown between the source and the drain of the transistor Tr1 corresponds to that of the current $i_b[j]$. When the current $i_c[j]$ is larger than the current $i_b[j]$, the surplus current that does not flow between the source and the drain of the transistor Tr1 flows into the rectifier circuit 201[j] as a discharge current. When the current $i_c[j]$ is smaller than the current $i_b[j]$, a sink current from the rectifier circuit 201[j] to the wiring BL[j] is generated and flows between the source and the drain of the transistor Tr1 to compensate the current $i_c[j]$. That is, when there is a difference between the current $i_b[j]$ and the current $i_c[j]$, a current discharged from the wiring BL[j] to the rectifier circuit 201[j] or a current sunk from the rectifier circuit 201[j] to the wiring BL[j] is generated (hereinafter these currents are collectively referred to as a differential current). The differential current is input to/output from the comparison circuit 202, whereby the comparison circuit 202 outputs an analog value as the correspondence degree.

The steps 1S to 4S are performed with respect to all the cases of integer numbers that j can take (i.e., the integer numbers greater than or equal to 1 and less than or equal to n), all the differential currents generated by data of all the pixel columns of the region 31 and that of the region 41(-2, -1) are supplied to the comparison circuit 202. As a result, the correspondence degree of the region 31 and the region 41(-2, -1) can be obtained, and thus the result of comparison between the region 31 and the region 41(-2, -1) can be obtained from the correspondence degree.

In the above explanation, the region 41(-2, -1) is used as data for comparison; in an operation example of the semiconductor device of one embodiment of the present invention, the plurality of regions 41 are sequentially compared with the region 31. That is, the steps 3S and 4S are repeated to the number of the plurality of regions 41 to obtain the correspondence degrees of image data of the regions 41 and acquire motion vectors. Every time the correspondence degree of one of the regions 41 and the region 31 is obtained, the analog value output from the wiring CM should be reset. In that case, a high level potential is applied to the wiring BIAS to turn on the transistor Tr13 so that the wiring CM outputs the potential of the wiring VSS1 for initialization.

Although the number of pixels of each of the regions 31 and 41 are s×n in total (s pixels on one column and n pixels on one row) in the operation of the semiconductor device described in FIGS. 6A to 6C, an operation example of the semiconductor device of one embodiment of the present invention is not limited thereto. For example, each of the regions 31 and 41 may have less than s pixels on one column and less than n pixels on one row. In that case, a configuration where unused wirings among the wirings D[1] to D[s] are not supplied with image data and unused circuits among the current supply circuits 301[1] to 301[n] do not operate is acceptable. Alternatively, for example, each of the regions 31 and 41 may have more than s pixels on one column and more than n pixels on one row. In that case, the number of wirings D of the current supply circuit 301 and the number of the current supply circuits 301 are increased as needed.

<<Timing Chart>>

Figure 7:
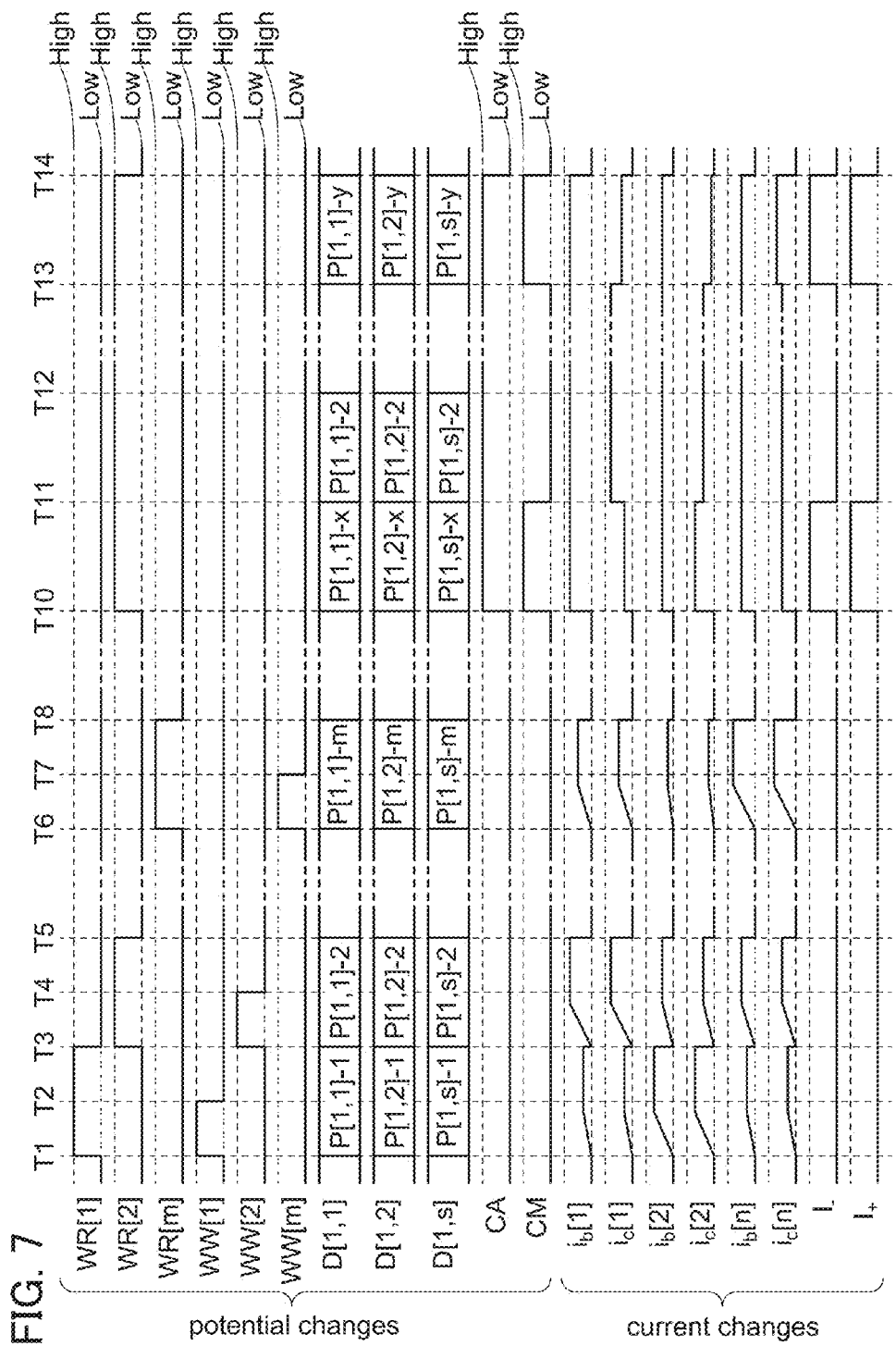
FIG. 7 is a timing chart illustrating operation of a semiconductor device.

FIG. 7 is a timing chart illustrating an operation example of the semiconductor device 1000. In this embodiment, the wiring VH and the wiring VL are set to high (H) and low (L) level potentials, respectively.

A high level potential or a low level potential is applied to the wirings WR[1] to WR[m], and WW[1] to WW[m]. In FIG. 7, high and low level potentials are expressed as High and Low, respectively.

The timing chart in FIG. 7 shows potential changes of the wirings WR[1], WR[2], WR[m], WW[1], WW[2], WW[m], D[1, 1], D[1, 2], D[1, s], CA and CM from time T1 to time T14. In FIG. 7, high and low level potentials applied to the wirings CA and CM are expressed as High and Low, respectively. The timing chart in FIG. 7 also shows current changes of $i_b[1]$, $i_c[1]$, $i_b[2]$, $i_c[2]$, $i_b[n]$, $i_c[n]$, $I_-$, and $I_+$.

The current $i_b[j]$ indicates a current that flows from the wiring BL[j] to any one of the memory cells 101[1, j] to 101[m, j]. The current $i_c[n]$ indicates a current that flows from the current supply circuit 301[j] to the wiring BL[j].

The current $I_-$ indicates a current that flows in the wiring S[−], and the current $I_+$ indicates a current that flows in the wiring S[+].

[Time T1 to T3]

From time T1 to T2, a H level potential from the wiring WR[1], L level potentials from the wirings WR[2] to WR[m], a H level potential from the wiring WW[1], and L level potentials from the wirings WW[2] to WW[m] are input to the memory cell array 100. Accordingly, the transistors Tr2 and Tr3 included in the memory cells 101[1, 1] to 101[1, n] of the memory cell array 100 are turned on.

In addition, a potential (signal) of data P[1, 1]−1 from the wiring D[1, 1], a potential (signal) of data P[1, 2]−1 from the wiring D[1, 2], a potential (signal) of data P[1, h]−1 from the wiring D[1, h], and a potential (signal) of data P[1, s]−1 from the wiring D[1, s] are input to the current supply circuit 301[1] (h is an integer number greater than or equal to 3 and less than s; the wiring D[1, h] is not illustrated in FIG. 7).

Similarly, potentials (signals) are input also to the current supply circuits 301[2] to 301[n]. That is, potentials (signals) of data P[j, 1]−1 to P[j, s]−1 of the wirings D[j, 1] to D[j, s] are input to the current supply circuit 301[j]. At the same time, a L level potential is input from the wiring CA to the analog processing circuit 200. Thus, the transistor Tr4 is off and currents do not flow in the wirings S[−] and S[+].

At this time, the current supply circuit 301[1] supplies the wiring BL[1] with a current that uniquely corresponds to data P[1, 1]−1 to P[1, s]−1 supplied from the wirings D[1, 1] to D[1, s]. Similarly, the current supply circuit 301[j] supplies the wiring BL[j] with a current that uniquely corresponds to data P[j, 1]−1 to P[j, s]−1. To the transistors Tr14[1] to Tr14[s], Tr15, and Tr16 of the current supply circuit 301, gate voltages are applied in such a range that the transistors operate in a saturation region.

Since the transistors Tr2 and Tr3 in the memory cells 101[1, 1] to 101[1, n] are on, currents flow from the current supply circuits 301[1] to 301 [n] to the memory cells 101[1, 1] to 101[1, n], respectively, through the wirings BL[1] to BL[n]. As a result, one of the source and the drain of the transistor Tr1 in each of the memory cells 101[1, 1] to 101[1, n] has the same potential as the second terminal of the capacitor C1.

From time T2 to T3, the wiring WW[1] is set to a L level potential while the potential of the wiring WR[1] is kept a H level. Accordingly, the transistors Tr2 of the memory cells 101[1, 1] to 101[1, n] of the memory cell array 100 are on while the transistors Tr3 of them are turned off. Here, the potentials are stored by the capacitors C1 included in the memory cells 101[1, 1] to 101[1, n]. That is, from time T1 to T3, the potential uniquely corresponding to the data P[1, 1]−1 to P[1, s]−1 is stored in the memory cell 101[1, 1]. Similarly, the potential uniquely corresponding to the data P[j, 1]−1 to P[j, s]−1 is stored in the memory cell 101[1, j].

From time T1 to T3, since all the current from the current supply circuit 301[j] flows into the memory cell 101[1, j], $i_b[j]$ and $i_c[j]$ are equivalent to each other. As shown in the timing chart of FIG. 7, the current values of $i_b[1]$ and $i_c[1]$ are equivalent to each other, the current values of $i_b[2]$ and $i_c[2]$ are equivalent to each other, and the current values of $i_b[n]$ and $i_c[n]$ are equivalent to each other.

[Time T3 to T8]

From time T3 to T5, a potential uniquely corresponding to data P[j, 1]−2 to P[j, s]−2 is written to the memory cell 101[2, j], in a way similar to the operation from time T1 to T3.

Operation from time T3 to T5 is specifically described. From time T3 to T4, a L level potential from the wiring WR[1], a H level potential from the wiring WR[2], L level potentials from the wirings WR[3] to WR[m], a L level potential from the wiring WW[1], a H level potential from the wiring WW[2], and L level potentials from the wirings WW[3] to WW[m] are input to the memory cell array 100. Accordingly, the transistors Tr2 and Tr3 included in the memory cells 101[2, 1] to 101[2, n] of the memory cell array 100 are turned on.

In addition, a potential (signal) of data P[1, 1]−2 from the wiring D[1, 1], a potential (signal) of data P[1, 2]−2 from the wiring D[1, 2], a potential (signal) of data P[1, h]−2 from the wiring D[1, h], and a potential (signal) of data P[1, s]−2 from the wiring D[1, s] are input to the current supply circuit 301[1].

Similarly, potentials (signals) are input also to the current supply circuits 301[2] to 301[n]. That is, potentials (signals) of data P[j, 1]−2 to P[j, s]−2 of the wirings D[j, 1] to D[j, s] are input to the current supply circuit 301[j]. Since before time T3, a L level potential has been input from the wiring CA to the analog processing circuit 200 continuously. Thus, the transistor Tr4 is off and currents do not flow in the wirings S[−] and S[+].

At this time, the current supply circuit 301[1] supplies the wiring BL[1] with a current that uniquely corresponds to data P[1, 1]−2 to P[1, s]−2 supplied from the wirings D[1, 1] to D[1, s]. Similarly, the current supply circuit 301[j] supplies the wiring BL[j] with a current that uniquely corresponds to data P[j, 1]−2 to P[j, s]−2.

Since the transistors Tr2 and Tr3 in the memory cells 101[2, 1] to 101[2, n] are on, currents flow from the current supply circuits 301[1] to 301[n] to the memory cells 101[2, 1] to 101[2, n], respectively, through the wirings BL[1] to BL[n]. As a result, one of the source and the drain of the transistor Tr1 in each of the memory cells 101[2, 1] to 101[2, n] has the same potential as the second terminal of the capacitor C1.

From time T4 to T5, the wiring WW[2] is set to a L level potential while the potential of the wiring WR[2] is kept a H level. Accordingly, the transistors Tr2 of the memory cells 101[2, 1] to 101[2, n] of the memory cell array 100 are on and the transistors Tr3 of them are turned off. Here, the potentials are stored by the capacitors C1 included in the memory cells 101[2, 1] to 101[2, n]. That is, from time T3 to T5, the potential uniquely corresponding to the data P[1, 1]−2 to P[1, s]−2 is stored in the memory cell 101[2, 1]. Similarly, the potential uniquely corresponding to the data P[j, 1]−2 to P[j, s]−2 is stored in the memory cell 101[2, j].

From time T3 to T5, since all the current from the current supply circuit 301[j] flows into the memory cell 101[2, j], $i_b[j]$ and $i_c[j]$ are equivalent to each other. As shown in the timing chart of FIG. 7, the current values of $i_b[1]$ and $i_c[1]$ are equivalent to each other, the current values of $i_b[2]$ and $i_c[2]$ are equivalent to each other, and the current values of $i_b[n]$ and $i_c[n]$ are equivalent to each other.

As in the operation from time T1 to T3 and that from time T3 to T5, a potential uniquely corresponding to data P[j, 1]−g to P[j, s]−g is stored in the memory cell 101[g, j] (g is an integer number greater than or equal to 3 and less than or equal to m−1) in operation from time T5 to T6. Through operation from time T6 to T8, a potential uniquely corresponding to data P[j, 1]−m to P[j, s]−m is stored in the memory cell 101[m, j]. Note that at time T6, a high level potential is applied to the wiring WW[m] to select the memory cell 101[m, j].

The currents $i_b[j]$ and $i_c[j]$ from time T5 to T8 are equivalent to each other, as in the operation from time T1 to T3 and that from time T3 to T5. As shown in the timing chart of FIG. 7, the current values of $i_b[1]$ and $i_c[1]$ are equivalent to each other, the current values of $i_b[2]$ and $i_c[2]$ are equivalent to each other, and the current values of $i_b[n]$ and $i_c[n]$ are equivalent to each other.

[Time T10 to T14]

A period from time T10 to T14 corresponds to operation in which a displacement (motion vector) of the triangle 11 and the circle 12 from those in the image data 10 stored in the memory cell array 100 to those in the image data 20 is calculated. Specifically, the plurality of regions 41 are compared with the region 31, and the correspondence degrees of them are output as analog values to calculate a displacement (motion vector) of the region 31. Here, data stored in the memory cells 101[2, 1] to 101[2, n] is treated as the region 31 (the first data).

From time T10 to T11, a L level potential from the wiring WR[1], a H level potential from the wiring WR[2], L level potentials from the wirings WR[3] to WR[m], and L level potentials from the wirings WW[3] to WW[m] are input to the memory cell array 100. Accordingly, the transistors Tr2 of the memory cells 101[2, 1] to 101[2, n] in the memory cell array 100 are turned on while the transistors Tr3 of them are off In addition, a H level potential is input from the wiring CA to the analog processing circuit 200. Thus, the transistors Tr4 in the rectifier circuits 201[1] to 201 [n] are turned on.

In addition, as the second data, a potential (signal) of data P[1, 1]–x from the wiring D[1, 1] (x is an integer number greater than or equal to 1 but not 2), a potential (signal) of data P[1, 2]–x from the wiring D[1, 2], a potential (signal) of data P[1, h]–x from the wiring D[1, h], and a potential (signal) of data P[1, s]–x from the wiring D[1, s] are input to the current supply circuit 301[1].

Similarly, potentials (signals) are input also to the current supply circuits 301[2] to 301[n]. That is, potentials (signals) of data P[j, 1]–x to P[j, s]–x of the wirings D[j, 1] to D[j, s] are input to the current supply circuit 301[j]. Note that these second data correspond to the region 41 with (−2, −1) of the image data 40, for example.

At this time, the current $I_b[1]$ corresponding to the data P[1, 1]–2 to P[1, s]–2 stored in the memory cell 101[2, 1] is supplied from the wiring BL[1] to the memory cell 101[2, 1]. Furthermore, the current $I_c[1]$ corresponding to the data P[1, 1]–x to P[1, s]–x supplied from the wirings D[1, 1] to D[1, s] is supplied from the current supply circuit 301[1] to the wiring BL[1].

Similarly, the current $I_b[j]$ corresponding to the data P[j, 1]–2 to P[j, s]–2 stored in the memory cell 101[2, j] is supplied from the wiring BL[j] to the memory cell 101[2, j]. Furthermore, the current $I_c[j]$ corresponding to the data P[2, 1]–x to P[2, s]–x supplied from the wirings D[j, 1] to D[j, s] is supplied from the current supply circuit 301[j] to the wiring BL[j].

In other words, a flow of the current $I_b[1]$ to the wiring VL and supply of the current $I_c[1]$ occur at a time in the wiring BL[1], and similarly, a flow of the current $I_b[2]$ to the wiring VL and supply of the current $I_c[2]$ occur at a time in the wiring BL[2]. Furthermore, a flow of the current $I_b[n]$ to the wiring VL and supply of the current $I_c[n]$ occur at a time in the wiring BL[n].

Here, the current $I_b[1]$ is larger than the current $I_c[1]$, the current $I_b[2]$ is smaller than the current $I_c[2]$, and the current $I_b[n]$ is equivalent to the current $I_c[n]$. Since the transistors Tr4 in the rectifier circuits 201[1] to 201[n] are on, a current $i_-[1]$ ($=I_b[1]-I_c[1]$) corresponding to a difference between the current $I_b[1]$ and the current $I_c[1]$ flows from the rectifier circuit 201[1] to the wiring BL[1] while a current $i_+[2]$ ($=I_c[2]-I_b[2]$) corresponding to a difference between the current $I_b[2]$ and the current $I_c[2]$ flows from the wiring BL[2] to the rectifier circuit 201[2]. Since the current $I_b[n]$ is equivalent to the current $I_c[n]$, a current does not flow between the wiring BL[n] and the rectifier circuit 201 [n].

Similarly to the above, a current corresponding to a difference between the current $I_b[h]$ and the current $I_c[h]$ flows between the wiring BL[h] and the rectifier circuit 201[h]. When the current $I_b[h]$ is equivalent to the current $I_c[h]$, a current does not flow between the wiring BL[h] and the rectifier circuit 201[h].

In the rectifier circuit 201[1], the transistors Tr5 and Tr6 are turned on and off, respectively, by the current $i_-[1]$; therefore, the current $i_-[1]$ flows from the wiring S[−] to the wiring BL[1]. In the rectifier circuit 201[2], the transistors Tr5 and Tr6 are turned off and on, respectively, by the current $i_+[2]$; therefore, the current $i_+[2]$ flows from the wiring BL[2] to the wiring S[+]. Since the current $I_b[n]$ is equivalent to the current $I_c[n]$, the transistors Tr5 and Tr6 in the rectifier circuit 201[n] are turned off, so that a current does not flow through the wiring S[−] or the wiring S[+].

Similarly to the above, depending on the value of a difference between the current $I_b[h]$ and the current $I_c[h]$, whether or not a current flows through either the wiring S[−] or the wiring S[+] or whether or not a current does not flow through neither the wiring S[−] nor the wiring S[+] is determined in the rectifier circuit 201 [h].

Here, the sum of the current flowing from the wiring S[−] to the rectifier circuits 201[1] to 201[n] is called the current $I_-$, while the sum of the current flowing from the rectifier circuits 201[1] to 201[n] to the wiring S[+] is called the current $I_+$.

Here, operation of the comparison circuit 202 is described. When the current $I_-$ flows from the comparison circuit 202 to the wiring S[−], a low level potential is output to the output terminal of the comparator CMP[−] by the comparator CMP[−]. Accordingly, the transistors Tr7 and Tr8 are turned on. When the transistor Tr7 is turned on, a current flows from the wiring VDD to the wiring S[−]. When the transistor Tr8 is turned on, a current flows from the wiring VDD to the wiring CM and the potential of the wiring CM becomes higher than a L level.

When the current $I_+$ flows from the wiring S[+] to the comparison circuit 202, a high level potential is output to the output terminal of the comparator CMP[+] by the comparator CMP[+]. Accordingly, the transistors Tr9 and Tr10 are turned on. When the transistor Tr9 is turned on, a current flows from the wiring S[+] to the wiring VSS. When the transistor Tr10 is turned on, a current flows from one of the source and the drain of the transistor Tr11 to one of the source and the drain of the transistor Tr10. Thus, the transistors Tr11 and Tr12 are turned on. When the transistor Tr12 is turned on, a current flows from the wiring VDD to the wiring CM and the potential of the wiring CM becomes higher than a L level.

When the current $I_-$ or current $I_+$ is generated between the comparison circuit 202 and the rectifier circuits 201[1] to 201[n] (i.e., when at least one of the data P[1, 1]–x to P[n, s]–x that are the second data is different from the corresponding data of the data P[1, 1]–2 to P[n, s]–2 that are the first data stored in the memory cells 101[2, 1] to 101[2, n]), the potential of the wiring CM becomes higher than a L level.

From time T11 to T12, a L level potential from the wiring WR[1], a H level potential from the wiring WR[2], L level potentials from the wirings WR[3] to WR[m], and L level potentials from the wirings WW[3] to WW[m] are input to the memory cell array 100. Accordingly, the transistors Tr2 of the memory cells 101[2, 1] to 101[2, n] in the memory cell array 100 are on while the transistors Tr3 of them are off In addition, a H level potential is input from the wiring CA to the analog processing circuit 200. Thus, the transistors Tr4 in the rectifier circuits 201[1] to 201[n] are on.

In addition, as the second data, a potential (signal) of data P[1, 1]-2 from the wiring D[1, 1], a potential (signal) of data P[1, 2]-2 from the wiring D[1, 2], a potential (signal) of data P[1, h]-2 from the wiring D[1, h], and a potential (signal) of data P[1, s]-2 from the wiring D[1, s] are input to the current supply circuit 301[1].

Similarly, potentials (signals) are input also to the current supply circuits 301[2] to 301[n]. That is, potentials (signals) of data P[j, 1]-2 to P[j, s]-2 of the wirings D[j, 1] to D[j, s] are input to the current supply circuit 301[j]. Note that these second data correspond to the region 41 with (+1, −1) of the image data 40. That is, the second data are data corresponding to the first data stored in the memory cells 101[2, 1] to 101[2, n].

At this time, the current $I_b[1]$ corresponding to the data P[1, 1]-2 to P[1, s]-2 stored in the memory cell 101[2, 1] is supplied from the wiring BL[1] to the memory cell 101[2, 1]. Furthermore, the current $I_c[1]$ corresponding to the data P[1, 1]-2 to P[1, s]-2 supplied from the wirings D[1, 1] to D[1, s] is supplied from the current supply circuit 301[1] to the wiring BL[1].

Similarly, the current $I_b[j]$ corresponding to the data P[j, 1]-2 to P[j, s]-2 stored in the memory cell 101[2, j] is supplied from the wiring BL[j] to the memory cell 101[2, j]. Furthermore, the current $I_c[j]$ corresponding to the data P[j, 1]-2 to P[j, s]-2 supplied from the wirings D[j, 1] to D[j, s] is supplied from the current supply circuit 301[j] to the wiring BL[j]. In other words, a flow of the current $I_b[2]$ and supply of the current $I_c[2]$ occur at a time in the wiring BL[2], and in addition, a flow of the current $I_b[n]$ and supply of the current $I_c[n]$ occur at a time in the wiring BL[n].

Since the second data correspond to the first data, the current $I_b[1]$ is equivalent to the current $I_c[1]$, the current $I_b[2]$ is equivalent to the current $I_c[2]$, the current $I_b[h]$ is equivalent to the current $I_c[h]$, and the current $I_b[n]$ is equivalent to the current $I_c[n]$. There is no difference between the current $I_b[1]$ and the current $I_c[1]$, between the current $I_b[2]$ and the current $I_c[2]$, between the current $I_b[h]$ and the current $I_c[h]$, or between current $I_b[n]$ and the current $I_c[n]$; therefore, a current flowing in the wirings S[−] and S[+] is not generated in the rectifier circuits 201[1] to 201[n]. Thus, the transistors Tr7 to Tr12 in the comparison circuit 202 are turned off, so that the potential output from the wiring CM becomes at a L level. That is, when the second data correspond to the first data, the potential of the wiring CM becomes at a L level.

From time T13 to T14, a L level potential from the wiring WR[1], a H level potential from the wiring WR[2], L level potentials from the wirings WR[3] to WR[m], and L level potentials from the wirings WW[3] to WW[m] are input to the memory cell array 100. Accordingly, the transistors Tr2 of the memory cells 101[2, 1] to 101[2, n] in the memory cell array 100 are on, while the transistors Tr3 of them are off In addition, a H level potential is input from the wiring CA to the analog processing circuit 200. Thus, the transistors Tr4 in the rectifier circuits 201[1] to 201[n] are on.

In addition, as the second data, a potential (signal) of data P[1, 1]-y from the wiring D[1, 1] (y is an integer number greater than or equal to 1 but not 2 or x), a potential (signal) of data P[1, 2]-y from the wiring D[1, 2], a potential (signal) of data P[1, h]-y from the wiring D[1, h], and a potential (signal) of data P[1, s]-y from the wiring D[1, s] are input to the current supply circuit 301[1]. Note that these second data correspond to the region 41 with (+1, +2) of the image data 40.

At this time, the current $I_b[1]$ corresponding to the data P[1, 1]-2 to P[1, s]-2 stored in the memory cell 101[2, 1] is supplied from the wiring BL[1] to the memory cell 101[2, 1]. Furthermore, the current $I_c[1]$ corresponding to the data P[1, 1]-y to P[1, s]-y supplied from the wirings D[1, 1] to D[1, s] is supplied from the current supply circuit 301[1] to the wiring BL[1].

Similarly, the current $I_b[j]$ corresponding to the data P[j, 1]-2 to P[j, s]-2 stored in the memory cell 101[2, j] is supplied from the wiring BL[j] to the memory cell 101[2, j]. Furthermore, the current $I_c[j]$ corresponding to the data P[j, 1]-y to P[j, s]-y supplied from the wirings D[j, 1] to D[j, s] is supplied from the current supply circuit 301[j] to the wiring BL[j].

In other words, a flow of the current $I_b[1]$ to the wiring VL and supply of the current $I_c[1]$ occur at a time in the wiring BL[1], and similarly, a flow of the current $I_b[2]$ to the wiring VL and supply of the current $I_c[2]$ occur at a time in the wiring BL[2]. Furthermore, a flow of the current $I_b[n]$ to the wiring VL and supply of the current $I_c[n]$ occur at a time in the wiring BL[n].

Here, the current $I_b[1]$ is larger than the current $I_c[1]$, the current $I_b[2]$ is larger than the current $I_c[2]$, and the current $I_b[n]$ is smaller than the current $I_c[n]$. Since the transistors Tr4 in the rectifier circuits 201[1] to 201[n] are on, a current $i_-[1]$ ($=I_b[1]-I_c[1]$) corresponding to a difference between the current $I_b[1]$ and the current $I_c[1]$ flows from the rectifier circuit 201[1] to the wiring BL[1] while a current $i_-[2]$ ($=I_b[2]-I_c[2]$) corresponding to a difference between the current $I_b[2]$ and the current $I_c[2]$ flows from the wiring BL[2] to the rectifier circuit 201[2]. In addition, a current $i_+[n]$ ($=I_c[n]-I_b[n]$) corresponding to a difference between the current $I_b[n]$ and the current $I_c[n]$ flows from the rectifier circuit 201[n] to the wiring BL[n].

In the rectifier circuit 201[1], the transistors Tr5 and Tr6 are turned on and off, respectively, by the current $i_-[1]$; therefore, the current $i_-[1]$ flows from the wiring S[−] to the wiring BL[1]. In the rectifier circuit 201[2], the transistors Tr5 and Tr6 are turned on and off, respectively, by the current $i_-[2]$; therefore, the current $i_-[2]$ flows from the wiring S[−] to the wiring BL[2]. In the rectifier circuit 201[n], the transistors Tr5 and Tr6 are turned off and on, respectively, by the current $i_+[n]$; therefore, the current $i_+[n]$ flows from the wiring BL[n] to the wiring S[+].

The rest operation is the same as that from time T10 to T11; a current is generated in the wiring S[−] and the wiring S[+] connected to the comparison circuit 202, and thus the potential of the wiring CM becomes higher than a L level.

In the semiconductor device 1000 in FIG. 1 with such a configuration, data comparison can be efficiently conducted. The use of this circuit in an encoder enables efficient compression of image data.

Even when the current supply circuit 301 is replaced with the current supply circuit 302 in FIG. 4 as described in the above structure example, the semiconductor device 1000 can conduct the operation similar to the above.

Figure 3:
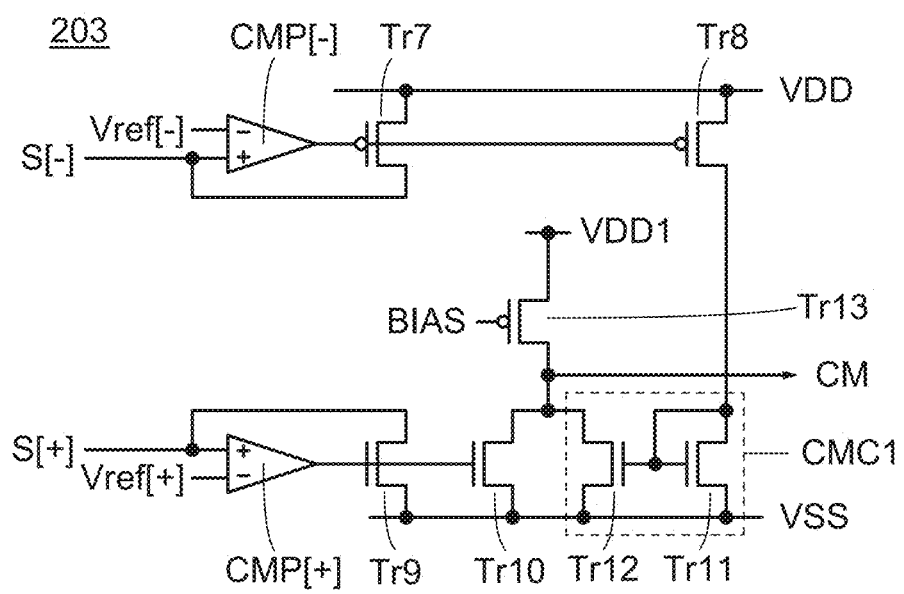
FIG. 3 illustrates an example of a circuit in a semiconductor device.

Even when the comparison circuit 202 is replaced with the comparison circuit 203 in FIG. 3 as described in the above structure example, the semiconductor device 1000 can operate as an encoder of one embodiment of the present invention. However, it should be noted that the output content of the comparison circuit 203 is different from that of the comparison circuit 202.

This embodiment can be combined with any of the other embodiments in this specification as appropriate.

Embodiment 2

In this embodiment, a broadcast system according to the disclosed invention will be described.
<Broadcast System>

Figure 8:
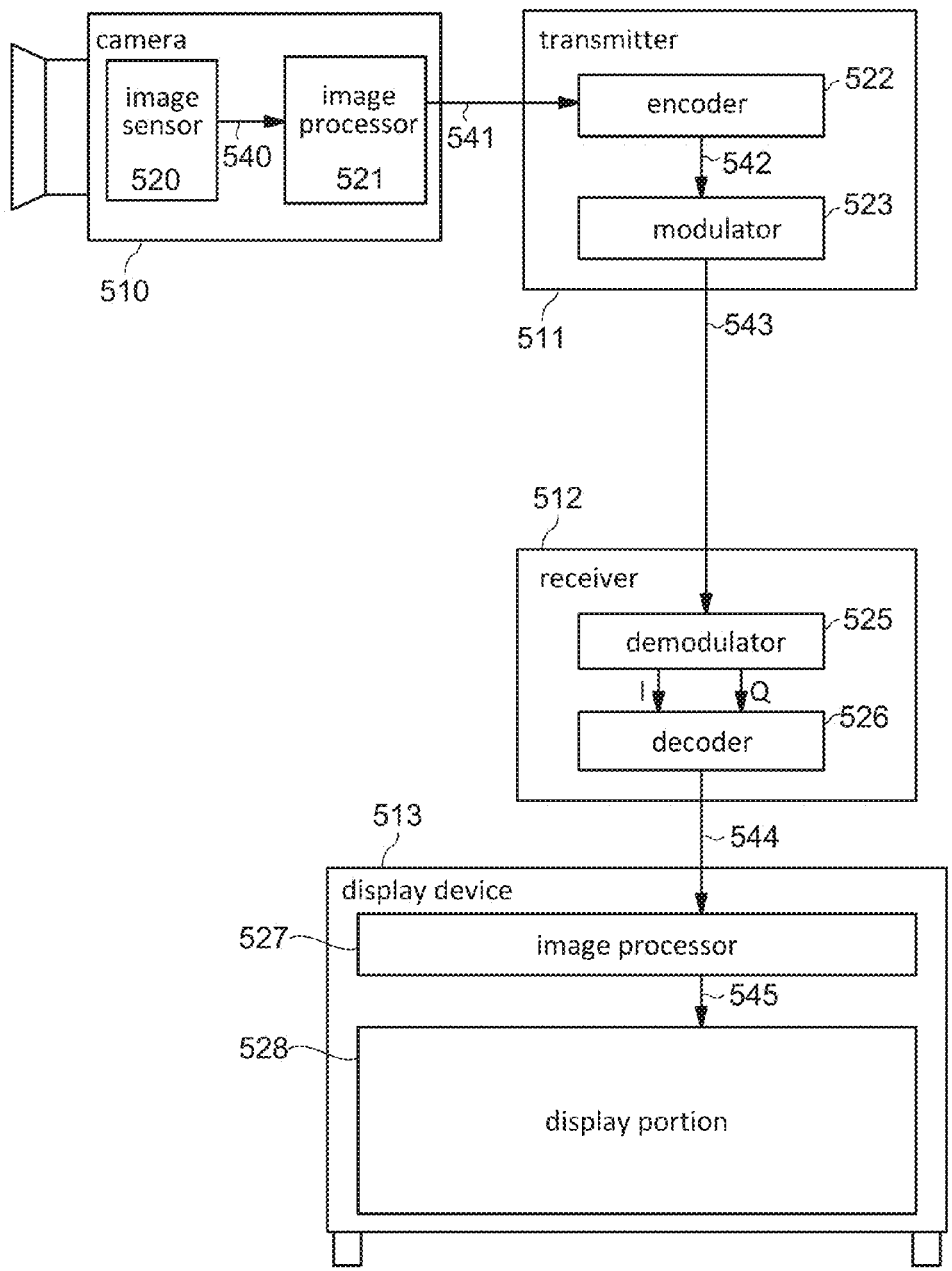
FIG. 8 is a block diagram illustrating a structure example of a broadcast system.

FIG. 8 is a block diagram schematically illustrating a configuration example of a broadcast system. A broadcast system 500 includes a camera 510, a transmitter 511, a receiver 512, and a display device 513. The camera 510 includes an image sensor 520 and an image processor 521. The transmitter 511 includes an encoder 522 and a modulator 523. The receiver 512 includes a demodulator 525 and a decoder 526. The display device 513 includes an image processor 527 and a display portion 528.

When the camera 510 is capable of taking an 8K video, the image sensor 520 includes a sufficient number of pixels to capture an 8K color image. For example, when one red (R) subpixel, two green (G) subpixels, and one blue (B) subpixel are included in one pixel, the image sensor 520 with an 8K camera needs at least 7680×4320×4 [R, G+G, and B] pixels, the image sensor 520 with a 4K camera needs at least 3840×2160×4 pixels, and the image sensor 520 with a 2K camera needs at least 1920×1080×4 pixels.

The image sensor 520 generates Raw data 540 which is not processed. The image processor 521 performs image processing (such as noise removal or interpolation processing) on the Raw data 540 and generates video data 541. The video data 541 is output to the transmitter 511.

The transmitter 511 processes the video data 541 and generates a broadcast signal (carrier wave) 543 that accords with a broadcast band. The encoder 522 processes the video data 541 and generates encoded data 542. The encoder 522 performs processing such as encoding of the video data 541, addition of broadcast control data (e.g., authentication data) to the video data 541, encryption, or scrambling (data rearrangement for spread spectrum).

The modulator 523 performs IQ modulation (orthogonal amplitude modulation) on the encoded data 542 to generate and output the broadcast signal 543. The broadcast signal 543 is a composite signal including data on components of I (identical phase) and Q (quadrature phase). A TV broadcast station takes a role in obtaining the video data 541 and supplying the broadcast signal 543.

The receiver 512 receives the broadcast signal 543. The receiver 512 has a function of converting the broadcast signal 543 into video data 544 that can be displayed on the display device 513. The demodulator 525 demodulates the broadcast signal 543 and decomposes it into two analog signals: an I signal and a Q signal.

The decoder 526 performs processing of converting the I signal and the Q signal into a digital signal. Moreover, the decoder 526 performs various processing on the digital signal and generates a data stream. This processing includes frame separation, decryption of a low density parity check (LDPC) code, separation of broadcast control data, descramble processing, and the like. The decoder 526 decodes the data stream and generates the image data 544. The processing for decoding includes orthogonal transform such as discrete cosine transform (DCT) and discrete sine transform (DST), intra-frame prediction processing, motion-compensated prediction processing, and the like.

The video data 544 is input to the image processor 527 of the display device 513. The image processor 527 processes the video data 544 and generates a data signal 545 that can be input to the display portion 528. Examples of the processing by the image processor 527 include image processing (gamma processing) and digital-analog conversion. When receiving the data signal 545, the display portion 528 displays an image.

Figure 9:
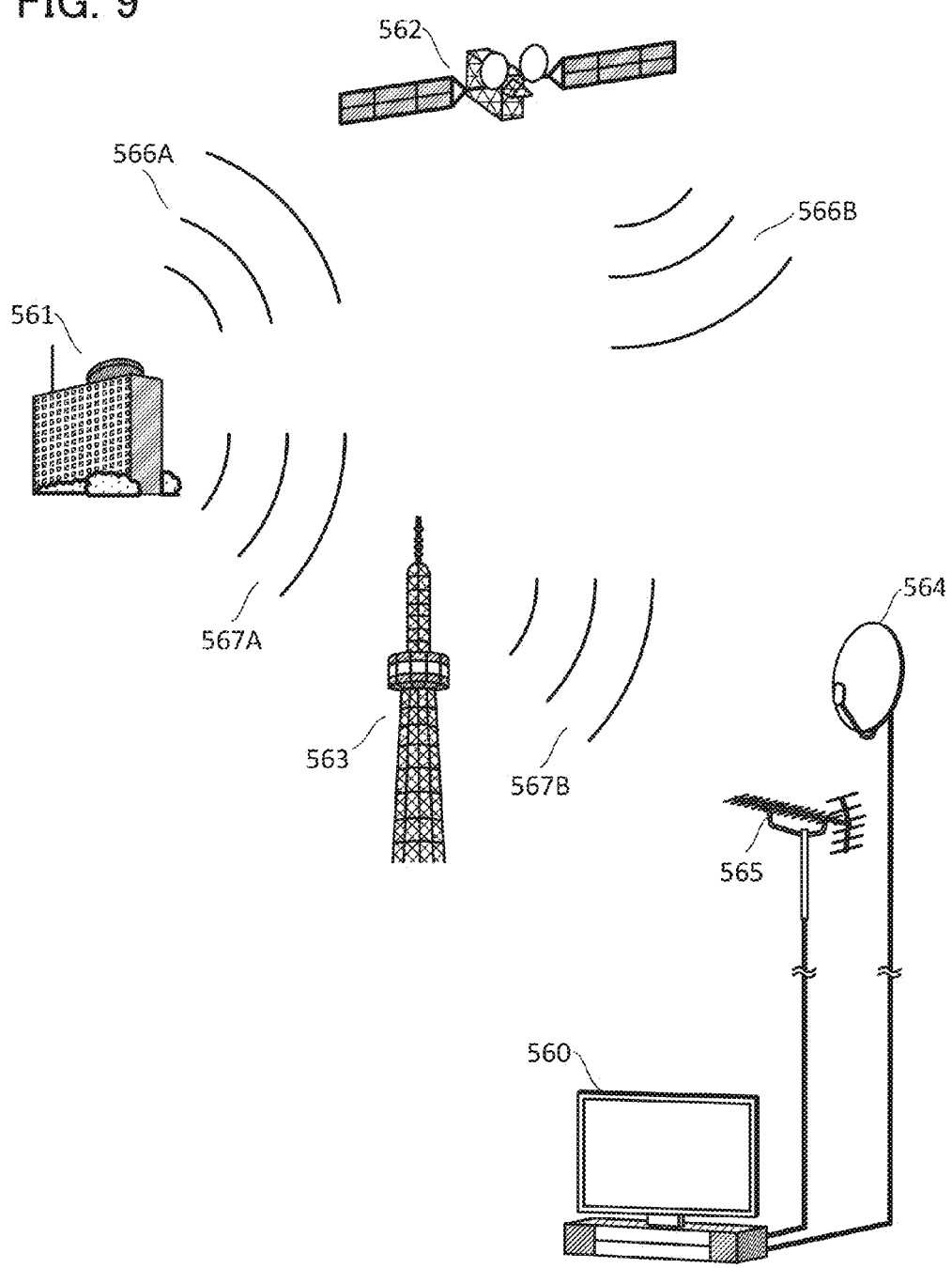
FIG. 9 is a schematic view illustrating data transmission in a broadcast system.

FIG. 9 schematically illustrates data transmission in the broadcast system. FIG. 9 illustrates a path in which a radio wave (a broadcast signal) transmitted from a broadcast station 561 is delivered to a television receiver 560 (a TV 560) of every household. The TV 560 is provided with the receiver 512 and the display device 513. As examples of an artificial satellite 562, a communication satellite (CS) and a broadcast satellite (BS) can be given. As examples of an antenna 564, a BS·110° CS antenna and a CS antenna can be given. Examples of the antenna 565 include an ultra-high frequency (UHF) antenna.

Radio waves 566A and 566B are broadcast signals for a satellite broadcast. The artificial satellite 562 transmits the radio wave 566B toward the ground when receiving the radio wave 566A. The antenna 564 of every household receives the radio wave 566B, and a satellite TV broadcast can be watched on the TV 560. Alternatively, the radio wave 566B is received by an antenna of another broadcast station, and a receiver in the broadcast station processes the radio wave 566B into a signal that can be transmitted to an optical cable. The broadcast station transmits the broadcast signal to the TV 560 of every household using an optical cable network. Radio waves 567A and 567B are broadcast signals for a terrestrial broadcast. A radio wave tower 563 amplifies the received radio wave 567A and transmits it as the radio wave 567B. A terrestrial TV broadcast can be watched on the TV 560 of every household when the antenna 565 receives the radio wave 567B.

A video distribution system of this embodiment is not limited to a system for a TV broadcast. Video data to be distributed may be either moving image data or still image data.

Figure 10:
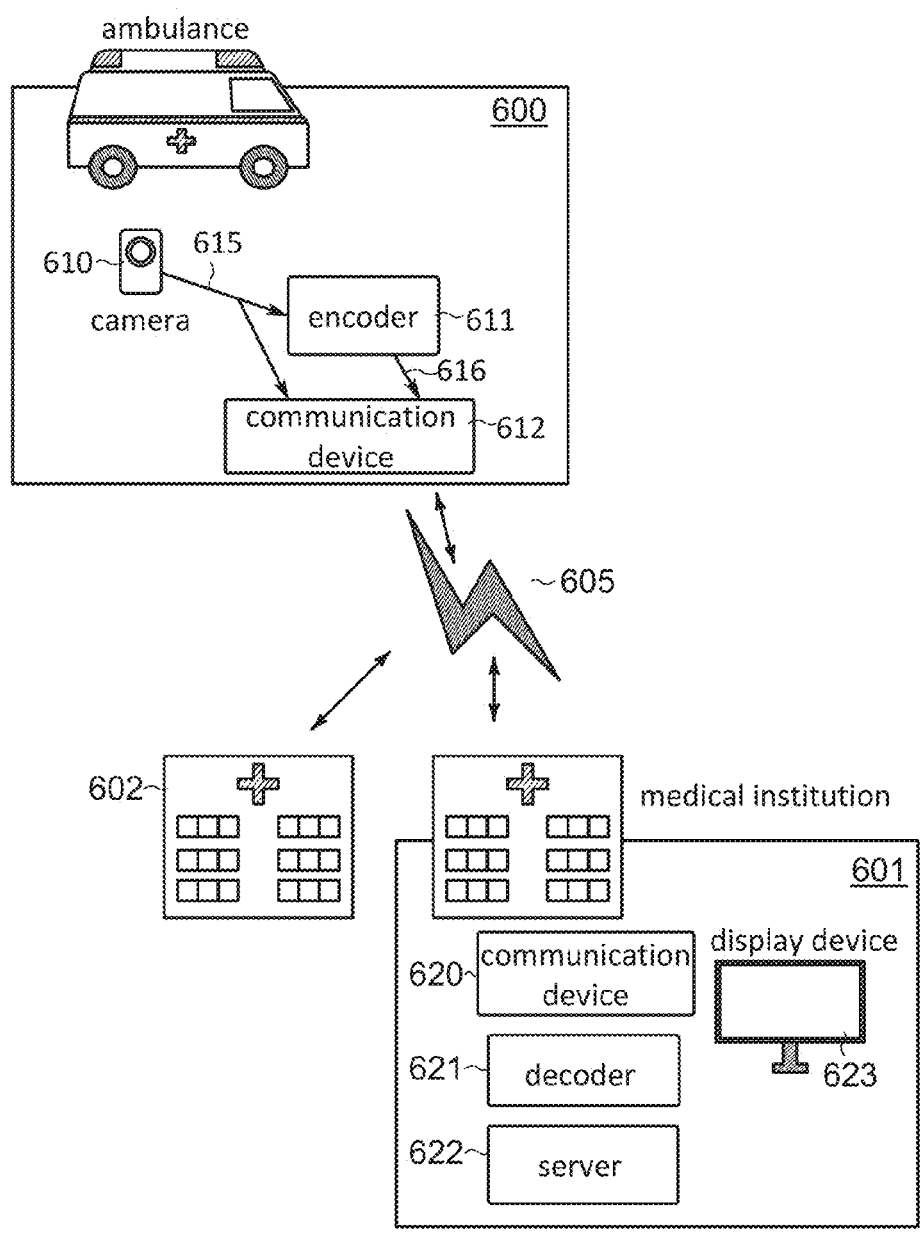
FIG. 10 illustrates a structure example of a video distribution system in the medical field.

For example, the video data 541 of the camera 510 may be distributed via a high-speed IP network. The distribution system of the video data 541 can be used in, for example, the medical field for remote diagnosis and remote treatment. In medical practice, e.g., in accurate diagnostic imaging, high definition (8K, 4K, or 2K) images are required. FIG. 10 schematically illustrates an emergency medical system using the distribution system of the video data.

A high-speed network 605 performs communication between an emergency transportation vehicle (an ambulance) 600 and a medical institution 601 and between the medical institution 601 and a medical institution 602. The ambulance 600 is equipped with a camera 610, an encoder 611, and a communication device 612.

A patient taken to the medical institution 601 is photographed with the camera 610. Video data 615 obtained with the camera 610 can be transmitted in an uncompressed state by the communication device 612, so that the high-resolution video data 615 can be transmitted to the medical institution 601 with a short delay. In the case where the high-speed network 605 cannot be used for the communication between the ambulance 600 and the medical institution 601, the video data can be encoded with the encoder 611 and encoded image data 616 can be transmitted.

In the medical institution 601, a communication device 620 receives the video data transmitted from the ambulance 600. When the received video data is uncompressed data, the data is transmitted via the communication device 620 and displayed on a display device 623. When the video data is compressed data, the data is decompressed with a decoder 621 and then transmitted to a server 622 and the display device 623. Judging from the image on the display device 623, doctors instruct crews of the ambulance 600 or staff members in the medical institution 601 who treat the patient. The doctors can check the condition of the patient in detail in the medical institution 601 while the patient is taken by the ambulance because the distribution system in FIG. 10 can transmit a high-definition image. Therefore, the doctors can instruct the ambulance crews or the staff members appropriately in a short time, resulting in improvement of a lifesaving rate of patients.

The communication of video data between the medical institution 601 and the medical institution 602 can be performed in the same way. A medical image obtained from an image diagnostic device (such as CT or MRI) of the medical institution 601 can be transmitted to the medical institution 602. Here, the ambulance 600 is given as an example of the means to transport patients; however, an aircraft such as a helicopter or a vessel may be used.

Figure 11A:
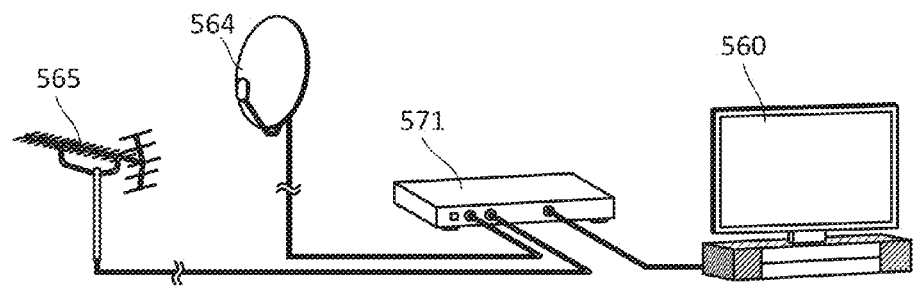
FIGS. 11A to 11D illustrate structure examples of a receiver.
Figure 11B:
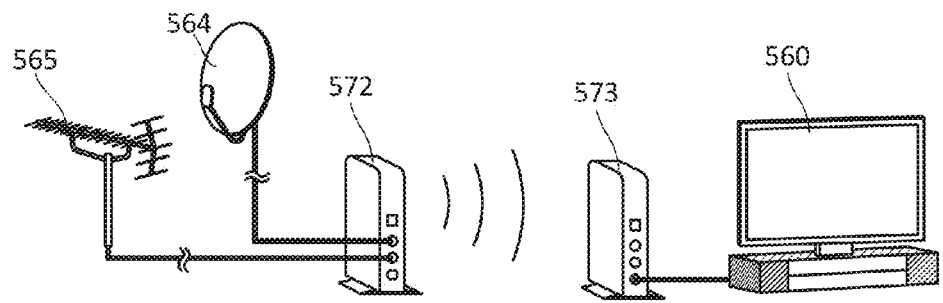
Figure 11C:
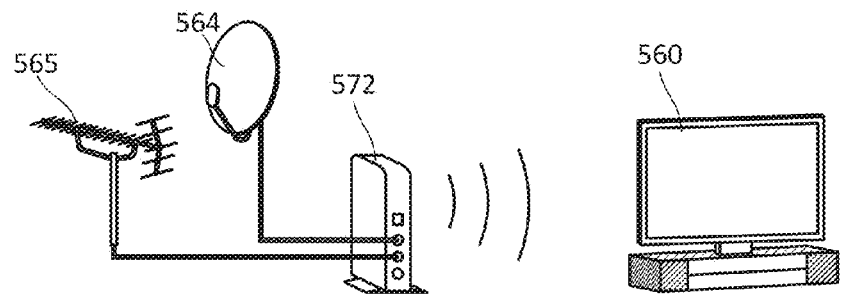
Figure 11D:
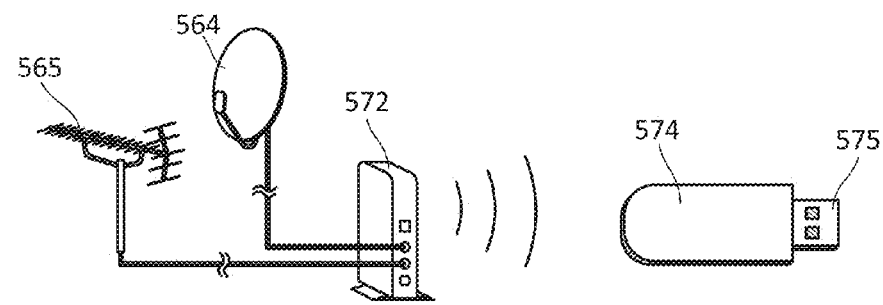

FIGS. 11A to 11D illustrate configuration examples of a receiver. The TV 560 can receive a broadcast signal with a receiver and perform display. FIG. 11A illustrates a case where a receiver 571 is provided outside the TV 560. FIG. 11B illustrates another case where the antennae 564 and 565 and the TV 560 perform data transmission/reception through wireless devices 572 and 573. In this case, the wireless device 572 or 573 functions as a receiver. The wireless device 573 may be incorporated in the TV 560 (FIG. 11C).

The size of a receiver can be reduced so that it can be portable. A receiver 574 illustrated in FIG. 11D includes a connector portion 575. If a display device and an electronic device such as an information terminal (e.g., a personal computer, a smartphone, a mobile phone, or a tablet terminal) include a terminal capable of being connected to the connector portion 575, they can be used to watch a satellite broadcast or a terrestrial broadcast.

The semiconductor device 1000 described in Embodiment 1 can be used for the encoder 522 of the broadcast system 500 in FIG. 8. Alternatively, the encoder 522 can be formed by combining a dedicated IC, a processor (e.g., GPU or CPU), and the like. Alternatively, the encoder 522 can be integrated into one dedicated IC chip.

<Encoder>

Figure 12:
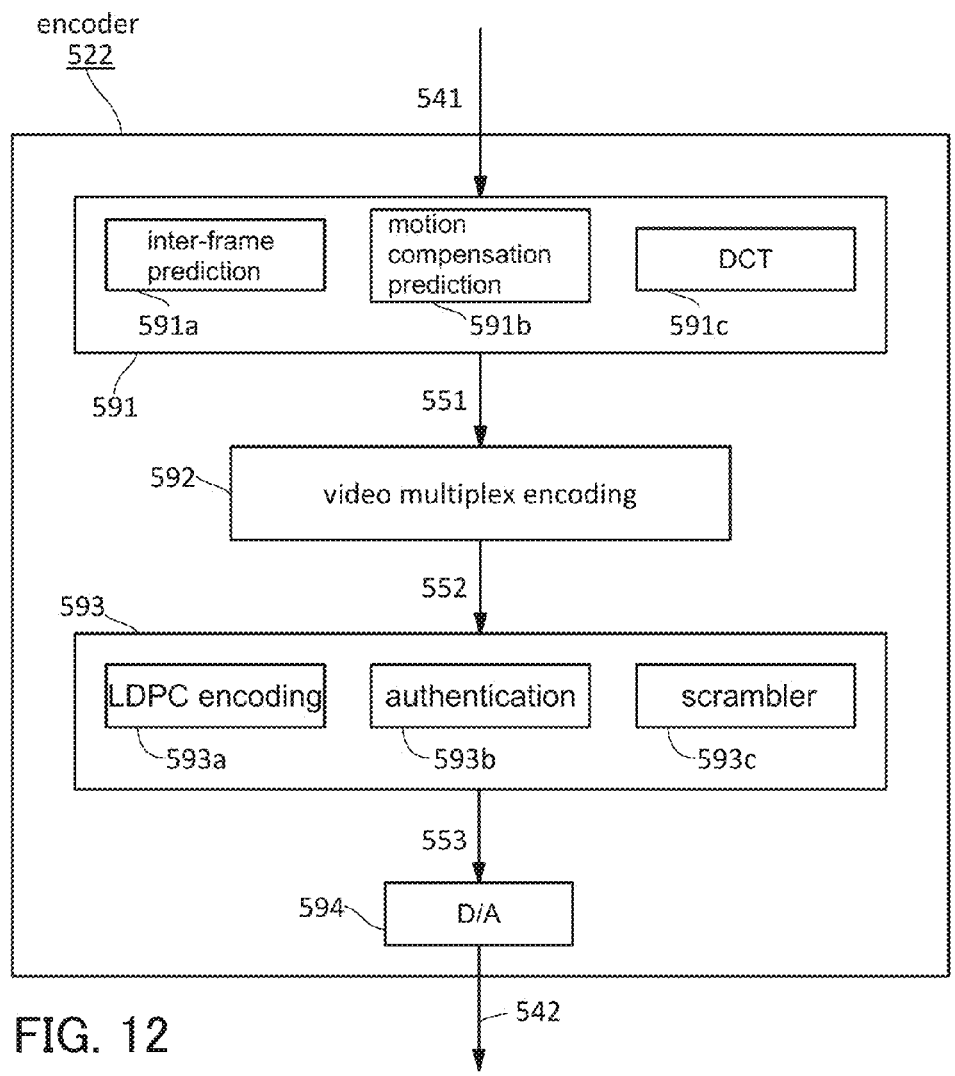
FIG. 12 is a block diagram showing a structure example of a semiconductor device.

FIG. 12 is a block diagram showing an example of the encoder 522. The encoder 522 includes circuits 591 to 594.

The circuit 591 performs source encoding, and includes an inter-frame prediction circuit 591a, a motion compensation prediction circuit 591b, and a DCT circuit 591c. The circuit 592 includes a video multiplex encoding processing circuit. The circuit 593 includes a low density parity check (LDPC) encoding circuit 593a, an authentication processing circuit 593b, and a scrambler 593c. The circuit 594 is a digital-analog conversion (DAC) portion.

The circuit 591 performs source encoding of the transmitted video data 541. The source encoding means processing by which a redundant component is removed from the video data. Note that the completely original video data cannot be obtained from data output from the circuit 591; the source encoding is irreversible processing.

The inter-frame prediction circuit 591a makes a prediction image of a frame to be encoded from the previous and/or subsequent frames to encode the prediction image. The motion compensation prediction circuit 591b detects a motion, a change in shape, or the like of an object in the video data 541, calculates the amount of the change, rotation, expansion/contraction, or the like, makes a prediction image of a frame including the object, and encodes the prediction image. The DCT circuit 591c use discrete cosine transform to convert pixel region data of the video data into frequency domain information.

The circuit 591 has a function of quantization of the source-encoded video data 541 through the inter-frame prediction circuit 591a, the motion compensation prediction circuit 591b, and the DCT circuit 591c. The quantization means operation of matching frequency components obtained by the DCT circuit 591c with the respective discrete values. This operation can reduce the large data in the video data 541. To the circuit 592, the circuit 591 transmits the video data that is source-encoded and quantized and a data stream 551 including data obtained by motion-compensated prediction.

The circuit 592 changes the data in the data stream 551 into a variable-length code and compresses it to multiplex (performs video multiplex coding). To multiplex means operation of arranging a plurality of data so that they can be transmitted as one bit column or bite column. The data subjected to video multiplex coding is transmitted to the circuit 593 as a data stream 552.

The circuit 593 mainly performs error correction coding, authentication, and encryption of the data stream 552 transmitted from the circuit 592. The LDPC encoding circuit 593a performs error correction coding and transmits data through a communication channel with noise. The authentication processing circuit 593b gives an identifier (ID) code, a password, and the like to data to be transmitted in order to prevent data recovery in an unintended receiver. The scrambler 593c converts a transmission data column of data to be transmitted into a random column irrelevant to a signal data column. The converted data can be restored to the original data by descrambling at a receiver. The circuit 593 performs error correction coding, authentication, and encryption of the data stream 552, and transmits the results as a data stream 553 to the circuit 594.

The circuit 594 performs digital-analog conversion of the data stream 553 to transmit the data stream 553 to the receiver 512. The data stream 553 subjected to digital-analog conversion is transmitted to the modulator 523 as encoded data 542.

This embodiment can be combined with any of the other embodiments in this specification as appropriate.

Embodiment 3

This embodiment will describe a semiconductor device used for the broadcast system.

<<Image Sensor>>

Figure 13A:
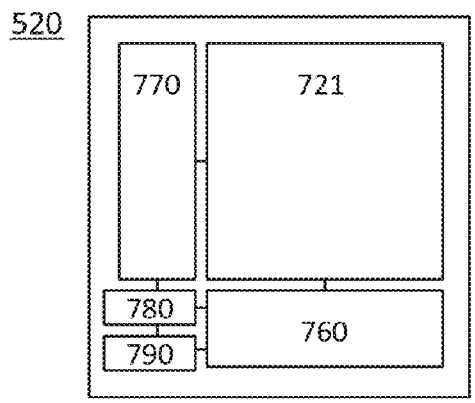
FIGS. 13A to 13C illustrate structure examples of an image sensor.

FIG. 13A is a plan view illustrating a configuration example of the image sensor 520. The image sensor 520 includes a pixel portion 721 and circuits 760, 770, 780, and 790. In this specification and the like, the circuits 760 to 790 and the like may be referred to as a "peripheral circuit" or a "driver". For example, the circuit 760 can be regarded as part of the peripheral circuit.

Figure 13B:
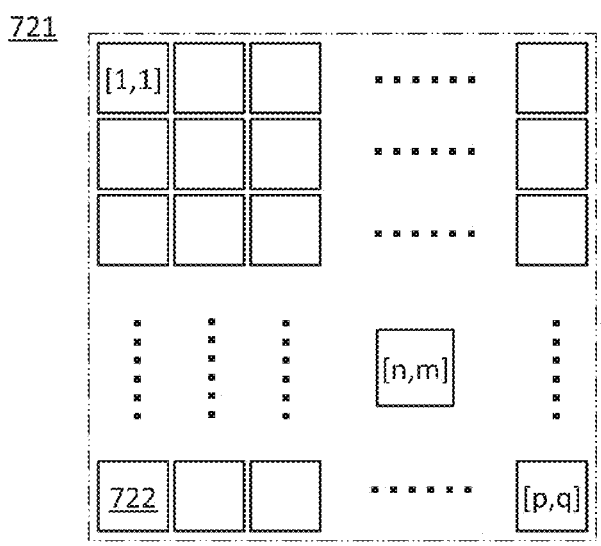

FIG. 13B illustrates a configuration example of the pixel portion 721. The pixel portion 721 includes a plurality of pixels (image sensor) 722 arranged in a matrix of p columns by q rows (p and q are each a natural number greater than or equal to 2). Note that in FIG. 13B, n is a natural number of greater than or equal to 1 and less than or equal to p, and m is a natural number of greater than or equal to 1 and less than or equal to q.

The circuits 760 and 770 are electrically connected to the plurality of pixels 722 and have a function of supplying signals for driving the plurality of pixels 722. The circuit 760 may have a function of processing an analog signal output from the pixels 722. The circuit 780 may have a function of controlling the operation timing of the peripheral circuit. For example, the circuit 780 may have a function of generating a clock signal. Furthermore, the circuit 780 may have a function of converting the frequency of a clock signal supplied from the outside. Moreover, the circuit 780 may have a function of supplying a reference potential signal (e.g., a ramp wave signal).

The peripheral circuit includes at least one of a logic circuit, a switch, a buffer, an amplifier circuit, and a converter circuit. Transistors or the like included in the peripheral circuit may be formed using part of a semiconductor that is formed to fabricate an after-mentioned pixel driver circuit 710. A semiconductor device such as an IC chip may be used as part or the whole of the peripheral circuit.

Note that in the peripheral circuit, at least one of the circuits 760 to 790 may be omitted. For example, when one of the circuits 760 and 790 additionally has a function of the other of the circuits 760 and 790, the other of the circuits 760 and 790 may be omitted. For another example, when one of the circuits 770 and 780 additionally has a function of the other of the circuits 770 and 780, the other of the circuits 770 and 780 may be omitted. For another example, a function of another peripheral circuit may be added to one of the circuits 760 to 790 to omit that peripheral circuit.

Figure 13C:
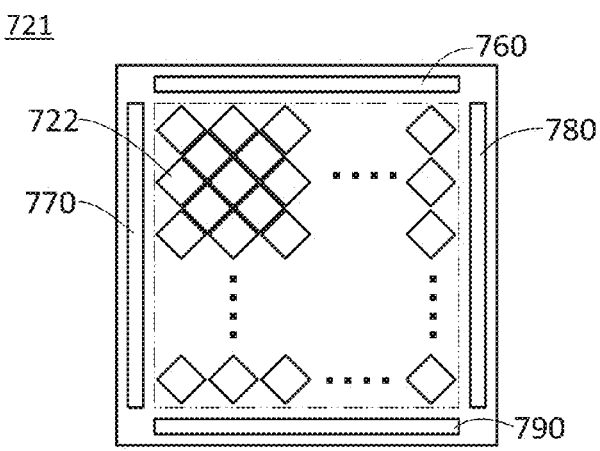

As illustrated in FIG. 13C, the circuits 760 to 790 may be provided along the periphery of the pixel portion 721. In the pixel portion 721 included in the image sensor 520, the pixels 722 may be obliquely arranged. When the pixels 722 are inclined, the space between the pixels in the row direction and the column direction (pitch) can be decreased. Accordingly, the quality of an image taken with the image sensor 520 can be improved.

The pixel portion 721 may be provided over the circuits 760 to 790 to overlap with the circuits 760 to 790. The provision of the pixel portion 721 over the circuits 760 to 790 to overlap with the circuits 760 to 790 can increase the area occupied by the pixel portion 721 for the image sensor 520. Accordingly, the light sensitivity, the dynamic range, the resolution, the reproducibility of a taken image, or the integration degree of the image sensor 520 can be increased.

When the pixels 722 included in the image sensor 520 are used as subpixels and the plurality of pixels 722 are provided with filters that transmit light in different wavelength ranges (color filters), data for achieving color image display can be obtained.

Figure 14A:
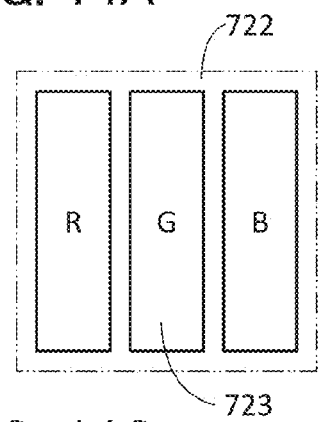
FIGS. 14A to 14D illustrate structure examples of an image sensor.

FIG. 14A is a plan view showing an example of the pixel 722 with which a color image is obtained. In FIG. 14A, a pixel 723 provided with a color filter that transmits light in a red (R) wavelength range (also referred to as "pixel 723R"), a pixel 723 provided with a color filter that transmits light in a green (G) wavelength range (also referred to as "pixel 623G"), and a pixel 723 provided with a color filter that transmits light in a blue (B) wavelength range (also referred to as "pixel 723B") are provided. The pixel 723R, the pixel 723G, and the pixel 723B collectively function as one pixel 722.

The color filters used in the pixel 722 are not limited to red (R), green (G), and blue (B) color filters, and color filters that transmit light of cyan (C), yellow (Y), and magenta (M) may be used. When the pixels 722 each of which senses light in at least three different wavelength ranges are provided, a full-color image can be obtained.

Figure 14B:
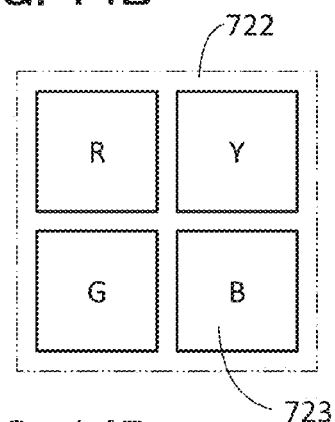
Figure 14C:
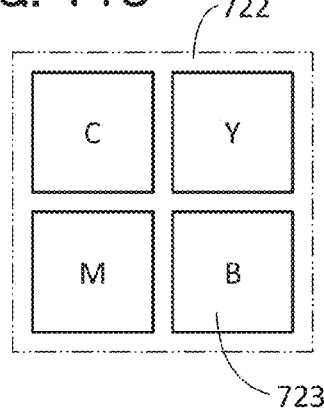

FIG. 14B illustrates the pixel 722 including a pixel 723 provided with a color filter that transmits yellow (Y) light, in addition to the pixels 723 provided with the color filters that transmit red (R), green (G), and blue (B) light. FIG. 14C illustrates the pixel 722 including a pixel 723 provided with a color filter that transmits blue (B) light, in addition to the pixels 723 provided with the color filters that transmit cyan (C), yellow (Y), and magenta (M) light. When the pixels 722 each of which senses light in four or more different wavelength ranges are provided in this way, the reproducibility of colors of an obtained image can be increased.

Figure 14D:
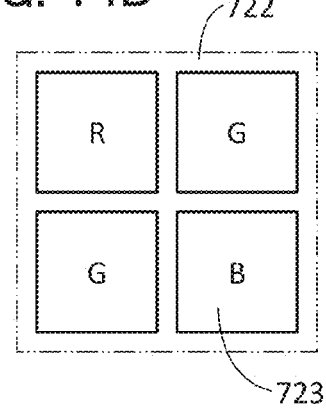

The pixel number ratio (or the ratio of light receiving area) of the pixel 723R to the pixel 723G and the pixel 723B is not necessarily 1:1:1. The pixel number ratio (the ratio of light receiving area) of red to green and blue may be 1:2:1 (Bayer arrangement), as illustrated in FIG. 14D. Alternatively, the pixel number ratio (the ratio of light receiving area) of red to green and blue may be 1:6:1.

Although the number of pixels 723 used in the pixel 722 may be one, two or more is preferable. For example, when two or more pixels 723 that sense light in the same wavelength range are provided, the redundancy is increased, and the reliability of the image sensor 520 can be increased.

When an infrared (IR) filter that transmits infrared light and absorbs or reflects light in a wavelength shorter than or equal to that of visible light is used as the filter, the image sensor 520 that detects infrared light can be achieved. Alternatively, when an ultra violet (UV) filter that transmits ultraviolet light and absorbs or reflects light in a wavelength longer than or equal to that of visible light is used as the filter, the image sensor 520 that detects ultraviolet light can be achieved. Alternatively, when a scintillator that turns a radiant ray into ultraviolet light or visible light is used as the filter, the image sensor 520 can be used as a radiation detector that detects an X-ray or a γ-ray.

When a neutral density (ND) filter (dimming filter) is used as a filter, a phenomenon of output saturation, which is caused when an excessive amount of light enters a photoelectric conversion element (light-receiving element), can be prevented. With a combination of ND filters with different dimming capabilities, the dynamic range of the image sensor can be increased.

Figure 15A:
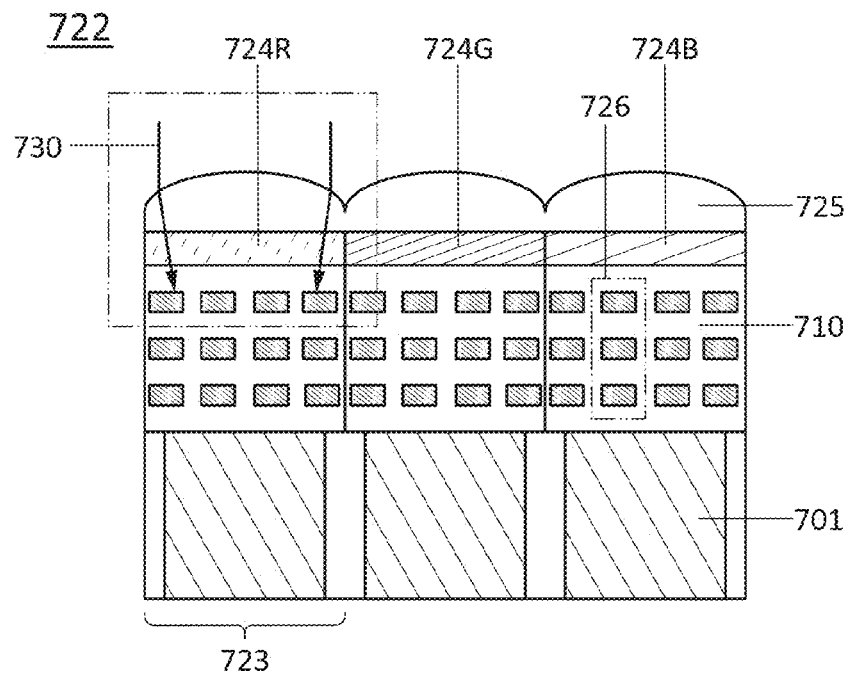
FIGS. 15A and 15B illustrate structure examples of an image sensor.

Besides the above-described filter, the pixel 723 may be provided with a lens. An arrangement example of the pixel 723, a filter 724, and a lens 725 will be described with reference to cross-sectional views in FIGS. 15A and 15B. With the lens 725, incident light can be efficiently received by a photoelectric conversion element. Specifically, as illustrated in FIG. 15A, light 730 enters a photoelectric conversion element 701 through the lens 725, the filter 724 (a filter 724R, a filter 724G, or a filter 724B), a pixel driver 710, and the like formed in the pixel 723.

Figure 15B:
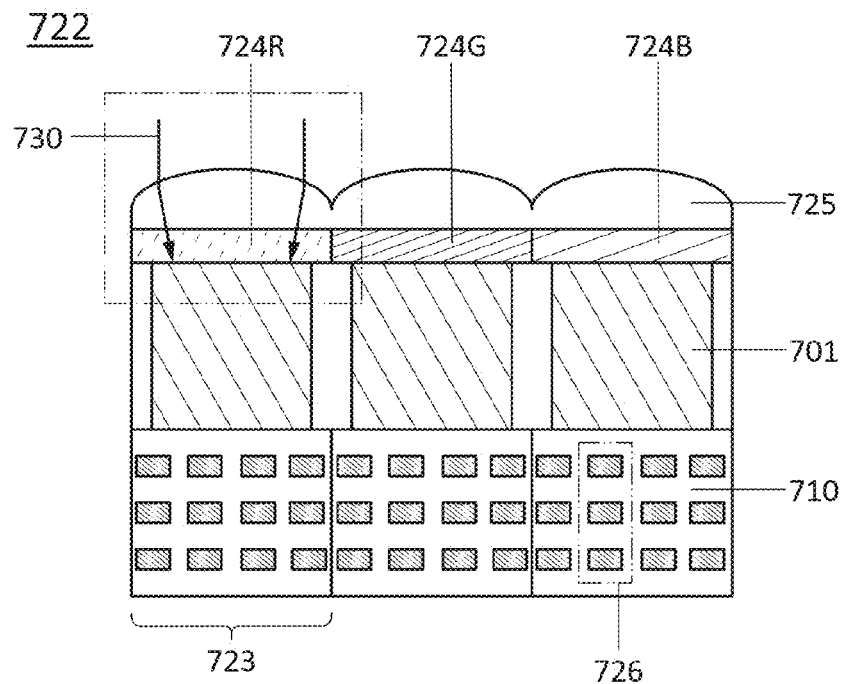

However, as illustrated in a region surrounded by the two-dot chain line, part of light 730 indicated by the arrows may be blocked by part of a wiring group 726, such as a transistor and/or a capacitor. Thus, a structure in which the lens 725 and the filter 724 are provided on the photoelectric conversion element 701 side, as illustrated in FIG. 15B, may be employed such that the incident light is efficiently received by the photoelectric conversion element 701. When the light 730 is incident on the photoelectric conversion element 701 side, the image sensor 520 with high light sensitivity can be provided.

Figure 16A:
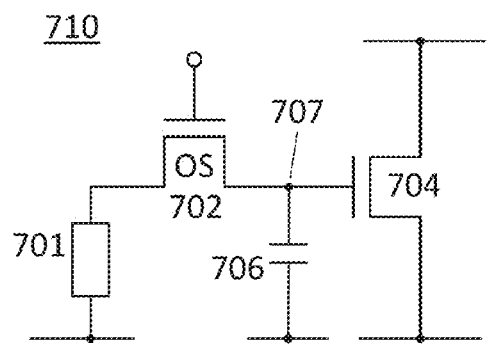
FIGS. 16A to 16C are circuit diagrams illustrating configuration examples of an image sensor.
Figure 16B:
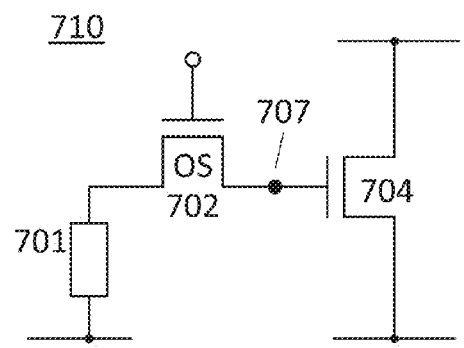
Figure 16C:
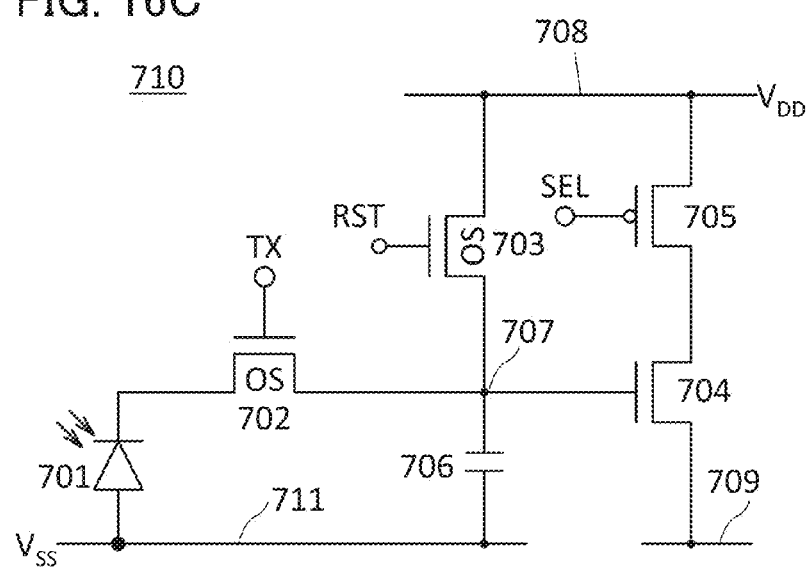

FIGS. 16A to 16C illustrate examples of the pixel driver 710 that can be used for the pixel portion 721. The pixel driver 710 illustrated in FIG. 16A includes a transistor 702, a transistor 704, and a capacitor 706 and is connected to the photoelectric conversion element 701. One of a source and a drain of the transistor 702 is electrically connected to the photoelectric conversion element 701, and the other of the source and the drain of the transistor 702 is electrically connected to a gate of the transistor 704 through a node 707 (a charge accumulation portion).

"OS" indicates that it is preferable to use an OS transistor. The same applies to the other drawings. Since the off-state current of the OS transistor is extremely low, the capacitor 706 can be made small. Alternatively, the capacitor 706 can be omitted as illustrated in FIG. 16B. Furthermore, when the transistor 702 is an OS transistor, the potential of the node 707 is less likely to be changed. Thus, an image sensor that is less likely to be affected by noise can be provided. Note that the transistor 704 may be an OS transistor.

A diode element formed using a silicon substrate with a PN junction or a PIN junction can be used as the photoelectric conversion element 701. Alternatively, a PIN diode element formed using an amorphous silicon film, a microcrystalline silicon film, or the like may be used. Alternatively, a diode-connected transistor may be used. Alternatively, a variable resistor or the like utilizing a photoelectric effect may be formed using silicon, germanium, selenium, or the like.

The photoelectric conversion element may be formed using a material capable of generating electric charge by absorbing radiation. Examples of the material capable of generating electric charge by absorbing radiation include lead iodide, mercury iodide, gallium arsenide, CdTe, and CdZn.

The pixel driver 710 illustrated in FIG. 16C includes the transistor 702, a transistor 703, the transistor 704, a transistor 705, and the capacitor 706 and is connected to the photoelectric conversion element 701. In the pixel driver 710 illustrated in FIG. 16C, a photodiode is used as the photoelectric conversion element 701. One of a source and a drain of the transistor 702 is electrically connected to a cathode of the photoelectric conversion element 701, and the other of the source and the drain of the transistor 702 is electrically connected to the node 707. An anode of the photoelectric conversion element 701 is electrically connected to a wiring 711. One of a source and a drain of the transistor 703 is electrically connected to the node 707. The other of the source and the drain of the transistor 703 is electrically connected to a wiring 708. The gate of the transistor 704 is electrically connected to the node 707. One of a source and a drain of the transistor 704 is electrically connected to a wiring 709. The other of the source and the drain of the transistor 704 is electrically connected to one of a source and a drain of the transistor 705. The other of the source and the drain of the transistor 705 is electrically connected to the wiring 708. One electrode of the capacitor 706 is electrically connected to the node 707. The other electrode of the capacitor 706 is electrically connected to the wiring 711.

The transistor 702 can function as a transfer transistor. A gate of the transistor 702 is supplied with a transfer signal TX. The transistor 703 can function as a reset transistor. A gate of the transistor 703 is supplied with a reset signal RST. The transistor 704 can function as an amplifier transistor. The transistor 705 can function as a selection transistor. A gate of the transistor 705 is supplied with a selection signal SEL. Moreover, $V_{DD}$ is supplied to the wiring 708 and $V_{ss}$ is supplied to the wiring 711.

Next, operation of the pixel driver 710 illustrated in FIG. 16C are described. First, the transistor 703 is turned on so that VDD is supplied to the node 707 (reset operation). Then, the transistor 703 is turned off, so that VDD is held in the node 707. Next, the transistor 702 is turned on, so that the potential of the node 707 is changed in accordance with the amount of light received by the photoelectric conversion element 701 (accumulation operation). After that, the transistor 702 is turned off so that the potential of the node 707 is stored. Then, the transistor 705 is turned on, so that a potential corresponding to the potential of the node 707 is output from the wiring 709 (selection operation). Measuring the potential of the wiring 709 can determine the amount of light received by the photoelectric conversion element 701.

An OS transistor is preferably used as each of the transistors 702 and 703. Since the off-state current of the OS transistor is extremely low as described above, the capacitor 706 can be small or omitted. Furthermore, when the transistors 702 and 703 are OS transistors, the potential of the node 707 is less likely to change. Thus, the image sensor 520 that is less likely to be affected by noise can be provided.

<<Display Device>>

The display device 513 includes at least one of an electroluminescence (EL) element (e.g., an EL element including organic and inorganic materials, an organic EL element, or an inorganic EL element), a light-emitting diode (LED) chip (e.g., a white LED chip, a red LED chip, a green LED chip, or a blue LED chip), a transistor (a transistor that emits light depending on current), an electron emitter, a display element including a carbon nanotube, a liquid crystal element, electronic ink, an electrowetting element, an electrophoretic element, a display element using micro electro mechanical systems (MEMS) (such as a grating light valve (GLV), a digital micromirror device (DMD), a digital micro shutter (DMS), MIRASOL (registered trademark), an interferometric modulation (IMOD) element, a MEMS shutter display element, an optical-interference-type MEMS display element, or a piezoelectric ceramic display), quantum dots, and the like.

Other than the above, a display medium whose contrast, luminance, reflectance, transmittance, or the like is changed by electric or magnetic action may be included in the display device. For example, the display device may be a plasma display panel (PDP).

Note that examples of display devices having EL elements include an EL display. Examples of display devices including electron emitters are a field emission display (FED) and an SED-type flat panel display (SED: surface-conduction electron-emitter display).

Examples of display devices containing quantum dots in each pixel include a quantum dot display. Note that quantum dots may be provided not as display elements but as part of a backlight unit used for a liquid crystal display device or the like. The use of quantum dots enables display with high color purity.

Examples of display devices including liquid crystal elements include a liquid crystal display device (e.g., a transmissive liquid crystal display, a transflective liquid crystal display, a reflective liquid crystal display, a direct-view liquid crystal display, or a projection liquid crystal display).

In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Examples of display devices including electronic ink, electronic liquid powder (registered trademark), or electrophoretic elements include electronic paper.

Note that in the case of using an LED chip for a display element or the like, graphene or graphite may be provided under an electrode or a nitride semiconductor of the LED chip. Graphene or graphite may be a multilayer film in which a plurality of layers are stacked. The provision of graphene or graphite enables easy formation of a nitride semiconductor film thereover, such as an n-type GaN semiconductor layer including crystals. Furthermore, a p-type GaN semiconductor layer including crystals or the like can be provided thereover so that the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can be formed by a sputtering method.

In the case of a display element including MEMS, a drying agent may be provided in a space where the display element is sealed (e.g., between an element substrate over which the display element is placed and a counter substrate opposed to the element substrate). Providing a drying agent can prevent MEMS and the like from becoming difficult to move or deteriorating easily because of moisture or the like.

Figure 17:
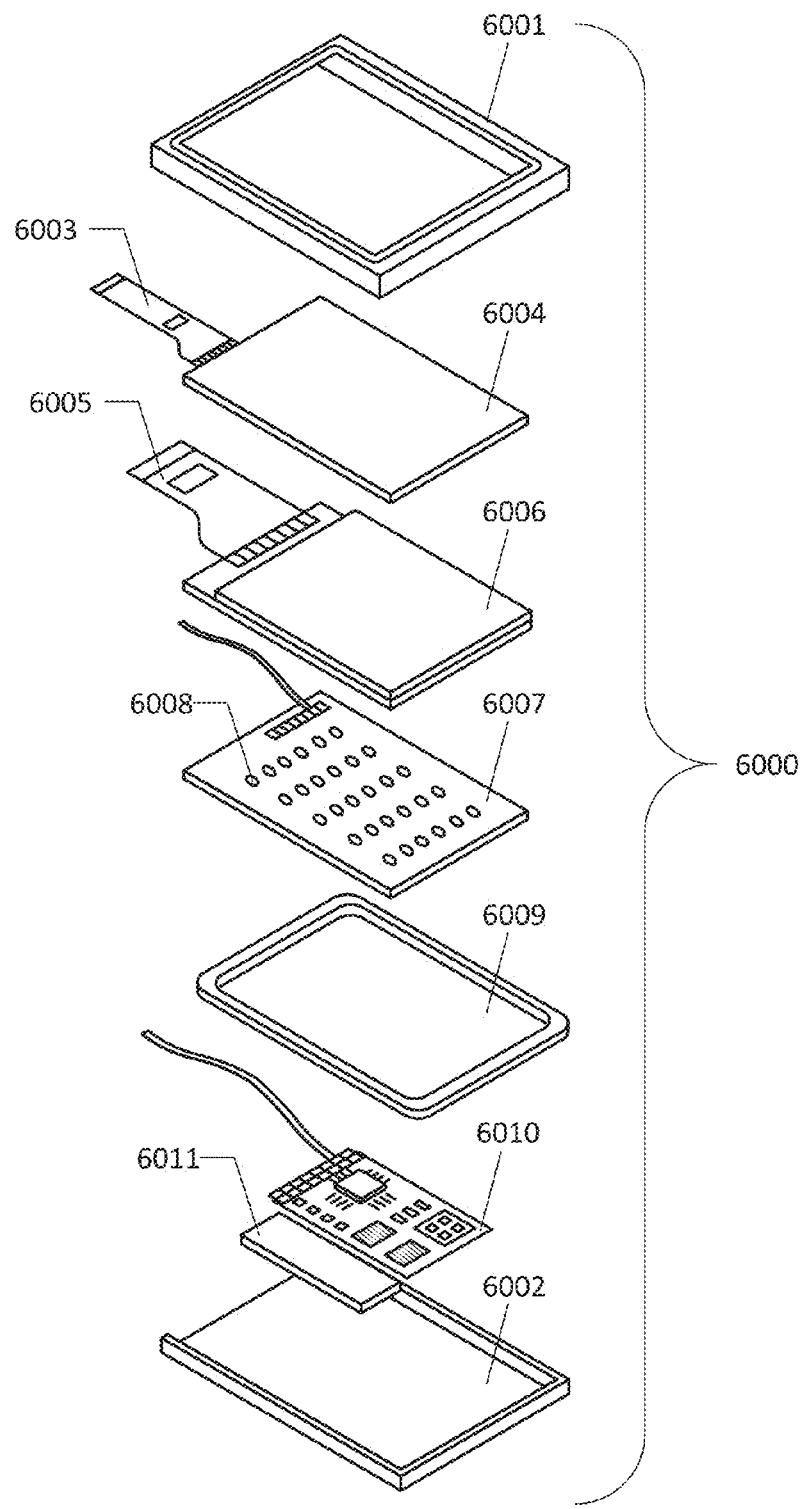
FIG. 17 is an exploded view illustrating a structure example of a display module.

FIG. 17 illustrates a structure example of a display module used for the display device 513. In a display module 6000 in FIG. 17, a touch sensor 6004 connected to an FPC 6003, a display panel 6006 connected to an FPC 6005, a backlight unit 6007, a frame 6009, a printed board 6010, and a battery 6011 are provided between an upper cover 6001 and a lower cover 6002. Note that the backlight unit 6007, the battery 6011, the touch sensor 6004, and the like are not provided in some cases.

The semiconductor device of one embodiment of the present invention can be included in, for example, an integrated circuit mounted on the printed board 6010, and the like. The display portion 528 of the display device 513 is formed with the display panel 6006. The printed board 6010 is provided with a power supply circuit, a signal processing circuit for outputting a video signal and a clock signal, and the like. As a power source for supplying power to the power supply circuit, the battery 6011 or a commercial power source may be used. Note that the battery 6011 can be omitted in the case where a commercial power source is used as the power source. If necessary, the printed board 6010 may be provided with the receiver of one embodiment of the present invention.

The shapes and sizes of the upper cover 6001 and the lower cover 6002 can be changed as appropriate in accordance with the sizes of the touch sensor 6004, the display panel 6006, and the like.

The touch sensor 6004 can be a resistive touch panel or a capacitive touch panel and may be formed to overlap with the display panel 6006. The display panel 6006 can have a touch sensor function. For example, an electrode for a touch sensor may be provided in each pixel of the display panel 6006 so that a capacitive touch panel function is added. Alternatively, a photosensor may be provided in each pixel of the display panel 6006 so that an optical touch sensor function is added.

The backlight unit 6007 includes a light source 6008. The light source 6008 may be provided at an end portion of the backlight unit 6007 and a light diffusing plate may be used. When a light-emitting display device or the like is used for the display panel 6006, the backlight unit 6007 can be omitted. The frame 6009 protects the display panel 6006 and also functions as an electromagnetic shield for blocking electromagnetic waves generated from the printed board 6010 side. The frame 6009 may function as a radiator plate.

The display module 6000 can be additionally provided with a member such as a polarizing plate, a retardation plate, or a prism sheet.

Figure 18A:
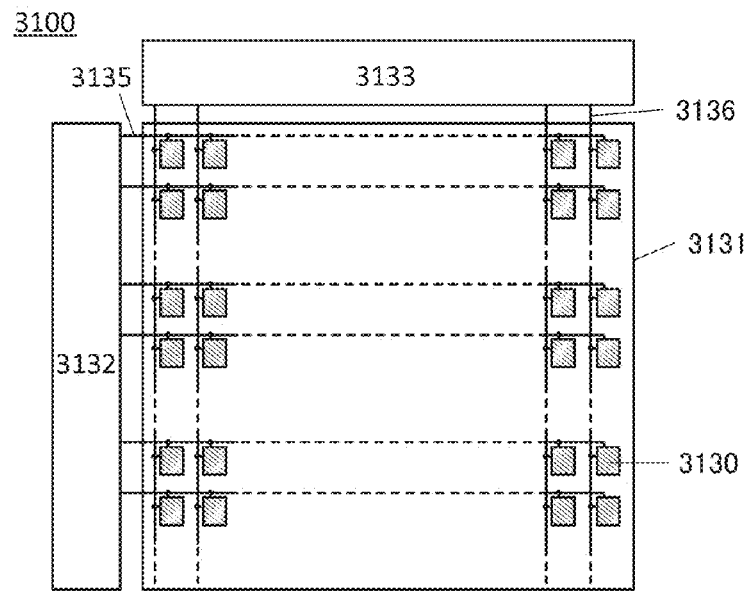
FIG. 18A is a block diagram illustrating a structure example of a display portion.
Figure 18B:
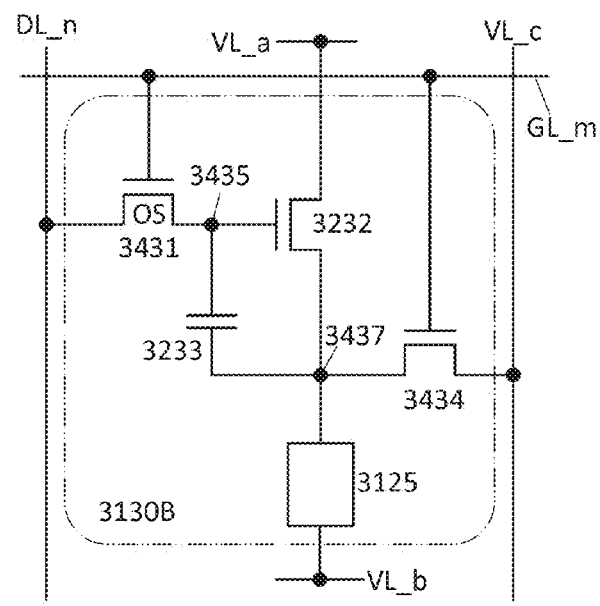
FIGS. 18B and 18C are circuit diagrams each illustrating a configuration example of a pixel.
Figure 18C:
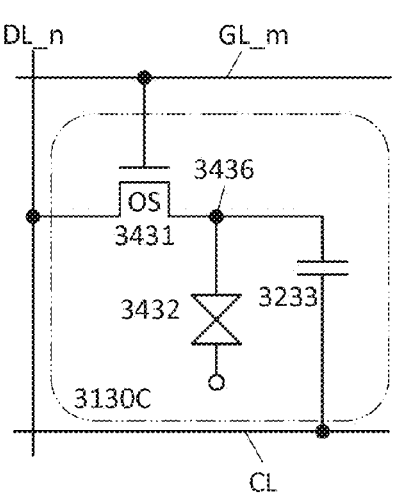

FIGS. 18A to 18C illustrate configuration examples of the display portion. A display portion 3100 in FIG. 18A includes a display area 3131 and circuits 3132 and 3133. The circuit 3132 functions as a scan line driver, for example, and the circuit 3133 functions as a signal line driver, for example.

The display portion 3100 includes m scan lines 3135 that are arranged parallel or substantially parallel to each other and whose potentials are controlled by the circuit 3132, and n signal lines 3136 that are arranged parallel or substantially parallel to each other and whose potentials are controlled by the circuit 3133. The display area 3131 includes a plurality of pixels 3130 arranged in a matrix of m rows by n columns. Note that in this embodiment, m and n are each an integer number of 2 or greater.

Each of the scan lines 3135 is electrically connected to then pixels 3130 on the corresponding row among the pixels 3130 in the display area 3131. Each of the signal lines 3136 is electrically connected to the m pixels 3130 on the corresponding column among the pixels 3130.

FIGS. 18B and 18C are circuit diagrams illustrating configuration examples of the pixel 3130. A pixel 3130B in FIG. 18B is a pixel of a self-luminous display device, and a pixel 3130C in FIG. 18C is a pixel of a liquid crystal display device.

The pixel 3130B includes a capacitor 3233, transistors 3431, 3232 and 3434, and a light-emitting element 3125. The pixel 3130B is electrically connected to the signal line 3136 on the n-th column to which a data signal is supplied (hereinafter referred to as a signal line DL_n), the scan line 3135 on the m-th row to which a gate signal is supplied (hereinafter referred to as a scan line GL_m), and potential supply lines VL_a and VL_b.

A plurality of pixels 3130B are each used as a subpixel, and the subpixels emit light in different wavelength ranges, so that a color image can be obtained. For example, a pixel 3130 that emits light in a red wavelength range, a pixel 3130 that emits light in a green wavelength range, and a pixel 3130 that emits light in a blue wavelength range are used as one pixel.

The combination of the wavelength ranges of light is not limited to red, green, and blue and may be cyan, yellow, and magenta. When subpixels that emit light in at least three different wavelength ranges are provided in one pixel, a color image can be displayed.

Alternatively, one or more colors of yellow, cyan, magenta, white, and the like may be added to red, green, and blue. For example, a subpixel that emits light in a yellow wavelength range may be used, in addition to red, green, and blue. One or more of red, green, blue, white, and the like may be added to cyan, yellow, and magenta. For example, a subpixel that emits light in a blue wavelength range may be added in addition to cyan, yellow, and magenta. When subpixels that emit light in four or more different wavelength ranges are provided in one pixel, the reproducibility of colors of a displayed image can be further increased.

The pixel number ratio (or the ratio of light-emitting area) of red to green and blue used for one pixel need not be 1:1:1. For example, the pixel number ratio of red to green and blue may be 1:1:2. Alternatively, the pixel number ratio of red to green and blue may be 1:2:3.

A subpixel that emits white light may be combined with red, green, and blue color filters or the like to enable color display. Alternatively, a subpixel emitting light in a red wavelength range, a subpixel emitting light in a green wavelength range, and a subpixel emitting light in a blue wavelength range may be combined with a color filter transmitting light in a red wavelength, a color filter transmitting light in a green wavelength, and a color filter transmitting light in a blue wavelength, respectively.

The present invention is not limited to the application to a display device for color display but can also be applied to a display device for monochrome display.

The pixel 3130C illustrated in FIG. 18C includes the transistor 3431, the capacitor 3233, and a liquid crystal element 3432. The pixel 3130C is electrically connected to the signal line DL_n, the scan line GL_m, and a capacitor line CL.

The potential of one of a pair of electrodes of the liquid crystal element 3432 is set in accordance with the specifications of the pixel 3130C as appropriate. The alignment state of a liquid crystal in the liquid crystal element 3432 depends on data written to a node 3436. A common potential may be applied to the one of the pair of electrodes of the liquid crystal element 3432 included in each of the plurality of pixels 3130C. The potential of the capacitor line CL is set in accordance with the specifications of the pixel 3130C as appropriate. The capacitor 3233 functions as a storage capacitor for storing data written to the node 3436.

As examples of a mode of the liquid crystal element 3432, the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples include an electrically controlled birefringence (ECB) mode, a polymer dispersed liquid crystal (PDLC) mode, a polymer network liquid crystal (PNLC) mode, and a guest-host mode. Note that the present invention is not limited to these modes, and various modes can be used.

Figure 19A:
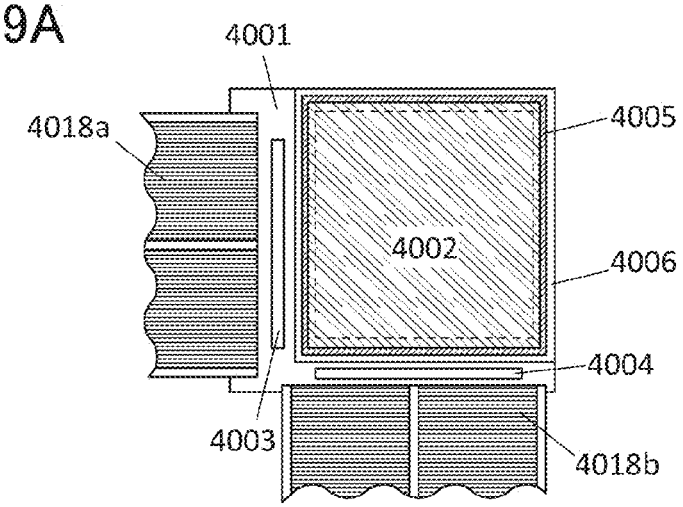
FIGS. 19A to 19C illustrate structure examples of a display panel.

The device structure of the display panel will be described with reference to FIGS. 19A to 19C, FIGS. 20A and 20B, and FIGS. 21A and 21B. In FIG. 19A, a sealant 4005 is provided so as to surround a pixel portion 4002 provided over a substrate 4001, and the pixel portion 4002 is sealed by the sealant 4005 and a substrate 4006. In FIG. 19A, a signal line driver 4003 and a scan line driver 4004 each are formed using a single crystal semiconductor or a polycrystalline semiconductor over another substrate, and mounted in a region different from the region surrounded by the sealant 4005 over the substrate 4001. Various signals and potentials are supplied to the signal line driver 4003, the scan line driver 4004, or the pixel portion 4002 through flexible printed circuits (FPCs) 4018a and 4018b.

Figure 19B:
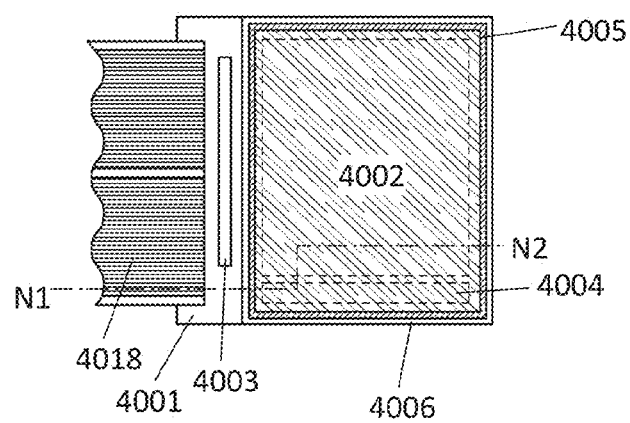
Figure 19C:
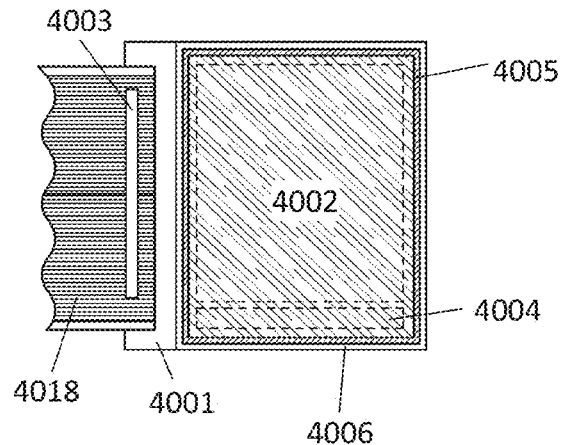

In FIGS. 19B and 19C, the sealant 4005 is provided so as to surround the pixel portion 4002 and the scan line driver 4004 that are provided over the substrate 4001. The substrate 4006 is provided over the pixel portion 4002 and the scan line driver 4004. Hence, the pixel portion 4002 and the scan line driver 4004 are sealed together with the display element by the substrate 4001, the sealant 4005, and the substrate 4006. In FIGS. 19B and 19C, a signal line driver 4003 formed using a single crystal semiconductor or a polycrystalline semiconductor over a substrate separately prepared is mounted in a region different from the region surrounded by the sealant 4005 over the substrate 4001. In FIGS. 19B and 19C, various signals and potentials are supplied to the signal line driver 4003, the scan line driver 4004, or the pixel portion 4002 through an FPC 4018.

Although FIGS. 19B and 19C each illustrate an example in which the signal line driver 4003 is formed separately and mounted on the substrate 4001, one embodiment of the present invention is not limited to this structure. The scan line driver may be separately formed and then mounted, or only part of the signal line driver or only part of the scan line driver may be separately formed and then mounted.

The connection method of a separately formed driver is not particularly limited; wire bonding, a chip on glass (COG), a tape carrier package (TCP), a chip on film (COF), or the like can be used. FIG. 19A illustrates an example in which the signal line driver 4003 and the scan line driver 4004 are mounted by a COG. FIG. 19B illustrates an example in which the signal line driver 4003 is mounted by a COG. FIG. 19C illustrates an example in which the signal line driver 4003 is mounted by a TCP. In some cases, the display device encompasses a panel in which a display element is sealed, and a module in which an IC or the like including a controller is mounted on the panel. The pixel portion and the scan line driver provided over the substrate 4001 include a plurality of transistors to which the transistor that is described in the above embodiment can be applied.

FIGS. 20A and 20B correspond to cross-sectional views taken along chain line N1-N2 in FIG. 19B. FIG. 20A illustrates a display panel 4000A of a liquid crystal display device, and FIG. 20B illustrates a display panel 4000B of a self-luminous display device.

The display panel 4000A has an electrode 4015, and the electrode 4015 is electrically connected to a terminal included in the FPC 4018 through an anisotropic conductive layer 4019. The electrode 4015 is electrically connected to a wiring 4014 in an opening formed in insulating layers 4112, 4111, and 4110. The display panel 4000A includes transistors 4010 and 4011 and a capacitor 4020. The capacitor 4020 includes a region where part of a source electrode or drain electrode of the transistor 4010 overlaps with an electrode 4021 with the insulating layer 4103 interposed therebetween. The electrode 4021 is formed using the same conductive layer as the electrode 4017. The electrode 4015 is formed of the same conductive layer as a first electrode layer 4030, and the wiring 4014 is formed of the same conductive layer as source and drain electrodes of transistors 4010 and 4011. The same applies to the display panel 4000B.

The pixel portion 4002 and the scan line driver 4004 provided over the substrate 4001 include a plurality of transistors. In FIGS. 20A and 20B, the transistor 4010 included in the pixel portion 4002 and the transistor 4011 included in the scan line driver 4004 are illustrated as an example. The insulating layers 4112, 4111, and 4110 are provided over the transistors 4010 and 4011 in FIG. 20A, and a bank 4510 is further provided over the insulating layer 4112 in FIG. 20B.

In general, the capacitance of a capacitor provided in a pixel is set in consideration of leakage current or the like of transistors provided in the pixel so that charge can be held for a predetermined period. The capacitance of the capacitor may be set considering off-state current of the transistor or the like. For example, when an OS transistor is used in a pixel portion of a liquid crystal display device, the capacitance of the capacitor can be one-third or less, or one-fifth or less, of the capacitance of a liquid crystal. Using an OS transistor can omit the formation of a capacitor.

In FIG. 20A, a liquid crystal element 4013 includes the first electrode layer 4030, a second electrode layer 4031, and a liquid crystal layer 4008. Note that an insulating layer 4032 and an insulating layer 4033 each functioning as alignment films are provided so that the liquid crystal layer 4008 is provided therebetween. The second electrode layer 4031 is provided on the substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control the distance between the first electrode layer 4030 and the second electrode layer 4031 (a cell gap). Alternatively, a spherical spacer may be used.

In the case where a liquid crystal element is used as the display element, thermotropic liquid crystal, low-molecular liquid crystal, high-molecular liquid crystal, polymer-dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 weight percent or more of a chiral material is mixed is used for the liquid crystal layer in order to improve the temperature range. The liquid crystal composition which includes the liquid crystal exhibiting a blue phase and the chiral material has a short response time of 1 msec or less and is optically isotropic; therefore, alignment treatment is not necessary and viewing angle dependence is small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, productivity of the liquid crystal display device can be improved.

Furthermore, it is possible to use a method called domain multiplication or multi-domain design, in which a pixel is divided into some regions (subpixels) and molecules are aligned in different directions in their respective regions.

The specific resistivity of the liquid crystal material is greater than or equal to $1\times10^9$ Ω·cm, preferably greater than or equal to $1\times10^{11}$ Ω·cm, still preferably greater than or equal to $1\times10^{12}$ Ω·cm. Note that the specific resistivity in this specification is measured at 20° C.

In the OS transistor used in this embodiment, the current in an off state (the off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In the OS transistor, relatively high field-effect mobility can be obtained, whereby high-speed operation is possible. Consequently, when the above transistor is used in a pixel portion of a display device, high-quality images can be obtained. Since a driver portion and a pixel portion can be separately formed over one substrate with the use of the above transistor, the number of components of the display device can be reduced.

In the display device, a black matrix (a light-blocking layer), an optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a sidelight, or the like may be used as a light source.

As the display element included in the display device, a light-emitting element utilizing electroluminescence (also referred to as an "EL element") can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer, so that a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. Then, recombination of these carriers (the electrons and holes) makes the light-emitting organic compound form an excited state and emit light when it returns from the excited state to a ground state. Based on such a mechanism, such a light-emitting element is referred to as a current-excitation type light-emitting element.

In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

The EL layer can be formed by an evaporation method (including a vacuum evaporation method), a transfer method, a printing method, an inkjet method, a coating method, or the like.

Inorganic EL elements are classified as a dispersed inorganic EL element and a thin-film inorganic EL element depending on their element structures. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is given here using an organic EL element as a light-emitting element.

In order to extract light emitted from the light-emitting element, at least one of a pair of electrodes is transparent. The light-emitting element that together with a transistor is formed over a substrate can have a top emission structure in which light emission is extracted from the side opposite to the substrate; a bottom emission structure in which light emission is extracted from the substrate side; or a dual emission structure in which light emission is extracted from both the side opposite to the substrate and the substrate side.

In FIG. 20B, a light-emitting element 4513 is electrically connected to the transistor 4010 in the pixel portion 4002.

The structure of the light-emitting element 4513 is the stacked-layer structure including the first electrode layer 4030, a light-emitting layer 4511, and the second electrode layer 4031; however, this embodiment is not limited to this structure. The structure of the light-emitting element 4513 can be changed as appropriate depending on a direction in which light is extracted from the light-emitting element 4513, or the like.

The bank 4510 is formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space which is enclosed by the substrate 4001, the substrate 4006, and the sealant 4005, a filler 4514 is provided for sealing. It is preferable that, in this manner, the light-emitting element be packaged (sealed) with a protective film (such as a laminate film or an ultraviolet curable resin film) or a cover member with high air-tightness and little degasification so that the light-emitting element is not exposed to the outside air.

As the filler 4514, an ultraviolet curable resin or a thermosetting resin can be used as well as an inert gas such as nitrogen or argon. For example, polyvinyl chloride (PVC), an acrylic resin, polyimide, an epoxy resin, a silicone resin, polyvinyl butyral (PVB), or ethylene vinyl acetate (EVA) can be used. A drying agent may be contained in the filler 4514.

A glass material such as a glass frit, or a resin that is curable at room temperature such as a two-component-mixture-type resin, a light curable resin, a thermosetting resin, and the like can be used for the sealant 4005. A drying agent may be contained in the sealant 4005.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (also called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 each can also be formed using one or plural kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and nitrides thereof.

Alternatively, a conductive composition containing a conductive high molecule (also called conductive polymer) can be used for the first electrode layer 4030 and the second electrode layer 4031. As the conductive high molecule, a so-called 7c-electron conjugated conductive high molecule can be used. Examples include polyaniline or a derivative thereof, polypyrrole or a derivative thereof, polythiophene or a derivative thereof, and a copolymer of two or more of aniline, pyrrole, and thiophene or a derivative thereof.

FIG. 21A is a cross-sectional view in the case where top-gate transistors are provided as the transistors 4011 and 4010 in FIG. 20A. Similarly, FIG. 21B illustrates a cross-sectional view in which top-gate transistors are provided as the transistors 4011 and 4010 illustrated in FIG. 21B.

In each of the transistors 4010 and 4011, the electrode 4017 functions as a gate electrode. The wiring 4014 functions as a source electrode or a drain electrode. The insulating layer 4103 functions as a gate insulating film. The transistors 4010 and 4011 each include a semiconductor layer 4012. For the semiconductor layer 4012, crystalline silicon, polycrystalline silicon, amorphous silicon, an oxide semiconductor, an organic semiconductor, or the like may be used. Impurities may be introduced to the semiconductor layer 4012, if necessary, to increase conductivity of the semiconductor layer 4012 or control the threshold value of the transistor.

<<Electronic Device>>

Examples of an electronic device provided with the above-described display portion include a TV device, a monitor of a computer or the like, a digital camera, a digital video camera, a digital photo frame, a mobile phone (also referred to as a cellular phone or a mobile phone device), a portable game machine, a portable information terminal, an audio reproducing device, and a large game machine such as a pinball machine. When having flexibility, the above-described electronic device can be incorporated along a curved inside/outside wall surface of a house or a building or a curved interior/exterior surface of a car. FIGS. 22A to 22F are structural examples of the electronic device.

Figure 22A:
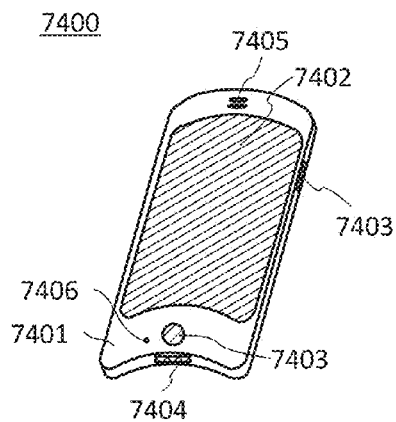
FIGS. 22A to 22F are schematic diagrams each illustrating a structure example of an electronic device.

A mobile phone 7400 in FIG. 22A includes a display portion 7402 incorporated in a housing 7401, operation buttons 7403, an external connection port 7404, a speaker 7405, a microphone 7406, and the like. When the display portion 7402 of the mobile phone 7400 is touched with a finger or the like, data can be input to the mobile phone 7400. Further, operations such as making a call and inputting a letter can be performed by touch on the display portion 7402 with a finger or the like. With the operation buttons 7403, power ON or OFF can be switched. In addition, types of images displayed on the display portion 7402 can be switched; switching images from a mail creation screen to a main menu screen.

Figure 22B:
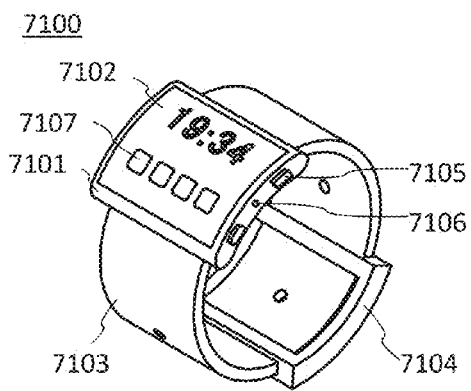

FIG. 22B illustrates an example of a watch-type portable information terminal. A portable information terminal 7100 shown in FIG. 22B includes a housing 7101, a display portion 7102, a band 7103, a buckle 7104, an operation button 7105, an input/output terminal 7106, and the like. The portable information terminal 7100 is capable of executing a variety of applications such as mobile phone calls, e-mailing, reading and editing texts, music reproduction, Internet communication, and a computer game. The display surface of the display portion 7102 is bent, and images can be displayed on the bent display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as time setting, power ON/OFF, ON/OFF of wireless communication, setting and cancellation of silent mode, and setting and cancellation of power saving mode can be performed. For example, the functions of the operation button 7105 can be set freely by the operating system incorporated in the portable information terminal 7100. The portable information terminal 7100 can employ near field communication that is a communication method based on an existing communication standard. In that case, for example, mutual communication between the portable information terminal 7100 and a headset capable of wireless communication can be performed, and thus hands-free calling is possible. Moreover, the portable information terminal 7100 includes the input/output terminal 7106, and data can be directly transmitted to and received from another information terminal via a connector. Charging through the input/output terminal 7106 is possible. Note that the charging operation may be performed by wireless power feeding without using the input/output terminal 7106.

Figure 22C:
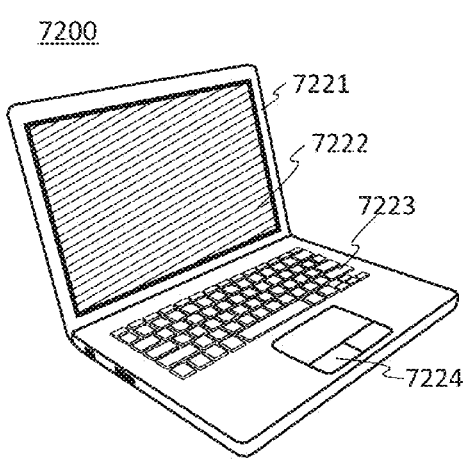

FIG. 22C illustrates a notebook personal computer (PC). A PC 7200 illustrated in FIG. 22C includes a housing 7221, a display portion 7222, a keyboard 7223, a pointing device 7224, and the like.

Figure 22D:
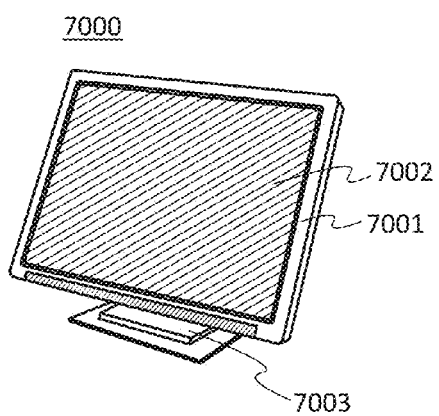

FIG. 22D illustrates a stationary display device. A display device 7000 illustrated in FIG. 22D includes a housing 7001, a display portion 7002, a support base 7003, and the like.

Figure 22E:
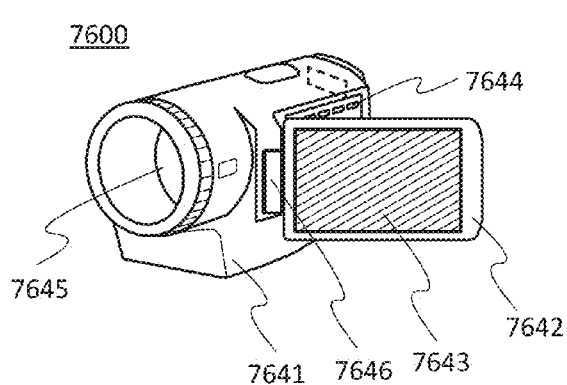

FIG. 22E illustrates a video camera 7600, which includes a first housing 7641, a second housing 7642, a display portion 7643, operation keys 7644, a lens 7645, a joint 7646, and the like.

Figure 22F:
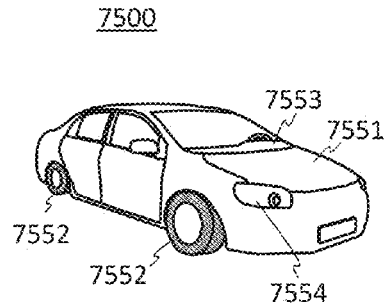

FIG. 22F illustrates a car 7500, which includes a car body 7551, wheels 7552, a dashboard 7553, lights 7554, and the like.

In the case where the display portion of the above-described electronic device includes a large number of pixels represented by 4K or 8K, for example, the electronic device preferably includes the receiver which is one embodiment of the present invention. The electronic device including the receiver which is one embodiment of the present invention can receive and display an image at high speed with low power consumption.

This embodiment can be combined with any of the other embodiments in this specification as appropriate.

Embodiment 4

Described in this embodiment are transistors of one embodiment of the disclosed invention.

A transistor in one embodiment of the present invention preferably includes an nc-OS or a CAAC-OS, which is described in Embodiment 5.

Structure Example 1 of Transistor

Figure 23A:
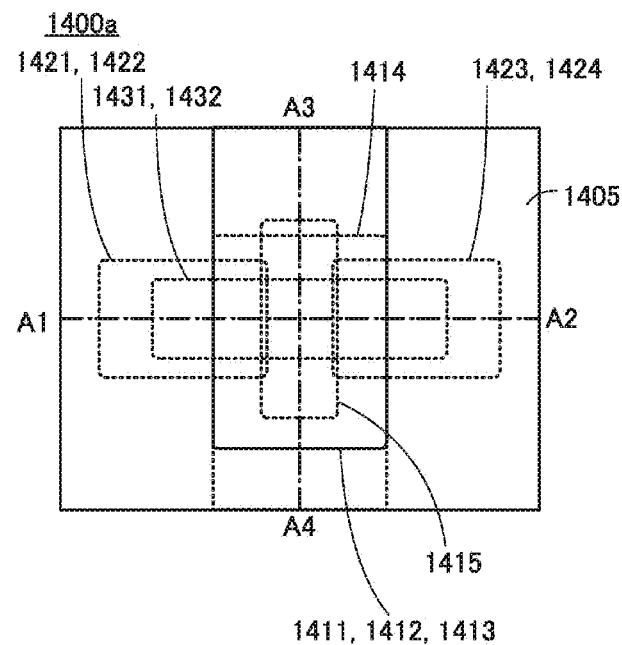
FIGS. 23A to 23C are a top view and cross-sectional views illustrating a structure example of a transistor.
Figure 23B:
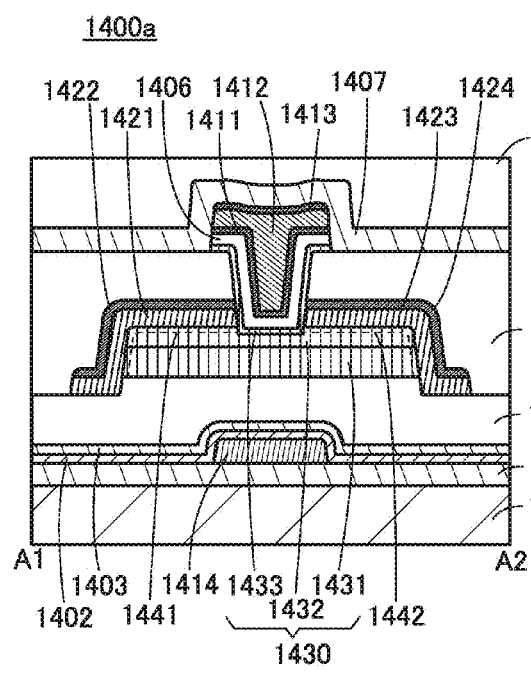
Figure 23C:
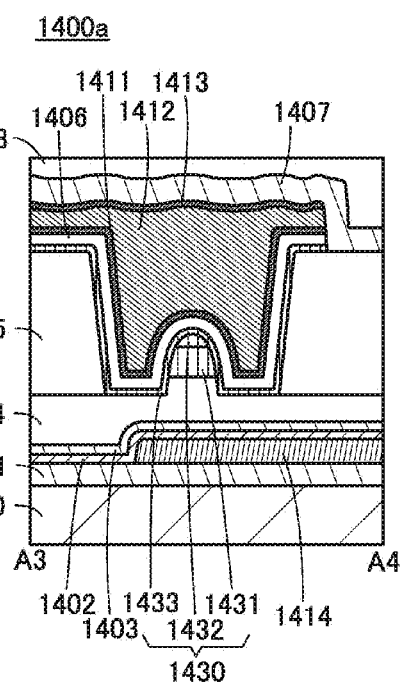

FIGS. 23A to 23C are a top view and cross-sectional views of a transistor 1400a. FIG. 23A is a top view. FIG. 23B is a cross-sectional view taken along dashed-dotted line A1-A2 in FIG. 23A and FIG. 23C is a cross-sectional view taken along dashed-dotted line A3-A4 in FIG. 23A. Note that for simplification of the drawing, some components are not illustrated in the top view in FIG. 23A. Note that the dashed-dotted line A1-A2 and the dashed-dotted line A3-A4 are sometimes referred to as a channel length direction of the transistor 1400a and a channel width direction of the transistor 1400a, respectively.

The transistor 1400a includes a substrate 1450, an insulating film 1401 over the substrate 1450, a conductive film 1414 over the insulating film 1401, an insulating film 1402 covering the conductive film 1414, an insulating film 1403 over the insulating film 1402, an insulating film 1404 over the insulating film 1403, a metal oxide 1431 and a metal oxide 1432 which are stacked in this order over the insulating film 1404, a conductive film 1421 in contact with top and side surfaces of the metal oxide 1432, a conductive film 1423 also in contact with the top and side surfaces of the metal oxide 1432, a conductive film 1422 over the conductive film 1421, a conductive film 1424 over the conductive film 1423, an insulating film 1405 over the conductive films 1422 and 1424, a metal oxide 1433 in contact with the metal oxides 1431 and 1432, the conductive films 1421 to 1424, and the insulating film 1405, an insulating film 1406 over the metal oxide 1433, a conductive film 1411 over the insulating film 1406, a conductive film 1412 over the conductive film 1411, a conductive film 1413 over the conductive film 1412, an insulating film 1407 covering the conductive film 1413, and an insulating film 1408 over the insulating film 1407. Note that the metal oxides 1431 to 1433 are collectively referred to as a metal oxide 1430.

The metal oxide 1432 is a semiconductor and serves as a channel of the transistor 1400a.

Furthermore, the metal oxides 1431 and 1432 include a region 1441 and a region 1442. The region 1441 is formed in the vicinity of a region where the conductive film 1421 is in contact with the metal oxides 1431 and 1432. The region 1442 is formed in the vicinity of a region where the conductive film 1423 is in contact with the metal oxides 1431 and 1432.

The regions 1441 and 1442 serve as low-resistance regions. The region 1441 contributes to a decrease in the contact resistance between the conductive film 1421 and the metal oxides 1431 and 1432. The region 1442 also contributes to a decrease in the contact resistance between the conductive film 1423 and the metal oxides 1431 and 1432.

The conductive films 1421 and 1422 serve as one of source and drain electrodes of the transistor 1400a. The conductive films 1423 and 1424 serve as the other of the source and drain electrodes of the transistor 1400a.

The conductive film 1422 is configured to allow less oxygen to pass therethrough than the conductive film 1421. It is thus possible to prevent a decrease in the conductivity of the conductive film 1421 due to oxidation.

The conductive film 1424 is also configured to allow less oxygen to pass therethrough than the conductive film 1423. It is thus possible to prevent a decrease in the conductivity of the conductive film 1423 due to oxidation.

The conductive films 1411 to 1413 serve as a first gate electrode of the transistor 1400a.

The conductive films 1411 and 1413 are configured to allow less oxygen to pass therethrough than the conductive film 1412. It is thus possible to prevent a decrease in the conductivity of the conductive film 1412 due to oxidation.

The insulating film 1406 serves as a first gate insulating film of the transistor 1400a.

The conductive film 1414 serves as a second gate electrode of the transistor 1400a.

The potential applied to the conductive films 1411 to 1413 may be the same as or different from that applied to the conductive film 1414. The conductive film 1414 may be omitted in some cases.

The insulating films 1401 to 1404 serve as a base insulating film of the transistor 1400a. The insulating films 1402 to 1404 also serve as a second gate insulating film of the transistor 1400a.

The insulating films 1405 to 1408 serve as a protective insulating film or an interlayer insulating film of the transistor 1400a.

As shown in FIG. 23C, the side surface of the metal oxide 1432 is surrounded by the conductive film 1411. With this structure, the metal oxide 1432 can be electrically surrounded by an electric field of the conductive film 1411. A structure in which a semiconductor is electrically surrounded by an electric field of a gate electrode is referred to as a surrounded channel (s-channel) structure. With such a structure, a channel is formed in the entire metal oxide 1432 (bulk). In the s-channel structure, a large amount of current can flow between a source and a drain of a transistor, increasing the on-state current of the transistor.

The s-channel structure, because of its high on-state current, is suitable for a semiconductor device such as large-scale integration (LSI) which requires a miniaturized transistor. A semiconductor device including the miniaturized transistor can have a high integration degree and high density.

In the transistor 1400a, a region serving as a gate electrode is formed so as to fill an opening 1415 formed in the insulating film 1405 or the like, that is, it is formed in a self-aligned manner.

As shown in FIG. 23B, the conductive films 1411 and 1422 have a region where they overlap with each other with the insulating film positioned therebetween. The conductive films 1411 and 1423 also have a region where they overlap with each other with the insulating film positioned therebetween. These regions serve as the parasitic capacitance caused between the gate electrode and the source or drain electrode and might decrease the operation speed of the transistor 1400a. This parasitic capacitance can be reduced by providing the insulating film 1405 in the transistor 1400a. The insulating film 1405 preferably contains a material with a low relative dielectric constant.

Figure 24A:
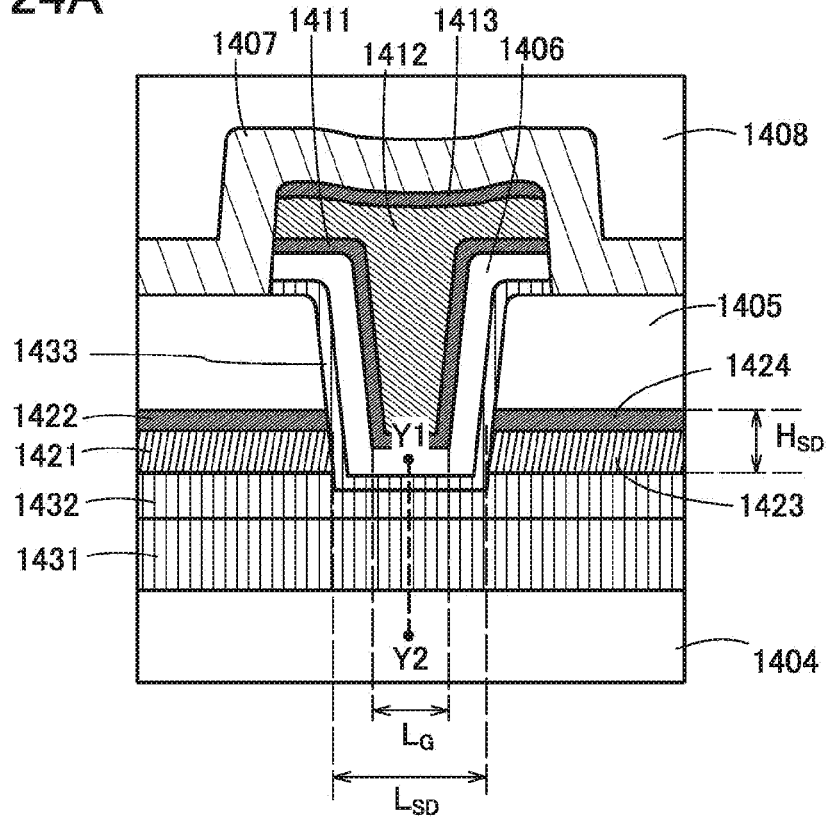
FIGS. 24A and 24B are a cross-sectional view and an energy band diagram, respectively, illustrating a structure example of a transistor.

FIG. 24A is an enlarged view of the center of the transistor 1400a. In FIG. 24A, a width $L_G$ denotes the length of the bottom surface of the conductive film 1411, which faces parallel to the top surface of the metal oxide 1432 with the insulating film 1406 and the metal oxide 1433 positioned therebetween. The width $L_G$ is the line width of the gate electrode. In FIG. 24A, a width $L_{SD}$ indicates the length between the conductive films 1421 and 1423. The width $L_{SD}$ is the length between the source electrode and the drain electrode.

The width $L_{SD}$ is generally determined by the minimum feature size. As shown in FIG. 24A, the width $L_G$ is narrower than the width $L_{SD}$. This means that in the transistor 1400a, the line width of the gate electrode can be made narrower than the minimum feature size; specifically, the width $L_G$ can be greater than or equal to 5 nm and less than or equal to 60 nm, preferably greater than or equal to 5 nm and less than or equal to 30 nm.

In FIG. 24A, a height $H_{SD}$ denotes the total thickness of the conductive films 1421 and 1422, or the total thickness of the conductive films 1423 and 1424.

The thickness of the insulating film 1406 is preferably less than or equal to the height $H_{SD}$, in which case the electric field of the gate electrode can be applied to the entire channel formation region. The thickness of the insulating film 1406 is less than or equal to 30 nm, preferably less than or equal to 10 nm.

The parasitic capacitance between the conductive films 1422 and 1411 and the parasitic capacitance between the conductive films 1424 and 1411 are inversely proportional to the thickness of the insulating film 1405. For example, the thickness of the insulating film 1405 is preferably three times or more, and further preferably five times or more the thickness of the insulating film 1406, in which case the parasitic capacitance is negligibly small. As a result, the transistor 1400a can operate at high frequencies.

Components of the transistor 1400a will be described below.

<<Metal Oxide Layer>>

First, a metal oxide that can be used as the metal oxides 1431 to 1433 will be described.

The transistor 1400a preferably has a low current (off-state current) flowing between a source and a drain in the non-conduction state. Examples of the transistor with a low off-state current include a transistor including an oxide semiconductor in a channel formation region.

The metal oxide 1432 is an oxide semiconductor containing indium (In), for example. The metal oxide 1432 can have high carrier mobility (electron mobility) by containing indium, for example. The metal oxide 1432 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and the like. Note that two or more of the above elements may be used in combination as the element M. The element M is an element having a high bonding energy with oxygen, for example. The element M is an element whose bonding energy with oxygen is higher than that of indium, for example. The element M is an element that can increase the energy gap of the metal oxide, for example. Furthermore, the metal oxide 1432 preferably contains zinc (Zn). When containing zinc, the metal oxide is easily crystallized in some cases.

Note that the metal oxide 1432 is not limited to the oxide semiconductor containing indium. The metal oxide 1432 may be an oxide semiconductor that does not contain indium and contains at least one of zinc, gallium, and tin (e.g., a zinc tin oxide or a gallium tin oxide) or the like.

For the metal oxide 1432, an oxide semiconductor with a wide energy gap is used, for example. The energy gap of the metal oxide 1432 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The metal oxide 1432 is preferably a CAAC-OS film which is described later.

The metal oxides 1431 and 1433 include, for example, one or more elements other than oxygen included in the metal oxide 1432. Since the metal oxides 1431 and 1433 include one or more elements other than oxygen included in the metal oxide 1432, an interface state is less likely to be formed at an interface between the metal oxides 1431 and 1432 and an interface between the metal oxides 1432 and 1433.

In the case of using an In-M-Zn oxide as the metal oxide 1431, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the metal oxide 1431 is formed by a sputtering method, a sputtering target with an atomic ratio of In:M:Zn=1:3:2, 1:3:4, or the like can be used.

In the case of using an In-M-Zn oxide as the metal oxide 1432, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide 1432 is formed by a sputtering method, a sputtering target with an atomic ratio of In:M:Zn=1:1:1, 1:1:1.2, 2:1:3, 3:1:2, 4:2:4.1, or the like can be used. In particular, when a sputtering target with an atomic ratio of In to Ga and Zn of 4:2:4.1 is used, the atomic ratio of In to Ga and Zn in the metal oxide 1432 may be 4:2:3 or in the neighborhood of 4:2:3.

In the case of using an In-M-Zn oxide as the metal oxide 1433, when the total proportion of In and M is assumed to be 100 atomic %, the proportions of In and Mare preferably set to be lower than 50 atomic % and higher than 50 atomic %, respectively, more preferably lower than 25 atomic % and higher than 75 atomic %, respectively. For example, In:M:Zn is preferably 1:3:2 or 1:3:4. The metal oxide 1433 may be a metal oxide that is the same type as that of the metal oxide 1431.

The metal oxide 1431 or the metal oxide 1433 does not necessarily contain indium in some cases. For example, the metal oxide 1431 or the metal oxide 1433 may be gallium oxide.

Figure 24B:
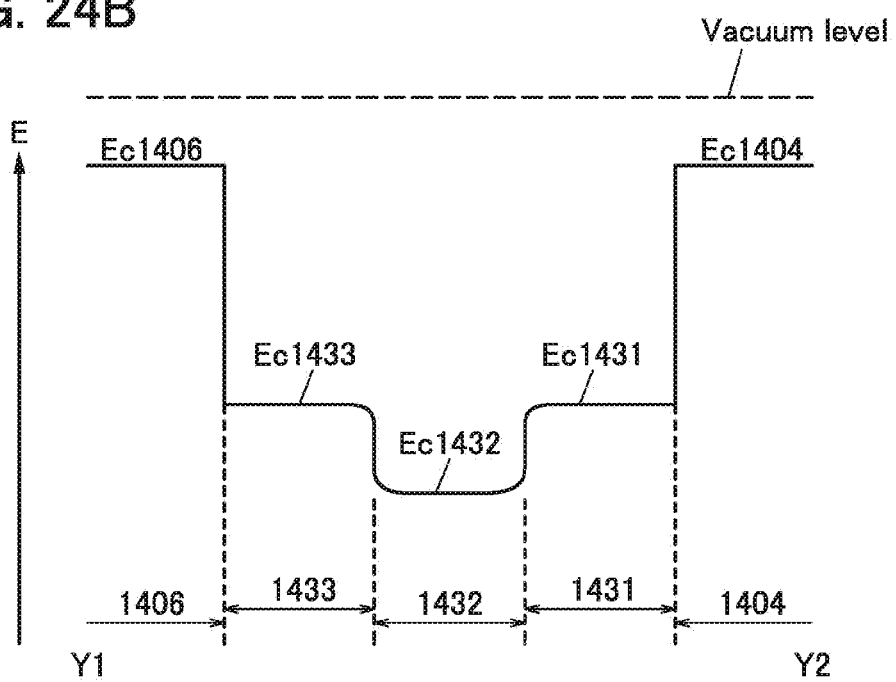

The function and effect of the metal oxide 1430, which includes a stack of the metal oxides 1431 to 1433, are described with reference to the energy band diagram of FIG. 24B. FIG. 24B shows an energy band structure of a portion taken along dashed line Y1-Y2 in FIG. 24A, that is, FIG. 24B shows the energy band structure of a channel formation region of the transistor 1400a and the vicinity thereof.

In FIG. 24B, Ec1404, Ec1431, Ec1432, Ec1433, and Ec1406 indicate the energy at the bottom of the conduction band of the insulating film 1404, the metal oxide 1431, the metal oxide 1432, the metal oxide 1433, and the insulating film 1406, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulating films 1404 and 1406 are insulators, Ec1406 and Ec1404 are closer to the vacuum level (i.e., have a lower electron affinity) than Ec1431, Ec1432, and Ec1433.

The metal oxide 1432 is a metal oxide having higher electron affinity than those of the metal oxides 1431 and 1433. For example, as the metal oxide 1432, a metal oxide having an electron affinity higher than those of the metal oxides 1431 and 1433 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

An indium gallium oxide has a small electron affinity and a high oxygen-blocking property. Therefore, the metal oxide 1433 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when gate voltage is applied, a channel is formed in the metal oxide 1432 having the highest electron affinity among the metal oxides 1431 to 1433.

Therefore, electrons move mainly in the metal oxide 1432, not in the metal oxides 1431 and 1433. Hence, the on-state current of the transistor hardly varies even when the interface state density, which inhibits electron movement, is high at the interface between the metal oxide 1431 and the insulating film 1404 or at the interface between the metal oxide 1433 and the insulating film 1406. The metal oxides 1431 and 1433 have a function as an insulating film.

In some cases, there is a mixed region of the metal oxides 1431 and 1432 between the metal oxides 1431 and 1432. Furthermore, in some cases, there is a mixed region of the metal oxides 1432 and 1433 between the metal oxides 1432 and 1433. Because the mixed region has a low interface state density, a stack of the metal oxides 1431 to 1433 has a band structure where energy at each interface and in the vicinity of the interface is changed continuously (continuous junction).

As described above, the interface between the metal oxides 1431 and 1432 or the interface between the metal oxides 1432 and 1433 has a low interface state density. Hence, electron movement in the metal oxide 1432 is less likely to be inhibited and the on-state current of the transistor can be increased.

Electron movement in the transistor is inhibited, for example, in the case where physical unevenness in a channel formation region is large. To increase the on-state current of the transistor, for example, root mean square (RMS) roughness with a measurement area of 1 μm×1 μm of a top surface or a bottom surface of the metal oxide 1432 (a formation surface; here, the top surface of the metal oxide 1431) is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference in height (P-V) with the measurement area of 1 μm×1 μm is less than 10 nm, preferably less than 9 nm, more preferably less than 8 nm, still more preferably less than 7 nm. RMS roughness, Ra, and P-V can be measured using a scanning probe microscope SPA-500 manufactured by SII Nano Technology Inc.

The electron movement is also inhibited, for example, in the case where the density of defect states is high in a region where a channel is formed. For example, in the case where the metal oxide 1432 contains oxygen vacancies (Vo), donor levels are formed by entry of hydrogen into sites of oxygen vacancies in some cases. A state in which hydrogen enters sites of oxygen vacancies is denoted by VoH in the following description in some cases. VoH is a factor of decreasing the on-state current of the transistor because VoH scatters electrons. Note that sites of oxygen vacancies become more stable by entry of oxygen than by entry of hydrogen. Thus, by decreasing oxygen vacancies in the metal oxide 1432, the on-state current of the transistor can be increased in some cases.

For example, at a certain depth in the metal oxide 1432 or in a certain region of the metal oxide 1432, the concentration of hydrogen measured by secondary ion mass spectrometry (SIMS) is set to be higher than or equal to $1 \times 10^{16}$ atoms/cm$^3$ and lower than or equal to $2 \times 10^{20}$ atoms/cm$^3$, preferably higher than or equal to $1 \times 10^{16}$ atoms/cm$^3$ and lower than or equal to $5 \times 10^{19}$ atoms/cm$^3$, more preferably higher than or equal to $1 \times 10^{16}$ atoms/cm$^3$ and lower than or equal to $1 \times 10^{19}$ atoms/cm$^3$, still more preferably higher than or equal to $1 \times 10^{16}$ atoms/cm$^3$ and lower than or equal to $5 \times 10^{18}$ atoms/cm$^3$.

To decrease oxygen vacancies in the metal oxide 1432, for example, there is a method in which excess oxygen contained in the insulating film 1404 is moved to the metal oxide 1432 through the metal oxide 1431. In that case, the metal oxide 1431 is preferably a layer having an oxygen-transmitting property (a layer through which oxygen passes or is transmitted).

Note that in the case where the transistor has an s-channel structure, a channel is formed in the entire metal oxide 1432. Therefore, as the metal oxide 1432 has larger thickness, a channel region becomes larger. In other words, the thicker the metal oxide 1432 is, the larger the on-state current of the transistor is.

Moreover, the thickness of the metal oxide 1433 is preferably as small as possible to increase the on-state current of the transistor. For example, the metal oxide 1433 has a region with a thickness of less than 10 nm, preferably less than or equal to 5 nm, more preferably less than or equal to 3 nm. Meanwhile, the metal oxide 1433 has a function of blocking entry of elements other than oxygen (such as hydrogen and silicon) included in the adjacent insulator into the metal oxide 1432 where a channel is formed. Thus, the metal oxide 1433 preferably has a certain thickness. For example, the metal oxide 1433 may have a region with a thickness of greater than or equal to 0.3 nm, preferably greater than or equal to 1 nm, more preferably greater than or equal to 2 nm. The metal oxide 1433 preferably has an oxygen blocking property to inhibit outward diffusion of oxygen released from the insulating film 1404 and the like.

To improve reliability, preferably, the thickness of the metal oxide 1431 is large and the thickness of the metal oxide 1433 is small. For example, the metal oxide 1431 has a region with a thickness of greater than or equal to 10 nm, preferably greater than or equal to 20 nm, more preferably greater than or equal to 40 nm, still more preferably greater than or equal to 60 nm. An increase in the thickness of the metal oxide 1431 can increase the distance from the interface between the adjacent insulator and the metal oxide 1431 to the metal oxide 1432 where a channel is formed. Note that the metal oxide 1431 has a region with a thickness of, for example, less than or equal to 200 nm, preferably less than or equal to 120 nm, more preferably less than or equal to 80 nm, otherwise the productivity of the semiconductor device might be decreased.

For example, a region in which the concentration of silicon is higher than or equal to $1 \times 10^{16}$ atoms/cm$^3$ and lower than $1 \times 10^{19}$ atoms/cm$^3$ is provided between the metal oxides 1432 and 1431. The concentration of silicon is preferably higher than or equal to $1 \times 10^{16}$ atoms/cm$^3$ and lower than $5 \times 10^{18}$ atoms/cm$^3$, more preferably higher than or equal to $1 \times 10^{16}$ atoms/cm$^3$ and lower than $2 \times 10^{18}$ atoms/cm$^3$. A region in which the concentration of silicon is higher than or equal to $1 \times 10^{16}$ atoms/cm$^3$ and lower than $1 \times 10^{19}$ atoms/cm$^3$ is provided between the metal oxides 1432 and 1433. The concentration of silicon is preferably higher than or equal to $1 \times 10^{16}$ atoms/cm$^3$ and lower than $5 \times 10^{18}$ atoms/cm$^3$, more preferably higher than or equal to $1 \times 10^{16}$ atoms/cm$^3$ and lower than $2 \times 10^{18}$ atoms/cm$^3$. The concentration of silicon can be measured by SIMS.

It is preferable to reduce the concentration of hydrogen in the metal oxides 1431 and 1433 in order to reduce the concentration of hydrogen in the metal oxide 1432. The metal oxides 1431 and 1433 each have a region in which the concentration of hydrogen is higher than or equal to $1 \times 10^{16}$ atoms/cm$^3$ and lower than or equal to $2 \times 10^{20}$ atoms/cm$^3$. The concentration of hydrogen is preferably higher than or equal to $1 \times 10^{16}$ atoms/cm$^3$ and lower than or equal to $5 \times 10^{19}$ atoms/cm$^3$, more preferably higher than or equal to $1 \times 10^{16}$ atoms/cm$^3$ and lower than or equal to $1 \times 10^{19}$ atoms/cm$^3$, still more preferably higher than or equal to $1 \times 10^{16}$ atoms/cm$^3$ and lower than or equal to $5 \times 10^{18}$ atoms/cm$^3$. The concentration of hydrogen can be measured by SIMS. It is also preferable to reduce the concentration of nitrogen in the metal oxides 1431 and 1433 in order to reduce the concentration of nitrogen in the metal oxide 1432. The metal oxides 1431 and 1433 each have a region in which the concentration of nitrogen is higher than or equal to $1 \times 10^{16}$ atoms/cm$^3$ and lower than $5 \times 10^{19}$ atoms/cm$^3$. The concentration of nitrogen is preferably higher than or equal to $1 \times 10^{16}$ atoms/cm$^3$ and lower than or equal to $5 \times 10^{18}$ atoms/cm$^3$, more preferably higher than or equal to $1 \times 10^{16}$ atoms/cm$^3$ and lower than or equal to $1 \times 10^{18}$ atoms/cm$^3$, still more preferably higher than or equal to $1 \times 10^{16}$ atoms/cm$^3$ and lower than or equal to $5 \times 10^{17}$ atoms/cm$^3$. The concentration of nitrogen can be measured by SIMS.

The metal oxides 1431 to 1433 may be formed by a sputtering method, a chemical vapor deposition (CVD) method, a molecular beam epitaxy (MBE) method, a pulsed laser deposition (PLD) method, an atomic layer deposition (ALD) method, or the like.

After the metal oxides 1431 and 1432 are formed, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The crystallinity of the metal oxides 1431 and 1432 can be increased by the first heat treatment. Furthermore, impurities such as hydrogen and water can be removed by the first heat treatment.

The above three-layer structure is an example. For example, a two-layer structure without one of the metal oxides 1431 and 1433 may be employed.

Alternatively, any one of semiconductors illustrated as the metal oxides 1431 to 1433 may be additionally provided over or under the metal oxide 1431 or over or under the metal oxide 1433, i.e., a four-layer structure may be employed. Further alternatively, an n-layer structure (n is an integer number of 5 or more) in which any one of semiconductors illustrated as the metal oxides 1431 to 1433 is additionally provided at two or more of the following positions may be employed: over the metal oxide 1431, under the metal oxide 1431, over the metal oxide 1433, and under the metal oxide 1433.

<<Substrate>>

As the substrate 1450, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. A semiconductor substrate in which an insulator region is provided in the above semiconductor substrate, e.g., a silicon on insulator (SOI) substrate or the like can also be used. As the conductor substrate, a graphite substrate, a metal substrate, an alloy substrate, a conductive resin substrate, or the like is used. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can also be used. Alternatively, any of these substrates over which an element is provided may be used. Examples of the element provided over the substrate include a capacitor, a resistor, a switching element, a light-emitting element, a memory element, and the like.

A flexible substrate may be used as the substrate 1450. As a method for providing a transistor over a flexible substrate, there is a method in which a transistor is formed over a non-flexible substrate, and then the transistor is separated and transferred to the substrate 1450 which is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate 1450 has a small thickness, the weight of the semiconductor device can be reduced. When the substrate 1450 has a small thickness, even in the case of using glass or the like, the substrate 1450 may have elasticity or a property of returning to its original shape when bending or pulling is stopped. Therefore, an impact applied to the semiconductor device over the substrate 1450, which is caused by dropping or the like, can be reduced. That is, a durable semiconductor device can be provided.

For the flexible substrate 1450, metal, an alloy, a resin, glass, or fiber thereof can be used, for example. The flexible substrate 1450 preferably has a lower coefficient of linear expansion because deformation due to an environment can be suppressed. The flexible substrate 1450 is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

<<Base Insulating Film>>

The insulating film 1401 has a function of electrically isolating the substrate 1450 from the conductive film 1414.

The insulating film 1401 or 1402 is formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 1402 may be formed using silicon oxide with high step coverage which is formed by reacting tetraethyl orthosilicate (TEOS), silane, or the like with oxygen, nitrous oxide, or the like.

After the insulating film 1402 is formed, the insulating film 1402 may be subjected to planarization treatment using a CMP method or the like to improve the planarity of the top surface thereof.

The insulating film 1404 preferably contains an oxide. In particular, the insulating film 1404 preferably contains an oxide material from which part of oxygen is released by heating. The insulating film 1404 preferably contains an oxide containing oxygen more than that in the stoichiometric composition. Part of oxygen is released by heating from an oxide film containing oxygen in excess of the stoichiometric composition. Oxygen released from the insulating film 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0\times10^{18}$ atoms/cm', preferably greater than or equal to $3.0\times10^{20}$ atoms/cm' in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating film 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 1404.

To make the insulating film 1404 contain excess oxygen, the insulating film 1404 is formed in an oxygen atmosphere, for example. Alternatively, a region containing excess oxygen may be formed by introducing oxygen into the insulating film 1404 that has been formed. Both the methods may be combined.

For example, oxygen (at least including any of oxygen radicals, oxygen atoms, and oxygen ions) may be introduced into the insulating film 1404 that has been formed, so that a region containing excess oxygen is formed. Oxygen can be introduced by an ion implantation method, an ion doping method, a plasma immersion ion implantation method, plasma treatment, or the like.

A gas containing oxygen can be used in an oxygen introducing method. As the gas containing oxygen, oxygen, nitrous oxide, nitrogen dioxide, carbon dioxide, carbon monoxide, and the like can be used. Further, a rare gas may be included in the gas containing oxygen for the oxygen introduction treatment. Hydrogen or the like may be included. For example, a mixed gas of carbon dioxide, hydrogen, and argon may be used.

After the insulating film 1404 is formed, the insulating film 1404 may be subjected to planarization treatment using a CMP method or the like to improve the planarity of the top surface thereof.

The insulating film 1403 has a passivation function of preventing oxygen contained in the insulating film 1404 from decreasing by bonding to metal contained in the conductive film 1414.

The insulating film 1403 has a function of blocking oxygen, hydrogen, water, alkali metal, alkaline earth metal, and the like. Providing the insulating film 1403 can prevent outward diffusion of oxygen from the metal oxide 1430 and entry of hydrogen, water, or the like into the metal oxide 1430 from the outside.

The insulating film 1403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

The threshold voltage of the transistor 1400a can be controlled by injecting electrons into a charge trap layer. The charge trap layer is preferably provided in the insulating film 1402 or the insulating film 1403. For example, when the insulating film 1403 is formed using hafnium oxide, aluminum oxide, tantalum oxide, aluminum silicate, or the like, the insulating film 1403 can function as a charge trap layer.

<<Gate Electrode>>

The conductive films 1411 to 1414 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductive film is preferably formed using a low-resistance conductive material such as aluminum or copper. The conductive film is preferably formed using a Cu—Mn alloy, since in that case, manganese oxide is formed at the interface with an insulator containing oxygen and it has a function of preventing Cu diffusion.

<<Source Electrode and Drain Electrode>>

The conductive films 1421 to 1424 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductive film is preferably formed using a low-resistance conductive material such as aluminum or copper. The conductive film is preferably formed using a Cu—Mn alloy, since in that case, manganese oxide formed at the interface with an insulator containing oxygen has a function of preventing Cu diffusion.

The conductive films 1421 to 1424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<<Low-Resistance Region>>

The regions 1441 and 1442 are formed when, for example, the conductive films 1421 and 1423 take oxygen from the metal oxides 1431 and 1432. Oxygen is more likely to be extracted as the temperature is higher. Oxygen vacancies are formed in the regions 1441 and 1442 through several heating steps in the manufacturing process of the transistor. In addition, hydrogen enters sites of the oxygen vacancies by heating, increasing the carrier concentration in the regions 1441 and 1442. As a result, the resistance of the regions 1441 and 1442 is reduced.

<<Gate Insulating Film>>

The insulating film 1406 preferably contains an insulator with a high relative dielectric constant. For example, the insulating film 1406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulating film 1406 preferably has a layered structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the layered structure to be thermally stable and have a high relative dielectric constant. For example, when aluminum oxide, gallium oxide, or hafnium oxide is closer to the metal oxide 1433, entry of silicon from silicon oxide or silicon oxynitride into the metal oxide 1432 can be suppressed.

When silicon oxide or silicon oxynitride is closer to the metal oxide 1433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<<Interlayer Insulating Film and Protective Insulating Film>>

The insulating film 1405 preferably contains an insulator with a low relative dielectric constant. For example, the insulating film 1405 preferably contains silicon oxide, silicon oxynitride, silicon nitride oxide, silicon nitride, or a resin. Alternatively, the insulating film 1405 preferably has a layered structure containing silicon oxide or silicon oxynitride and a resin. Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

The insulating film 1407 has a function of blocking oxygen, hydrogen, water, alkali metal, alkaline earth metal, and the like. Providing the insulating film 1407 can prevent outward diffusion of oxygen from the metal oxide 1430 and entry of hydrogen, water, or the like into the metal oxide 1430 from the outside.

The insulating film 1407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating film 1407 because it is highly effective in preventing transmission of both oxygen and impurities such as hydrogen and moisture.

When the insulating film 1407 is formed by a method using plasma containing oxygen, e.g., by a sputtering method or a CVD method, oxygen can be added to side and top surfaces of the insulating films 1405 and 1406. It is preferable to perform second heat treatment at any time after the formation of the insulating film 1407. Through the second heat treatment, oxygen added to the insulating films 1405 and 1406 is diffused in the insulating films to reach the metal oxide 1430, whereby oxygen vacancies in the metal oxide 1430 can be reduced.

Figure 25A:
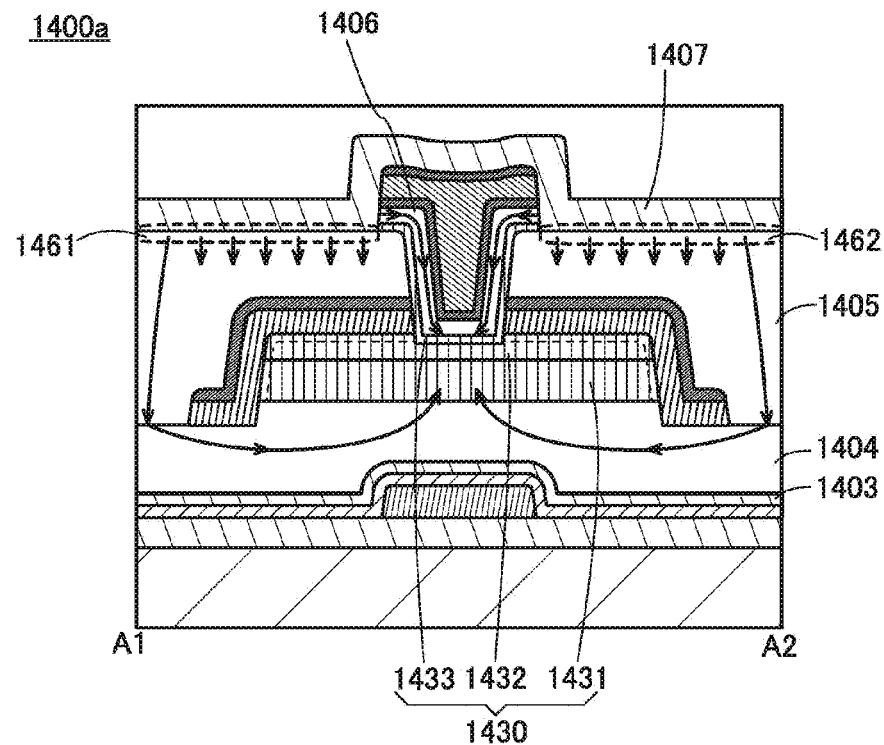
FIGS. 25A and 25B are cross-sectional views illustrating oxygen diffusion paths.
Figure 25B:
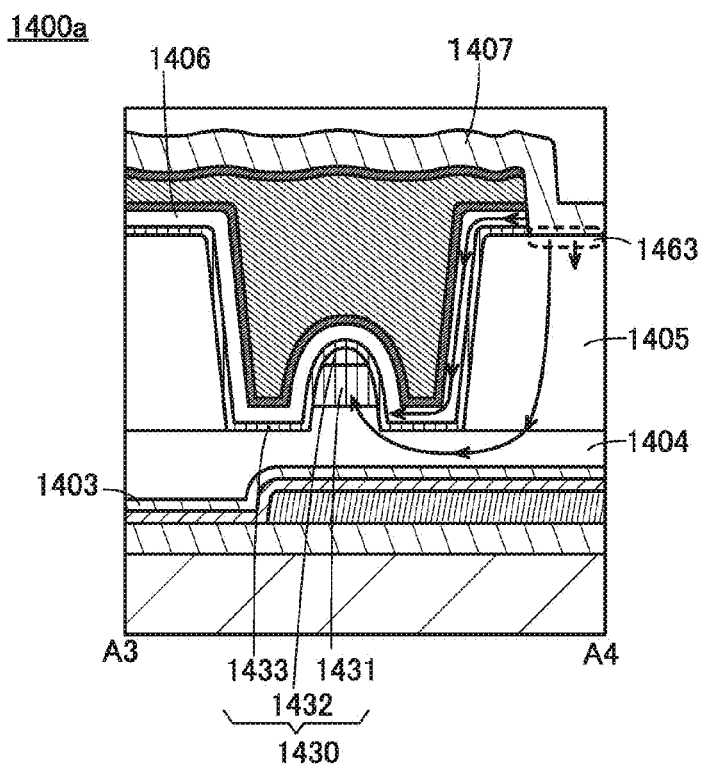

In schematic views of FIGS. 25A and 25B, oxygen added to the insulating films 1405 and 1406 in the formation of the insulating film 1407 is diffused in the insulating films through the second heat treatment and reaches the metal oxide 1430. In FIG. 25A, oxygen diffusion in the cross-sectional view of FIG. 23B is indicated by arrows. In FIG. 25B, oxygen diffusion in the cross-sectional view of FIG. 23C is indicated by arrows.

As shown in FIGS. 25A and 25B, oxygen added to the side surface of the insulating film 1406 is diffused in the insulating film 1406 and reaches the metal oxide 1430. In addition, a region 1461, a region 1462, and a region 1463 each containing excess oxygen are sometimes formed in the vicinity of the interface between the insulating films 1407 and 1405. Oxygen contained in the regions 1461 to 1463 reaches the metal oxide 1430 through the insulating films 1405 and 1404. In the case where the insulating film 1405 includes silicon oxide and the insulating film 1407 includes aluminum oxide, a mixed layer of silicon, aluminum, and oxygen is formed in the regions 1461 to 1463 in some cases.

The insulating film 1407 has a function of blocking oxygen and prevents oxygen from being diffused over the insulating film 1407. The insulating film 1403 also has a function of blocking oxygen and prevents oxygen from being diffused under the insulating film 1403.

Note that the second heat treatment may be performed at a temperature that allows oxygen added to the insulating films 1405 and 1406 to be diffused to the metal oxide 1430. For example, the description of the first heat treatment may be referred to for the second heat treatment. Alternatively, the temperature of the second heat treatment is preferably lower than that of the first heat treatment. The second heat treatment is performed at a temperature lower than that of the first heat treatment by higher than or equal to 20° C. and lower than or equal to 150° C., preferably higher than or equal to 40° C. and lower than or equal to 100° C. Accordingly, superfluous release of oxygen from the insulating film 1404 can be inhibited. Note that in the case where heating at the time of formation of the layers doubles as the second heat treatment, the second heat treatment is not necessarily performed.

As described above, oxygen can be supplied to the metal oxide 1430 from above and below through the formation of the insulating film 1407 and the second heat treatment.

Alternatively, oxygen can be added to the insulating films 1405 and 1406 by forming a film containing indium oxide, e.g., an In-M-Zn oxide, as the insulating film 1407.

The insulating film 1408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, for the insulating film 1408, a resin such as a polyimide resin, a polyamide resin, an acrylic resin, a siloxane resin, an epoxy resin, or a phenol resin can be used. The insulating film 1408 may be a stack including any of the above materials.

Structure Example 2 of Transistor

The conductive film 1414 and the insulating films 1402 and 1403 can be omitted from the transistor 1400a shown in FIGS. 23A to 23C. An example of such a structure is shown in FIGS. 26A to 26C.

FIGS. 26A to 26C are a top view and cross-sectional views of a transistor 1400b. FIG. 26A is a top view. FIG. 26B is a cross-sectional view taken along dashed-dotted line A1-A2 in FIG. 26A and FIG. 26C is a cross-sectional view taken along dashed-dotted line A3-A4 in FIG. 26A. Note that for simplification of the drawing, some components are not illustrated in the top view of FIG. 26A. Note that the dashed-dotted line A1-A2 and the dashed-dotted line A3-A4 are sometimes referred to as a channel length direction of the transistor 1400b and a channel width direction of the transistor 1400b, respectively.

Structure Example 3 of Transistor

In the transistor 1400a shown in FIGS. 23A to 23C, parts of the conductive films 1421 and 1423 that overlap with the gate electrode (the conductive films 1411 to 1413) can be reduced in thickness. An example of such a structure is shown in FIGS. 27A to 27C.

Figure 27A:
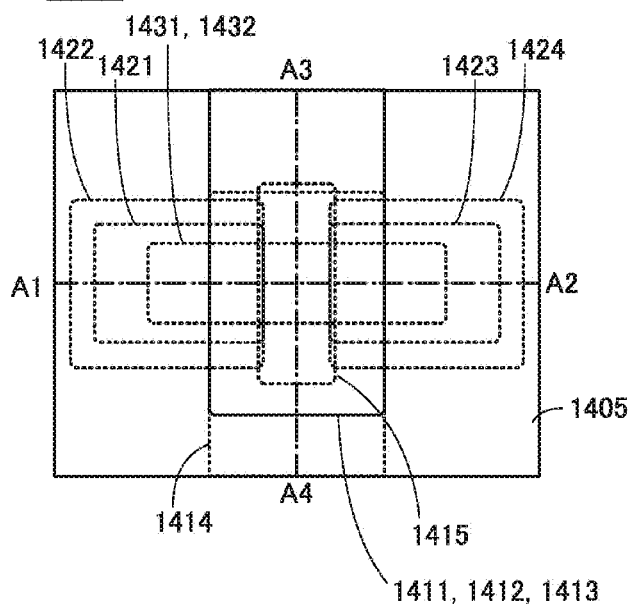
FIGS. 27A to 27C are a top view and cross-sectional views showing a structure example of a transistor.
Figure 27B:
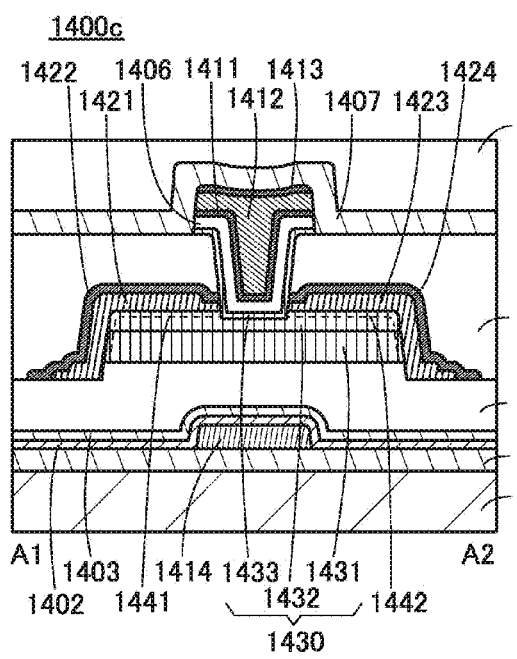
Figure 27C:
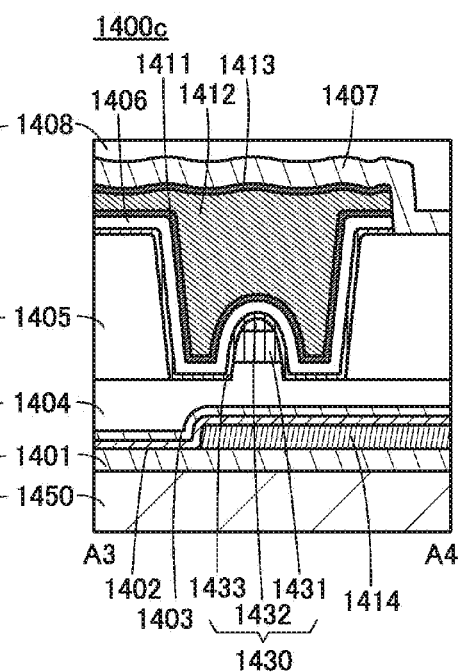

FIGS. 27A to 27C are a top view and cross-sectional views of a transistor 1400c. FIG. 27A is a top view. FIG. 27B is a cross-sectional view taken along dashed-dotted line A1-A2 in FIG. 27A and FIG. 27C is a cross-sectional view taken along dashed-dotted line A3-A4 in FIG. 27A. Note that for simplification of the drawing, some components in the top view in FIG. 27A are not illustrated. Note that the dashed-dotted line A1-A2 and the dashed-dotted line A3-A4 are sometimes referred to as a channel length direction of the transistor 1400*c* and a channel width direction of the transistor 1400*c*, respectively.

In the transistor 1400*c* shown in FIG. 27B, part of the conductive film 1421 that overlaps with the gate electrode is reduced in thickness, and the conductive film 1422 covers the conductive film 1421. Part of the conductive film 1423 that overlaps with the gate electrode is also reduced in thickness, and the conductive film 1424 covers the conductive film 1423.

The transistor 1400*c*, which has the structure shown in FIG. 27B, can have an increased distance between the gate and source electrodes or between the gate and drain electrodes. This results in a reduction in the parasitic capacitance formed between the gate electrode and the source and drain electrodes. As a result, the transistor can operate at high-speed.

Structure Example 4 of Transistor

In the transistor 1400*c* shown in FIGS. 27A to 27C, the width of the metal oxides 1431 and 1432 can be increased in the A3-A4 direction. An example of such a structure is shown in FIGS. 28A to 28C.

Figure 28A:
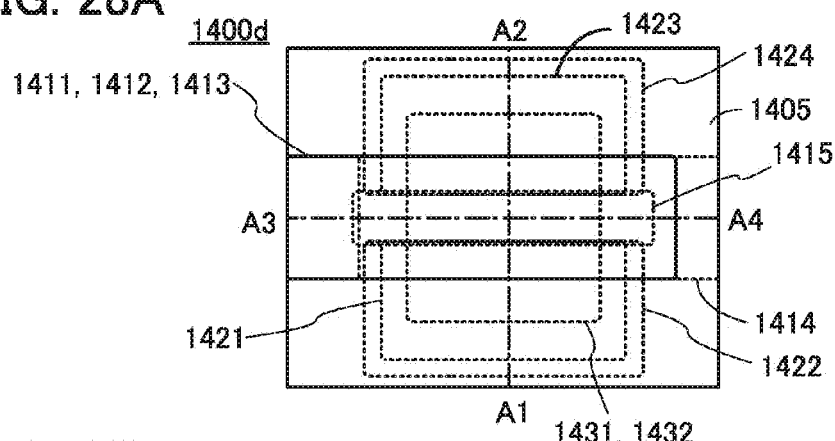
FIGS. 28A to 28C are a top view and cross-sectional views showing a structure example of a transistor.
Figure 28B:
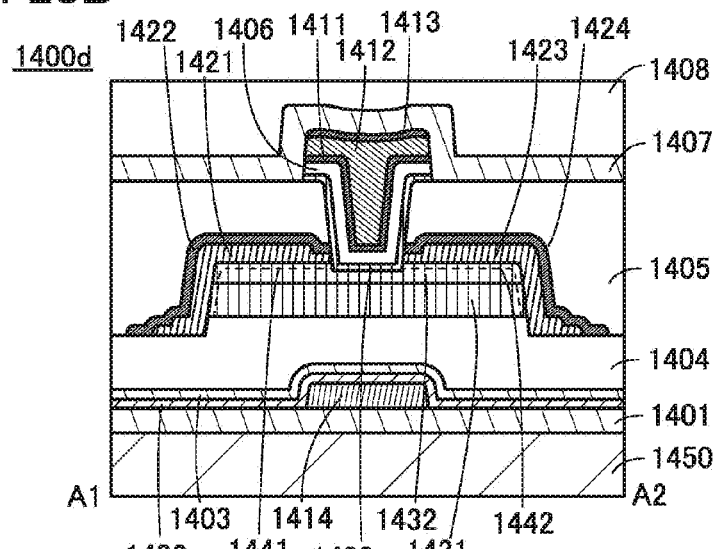
Figure 28C:
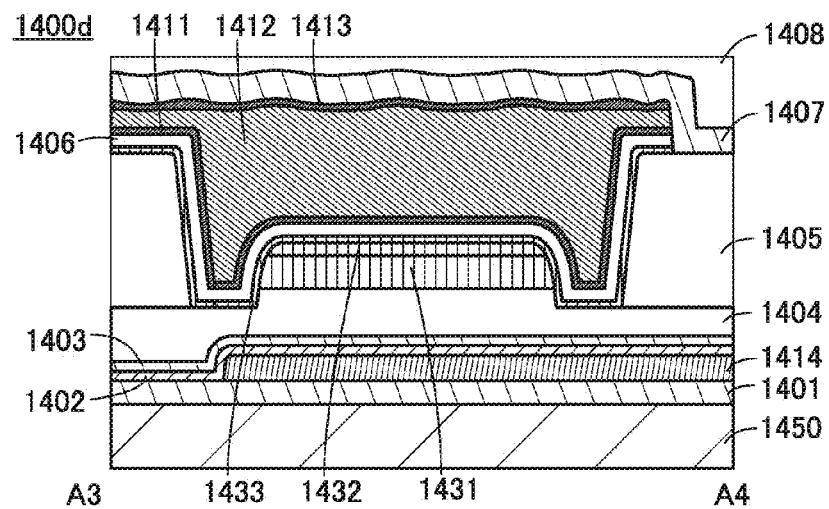

FIGS. 28A to 28C are a top view and cross-sectional views of a transistor 1400*d*. FIG. 28A is a top view. FIG. 28B is a cross-sectional view taken along dashed-dotted line A1-A2 in FIG. 28A and FIG. 28C is a cross-sectional view taken along dashed-dotted line A3-A4 in FIG. 28A. Note that for simplification of the drawing, some components are not illustrated in the top view in FIG. 28A. Note that the dashed-dotted line A1-A2 and the dashed-dotted line A3-A4 are sometimes referred to as a channel length direction of the transistor 1400*d* and a channel width direction of the transistor 1400*d*, respectively.

The transistor 1400*d*, which has the structure shown in FIGS. 28A to 28C, can have an increased on-state current.

Structure Example 5 of Transistor

In the transistor 1400*c* shown in FIGS. 27A to 27C, a plurality of regions (hereinafter referred to as fins) including the metal oxides 1431 and 1432 may be provided in the A3-A4 direction. An example of this case is shown in FIGS. 29A to 29C.

Figure 29A:
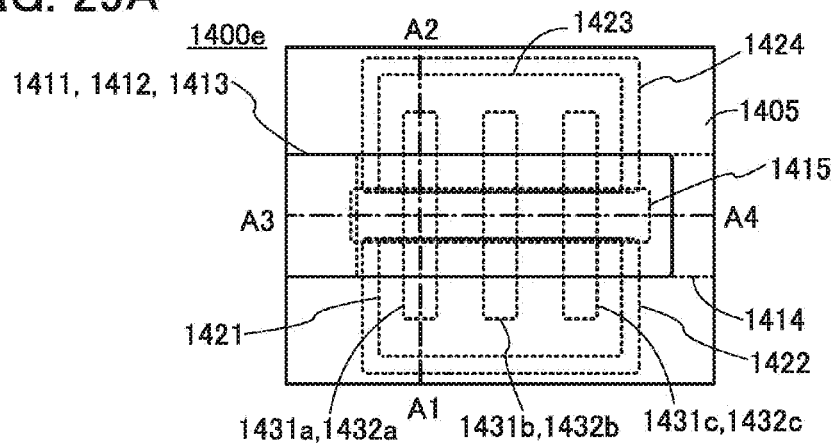
FIGS. 29A to 29C are a top view and cross-sectional views showing a structure example of a transistor.
Figure 29B:
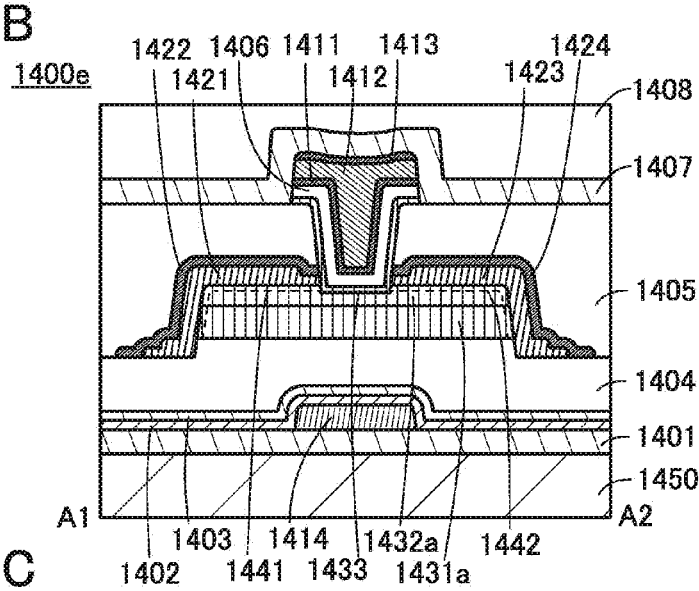
Figure 29C:
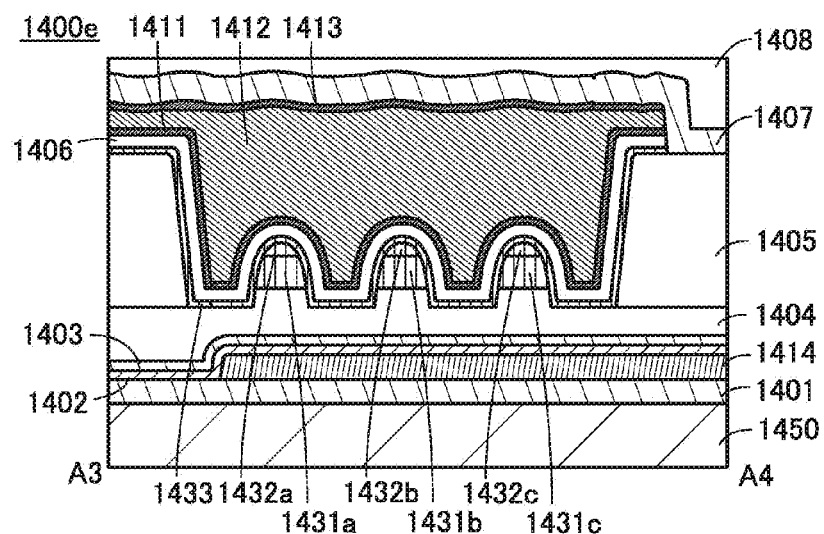

FIGS. 29A to 29C are a top view and cross-sectional views of a transistor 1400*e*. FIG. 29A is a top view. FIG. 29B is a cross-sectional view taken along dashed-dotted line A1-A2 in FIG. 29A and FIG. 29C is a cross-sectional view taken along dashed-dotted line A3-A4 in FIG. 29A. Note that for simplification of the drawing, some components are not illustrated in the top view in FIG. 29A. Note that the dashed-dotted line A1-A2 and the dashed-dotted line A3-A4 are sometimes referred to as a channel length direction of the transistor 1400*e* and a channel width direction of the transistor 1400*e*, respectively.

The transistor 1400*e* includes a first fin consisting of metal oxides 1431*a* and 1432*a*, a second fin consisting of metal oxides 1431*b* and 1432*b*, and a third fin consisting of metal oxides 1431*c* and 1432*c*.

In the transistor 1400*e*, the metal oxides 1432*a* to 1432*c* where a channel is formed are surrounded by the gate electrode. Hence, a gate electric field can be applied to the entire channel, so that the transistor can have a high on-state current.

Structure Example 6 of Transistor

Figure 30A:
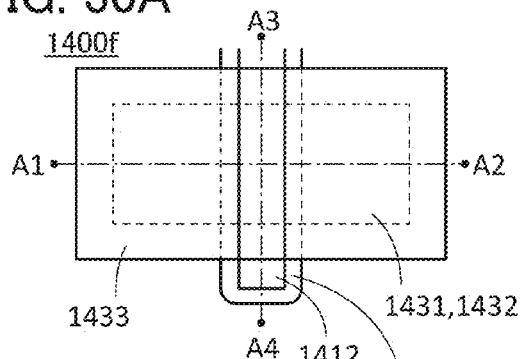
FIGS. 30A to 30D are a top view and cross-sectional views showing a structure example of a transistor.
Figure 30B:
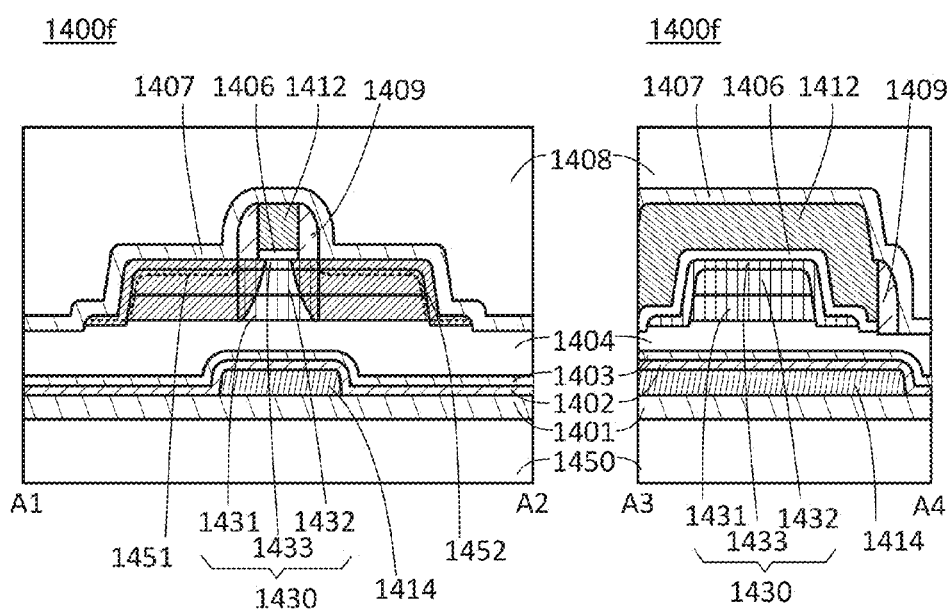
Figure 30C:
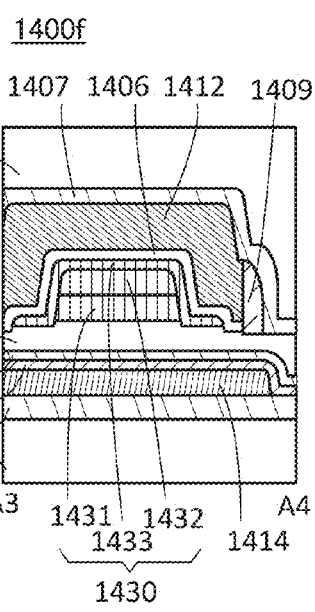

FIGS. 30A to 30D are a top view and cross-sectional views of a transistor 1400*f*. FIG. 30A is a top view of the transistor 1400*f*. FIG. 30B is a cross-sectional view taken along dashed-dotted line A1-A2 in FIG. 30A and FIG. 30C is a cross-sectional view taken along dashed-dotted line A3-A4 in FIG. 30A. Note that the dashed-dotted line A1-A2 and the dashed-dotted line A3-A4 are sometimes referred to as a channel length direction and a channel width direction, respectively. The transistor 1400*f* has the s-channel structure like the transistor 1400*a* and the like. In the transistor 1400*f*, an insulating film 1409 is provided in contact with the side surface of the conductive film 1412 used as a gate electrode. The insulating film 1409 and the conductive film 1412 are covered with the insulating film 1408. The insulating film 1409 serves as a sidewall insulating film of the transistor 1400*f*. As in the transistor 1400*a*, the gate electrode may be a stack of the conductive films 1411 to 1413.

The insulating film 1406 and the conductive film 1412 overlap with the conductive film 1414 and the metal oxide 1432 at least partly. The side edge of the conductive film 1412 in the channel length direction is preferably approximately aligned with the side edge of the insulating film 1406 in the channel length direction. Here, the insulating film 1406 serves as a gate insulating film of the transistor 1400*f*, the conductive film 1412 serves as a gate electrode of the transistor 1400*f*, and the insulating film 1409 serves as a sidewall insulating film of the transistor 1400*f*.

The metal oxide 1432 has a region that overlaps with the conductive film 1412 with the metal oxide 1433 and the insulating film 1406 positioned therebetween. Preferably, the outer edge of the metal oxide 1431 is approximately aligned with the outer edge of the metal oxide 1432, and the outer edge of the metal oxide 1433 is outside of the outer edges of the metal oxides 1431 and 1432. However, the shape of the transistor in this embodiment is not limited to the shape where the outer edge of the metal oxide 1433 is outside of the outer edge of the metal oxide 1431. For example, the outer edge of the metal oxide 1431 may be outside of the outer edge of the metal oxide 1433, or the side edge of the metal oxide 1431 may be approximately aligned with the side edge of the metal oxide 1433.

Figure 30D:
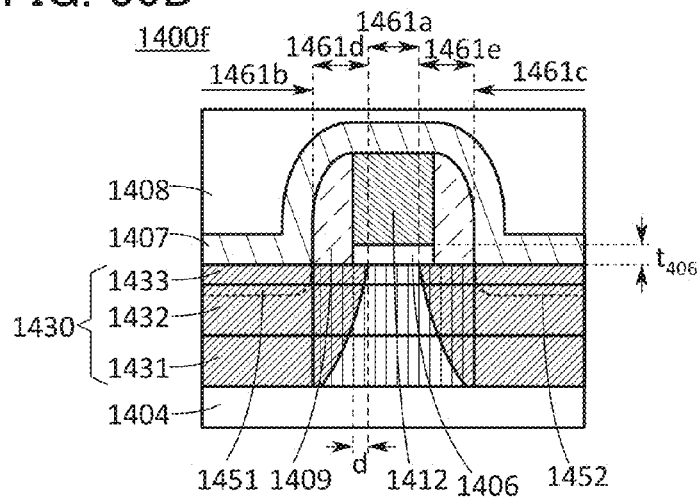

FIG. 30D is an enlarged view of part of FIG. 30B. As shown in FIG. 30D, regions 1461*a* to 1461*e* are formed in the metal oxide 1430. The regions 1461*b* to 1461*e* have a higher concentration of dopant and therefore have a lower resistance than the region 1461*a*. Furthermore, the regions 1461*b* and 1461*c* have a higher concentration of hydrogen and therefore have an even lower resistance than the regions 1461*d* and 1461*e*. The concentration of a dopant in the region 1461*a* is, for example, less than or equal to 5%, less than or equal to 2%, or less than or equal to 1% of the maximum concentration of a dopant in the region 1461*b* or 1461*c*. Note that the dopant may be rephrased as a donor, an acceptor, an impurity, or an element.

As shown in FIG. 30D, in the metal oxide 1430, the region 1461*a* substantially overlaps with the conductive film 1412, and the regions 1461*b* to 1461*e* are the regions other than the region 1461*a*. In the regions 1461*b* and 1461*c*, the top surface of the metal oxide 1433 is in contact with the insulating film 1407. In the regions 1461*d* and 1461*e*, the top surface of the metal oxide 1433 is in contact with the insulating film 1409 or 1406. That is, as shown in FIG. 30D, the boundary between the regions 1461*b* and 1461*d* overlaps with the boundary between the side edges of the insulating films 1407 and 1409. The same applies to the boundary between the regions 1461c and 1461e. Here, part of the regions 1461d and 1461e preferably overlaps with part of a region (a channel formation region) of the metal oxide 1432 that overlaps with the conductive film 1412. For example, preferably, the side edges of the regions 1461d and 1461e in the channel length direction are inside of the conductive film 1412 and the distance between the side edge of the conductive film 1412 and each of the side edges of the regions 1461d and 1461e is d. In that case, the thickness $t_{406}$ of the insulating film 1406 and the distance d preferably satisfy $0.25\ t_{406} < d < t_{406}$.

In the above manner, the regions 1461d and 1461e are formed in part of the region where the metal oxide 1430 and the conductive film 1412 overlap with each other. Accordingly, the channel formation region of the transistor 1400f is in contact with the low-resistance regions 1461d and 1461e and a high-resistance offset region is not formed between the region 1461a and each of the regions 1461d and 1461e, so that the on-state current of the transistor 1400f can be increased. Furthermore, since the side edges of the regions 1461d and 1461e in the channel length direction are formed so as to satisfy the above range, the regions 1461d and 1461e can be prevented from being formed too deeply in the channel formation region and always conducted.

The regions 1461b to 1461e are formed by ion doping treatment such as an ion implantation method. Therefore, as illustrated in FIG. 30D, in some cases, the boundary between the regions 1461d and 1461a around the lower surface of the metal oxide 1431 is formed closer to the A1 side of the dashed-dotted line A1-A2 than the boundary between the regions 1461d and 1461a around the upper surface of the metal oxide 1433 is; in other words, the boundary is formed closer to the A1 side in the deeper region. The distance d in that case is the distance between the boundary between the regions 1461d and 1461a which is closest to the inner part of the conductive film 1412 in the direction of the dashed-dotted line A1-A2 and the side edge of the conductive film 1412 at A1 side in the direction of the dashed-dotted line A1-A2. Similarly, the boundary between the regions 1461e and 1461a around the lower surface of the metal oxide 1431 is formed closer to the A2 side of the dashed-dotted line A1-A2 than the boundary between the regions 1461e and 1461a around the upper surface of the metal oxide 1433 is; in other words, the boundary is formed closer to the A2 side in the deeper region. The distance d in that case is the distance between the boundary between the regions 1461e and 1461a which is closest to the inner part of the conductive film 1412 in the direction of the dashed-dotted line A1-A2 and the side edge of the conductive film 1412 at A2 side in the direction of the dashed-dotted line A1-A2.

In some cases, for example, the regions 1461d and 1461e in the metal oxide 1431 do not overlap with the conductive film 1412. In that case, at least part of the regions 1461d and 1461e in the metal oxide 1431 or 1432 is preferably formed in a region overlapping with the conductive film 1412.

In addition, low-resistance regions 1451 and 1452 are preferably formed in the metal oxide 1431, the metal oxide 1432, and the metal oxide 1433 in the vicinity of the interface with the insulating film 1407. The low-resistance regions 1451 and 1452 contain at least one of elements included in the insulating film 1407. Preferably, part of the low-resistance regions 1451 and 1452 is substantially in contact with or overlaps partly with the region (the channel formation region) of the metal oxide 1432 that overlaps with the conductive film 1412.

Since a large part of the metal oxide 1433 is in contact with the insulating film 1407, the low-resistance regions 1451 and 1452 are likely to be formed in the metal oxide 1433. The low-resistance regions 1451 and 1452 in the metal oxide 1433 contain a higher concentration of elements included in the insulating film 1407 than the other regions of the metal oxide 1433 (e.g., the region of the metal oxide 1433 that overlaps with the conductive film 1412).

The low-resistance regions 1451 and 1452 are formed in the regions 1461b and 1461c, respectively. Ideally, the metal oxide 1430 has a structure in which the concentration of added elements is the highest in the low-resistance regions 1451 and 1452, the second highest in the regions 1461b to 1461e other than the low-resistance regions 1451 and 1452, and the lowest in the region 1461a. The added elements refer to a dopant for forming the regions 1461b and 1461c and an element added from the insulating film 1407 to the low-resistance regions 1451 and 1452.

Although the low-resistance regions 1451 and 1452 are formed in the transistor 1400f, the semiconductor device shown in this embodiment is not limited to this structure. For example, the low-resistance regions 1451 and 1452 are not necessarily formed in the case where the regions 1461b and 1461c have a sufficiently low resistance.

Structure Example 7 of Transistor

Figure 31A:
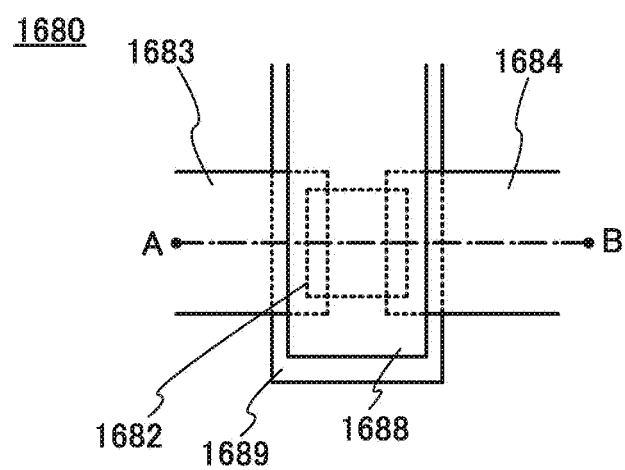
FIGS. 31A and 31B are a top view and a cross-sectional view showing a structure example of a transistor.
Figure 31B:
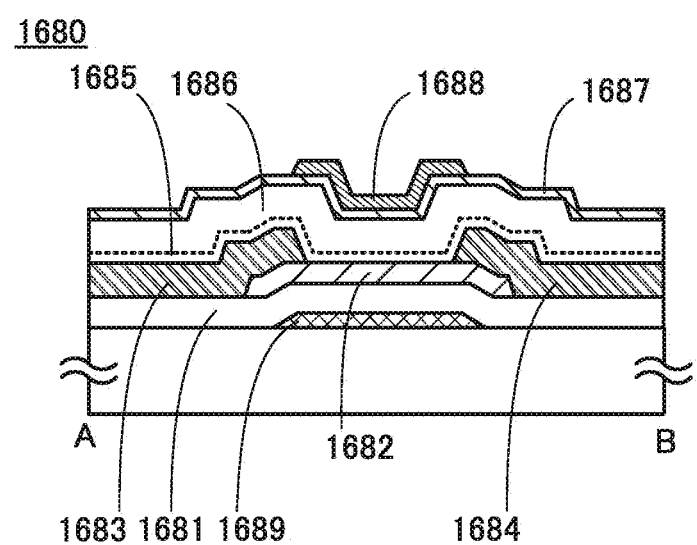

FIGS. 31A and 31B are a top view and a cross-sectional view of a transistor 1680. FIG. 31A is a top view, and FIG. 31B is a cross-sectional view taken along dashed-dotted line A-B in FIG. 31A. Note that for simplification of the drawing, some components are increased or reduced in size, or omitted in FIGS. 31A and 31B. The dashed-dotted line A-B direction may be referred to as a channel length direction.

The transistor 1680 shown in FIG. 31B includes a conductive film 1689 serving as a first gate, a conductive film 1688 serving as a second gate, a semiconductor 1682, a conductive film 1683 and a conductive film 1684 serving as a source and a drain, an insulating film 1681, an insulating film 1685, an insulating film 1686, and an insulating film 1687.

The conductive film 1689 is on an insulating surface. The conductive film 1689 overlaps with the semiconductor 1682 with the insulating film 1681 provided therebetween. The conductive film 1688 overlaps with the semiconductor 1682 with the insulating films 1685, 1686, and 1687 provided therebetween. The conductive films 1683 and 1684 are connected to the semiconductor 1682.

The description of the conductive films 1411 to 1414 in FIGS. 23A to 23C can be referred to for the details of the conductive films 1689 and 1688.

The conductive films 1689 and 1688 may be supplied with different potentials, or may be supplied with the same potential at the same time. Owing to the conductive film 1688 serving as the second gate electrode in the transistor 1680, threshold voltage can be stable. Note that the conductive film 1688 is not necessarily provided.

The description of the metal oxide 1432 in FIGS. 23A to 23C can be referred to for the details of the semiconductor 1682. The semiconductor 1682 may be a single layer or a stack including a plurality of semiconductor layers.

The description of the conductive films 1421 to 1424 in FIGS. 23A to 23C can be referred to for the details of the conductive films 1683 and 1684.

The description of the insulating film 1406 in FIGS. 23A to 23C can be referred to for the details of the insulating film 1681.

The insulating films 1685 to 1687 are sequentially stacked over the semiconductor 1682 and the conductive films 1683 and 1684 in FIG. 31B; however, an insulating film provided over the semiconductor 1682 and the conductive films 1683 and 1684 may be a single layer or a stack including a plurality of insulating films.

In the case of using an oxide semiconductor as the semiconductor 1682, the insulating film 1686 preferably contains oxygen at a proportion higher than or equal to that in the stoichiometric composition and has a function of supplying part of oxygen to the semiconductor 1682 by heating. Note that in the case where the semiconductor 1682 is damaged at the time of formation of the insulating film 1686 when the insulating film 1686 is directly formed on the semiconductor 1682, the insulating film 1685 is preferably provided between the semiconductor 1682 and the insulating film 1686, as shown in FIG. 31B. The insulating film 1685 preferably allows oxygen to pass therethrough, and causes little damage to the semiconductor 1682 when the insulating film 1685 is formed compared with the case of the insulating film 1686. If the insulating film 1686 can be formed directly on the semiconductor 1682 while damage to the semiconductor 1682 is reduced, the insulating film 1685 is not necessarily provided.

For the insulating films 1685 and 1686, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 1687 preferably has an effect of blocking diffusion of oxygen, hydrogen, and water. Alternatively, the insulating film 1687 preferably has an effect of blocking diffusion of hydrogen and water.

As an insulating film has higher density and becomes denser or has a fewer dangling bonds and becomes more chemically stable, the insulating film has a higher blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 1687 has an effect of blocking diffusion of water, hydrogen, and the like, impurities such as water and hydrogen that exist in a resin in a panel or exist outside the panel can be prevented from entering the semiconductor 1682. In the case where an oxide semiconductor is used as the semiconductor 1682, part of water or hydrogen that enters the oxide semiconductor serves as an electron donor (donor). Thus, the use of the insulating film 1687 having the blocking effect can prevent a shift in the threshold voltage of the transistor 1680 due to generation of donors.

In addition, in the case where an oxide semiconductor is used as the semiconductor 1682, the insulating film 1687 has an effect of blocking diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 1680 due to generation of donors can be prevented.

This embodiment can be combined with any of the other embodiments in this specification as appropriate.

Embodiment 5

Described in this embodiment is a structure of an oxide semiconductor film capable of being used for the OS transistors described in the above embodiments.

<Structure of Oxide Semiconductor>

An oxide semiconductor is classified into a single crystal oxide semiconductor and a non-single-crystal oxide semiconductor. Examples of a non-single-crystal oxide semiconductor include a c-axis-aligned and a-b-plane anchored crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 32A:
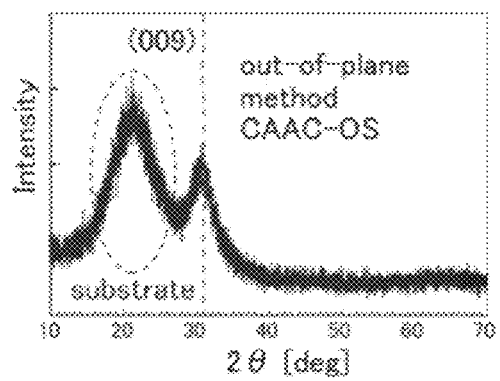
FIGS. 32A to 32E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 32A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at 2θ of around 36° is attributed to a crystal structure classified into the space group Fd-3m; thus, this peak is preferably not exhibited in the CAAC-OS.

Figure 32B:
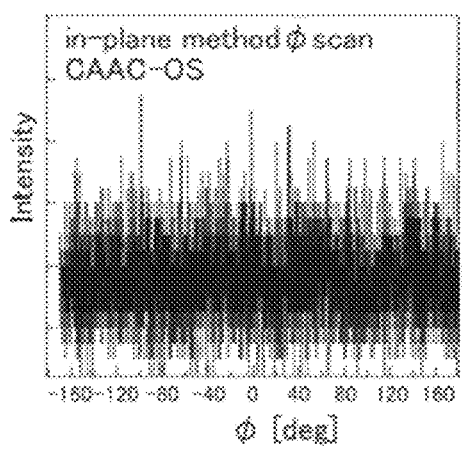
Figure 32C:
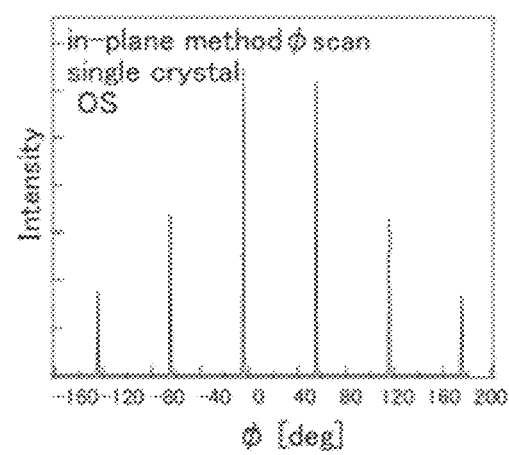

On the other hand, in structural analysis of the CAAC-OS by an in-plane method in which an X-ray is incident on the CAAC-OS in a direction parallel to the formation surface, a peak appears at a 2θ of around 56°. This peak is derived from the (110) plane of the InGaZnO$_4$ crystal. When analysis (φ scan) is performed with 2θ fixed at around 56° and with the sample rotated using a normal vector to the sample surface as an axis (φ axis), as shown in FIG. 32B, a peak is not clearly observed. In contrast, in the case where single crystal InGaZnO$_4$ is subjected to φ scan with 2θ fixed at around 56°, as shown in FIG. 32C, six peaks which are derived from crystal planes equivalent to the (110) plane are observed. Accordingly, the structural analysis using XRD shows that the directions of a-axes and b-axes are irregularly oriented in the CAAC-OS.

Figure 32D:
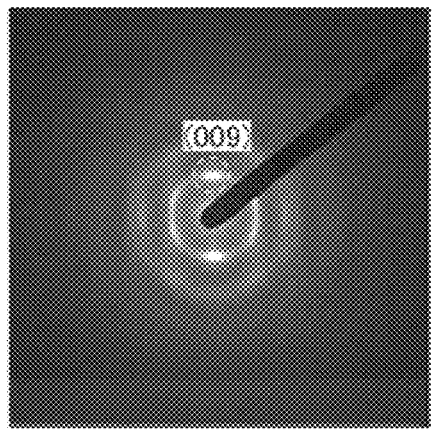
Figure 32E:
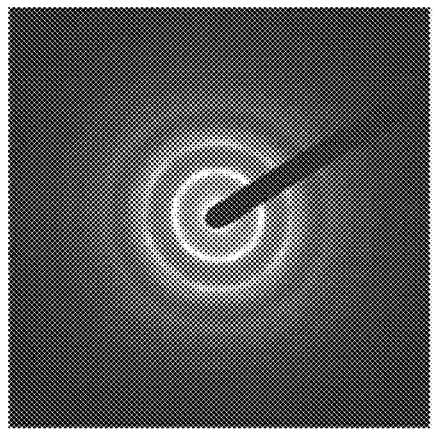

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 32D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 32E shows a diffraction pattern obtained in such a manner that an electron beam with a probe diameter of 300 nm is incident on the same sample in a direction perpendicular to the sample surface. As shown in FIG. 32E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 32E is considered to be derived from the (010) plane, the (100) plane, and the like of the InGaZnO$_4$ crystal. The second ring in FIG. 32E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 33A:
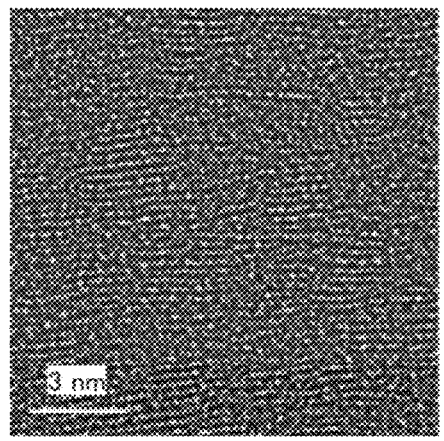
FIGS. 33A to 33E show a cross-sectional TEM image and plan-view TEM images of a CAAC-OS and images obtained through analysis thereof.

FIG. 33A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 33A shows pellets in which metal atoms are arranged in a layered manner. FIG. 33A shows that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 33B:
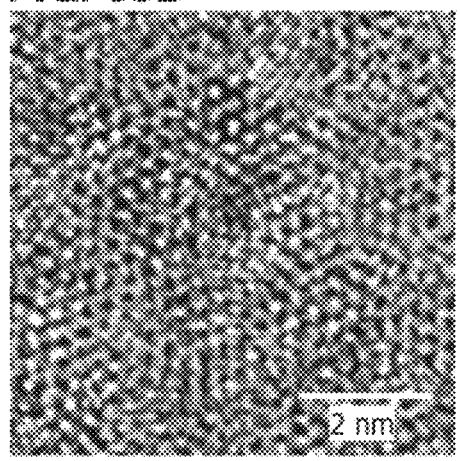
Figure 33C:
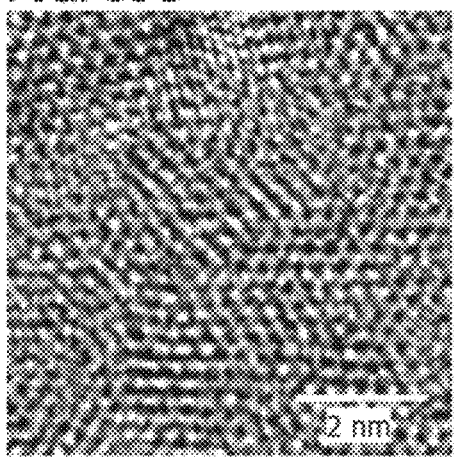
Figure 33D:
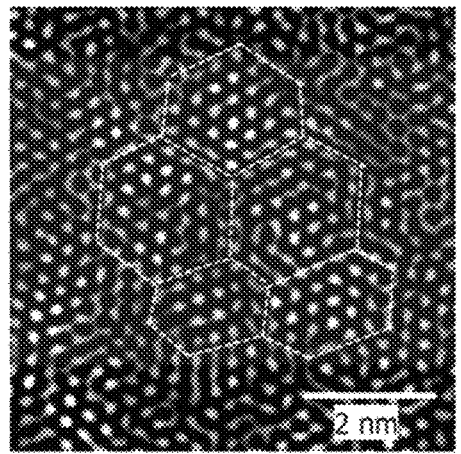
Figure 33E:
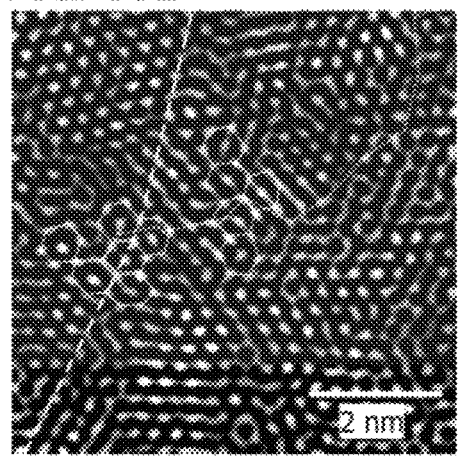

FIGS. 33B and 33C show Cs-corrected high-resolution TEM images of a plane of the CAAC-OS observed from a direction substantially perpendicular to the sample surface. FIGS. 33D and 33E are images obtained through image processing of FIGS. 33B and 33C. The method of image processing is as follows. The image in FIG. 33B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 33D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 33E, a dotted line denotes a portion where the direction of a lattice arrangement changes between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density (specifically, lower than $8\times10^{11}$ cm$^{-3}$, preferably lower than $1\times10^{11}$ cm$^{-3}$, further preferably lower than $1\times10^{10}$ cm$^{-3}$, and is higher than or equal to $1\times10^{-9}$ cm$^{-3}$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 34A:
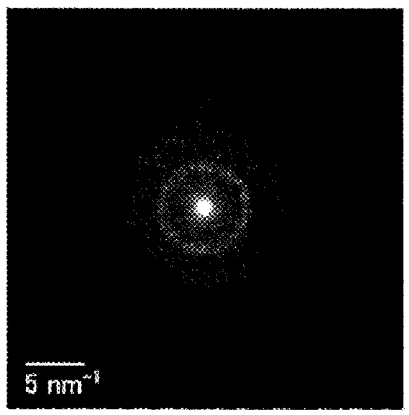
FIGS. 34A to 34D show electron diffraction patterns and a cross-sectional TEM image of an nc-OS.
Figure 34B:
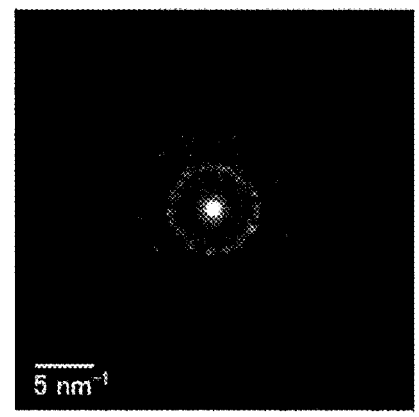

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 34A is observed. FIG. 34B shows a diffraction pattern obtained when an electron beam with a probe diameter of 1 nm is incident on the same sample. As shown in FIG. 34B, a plurality of spots are observed in a ring-like region. In other words, ordering in an nc-OS is not observed with an electron beam with a probe diameter of 50 nm but is observed with an electron beam with a probe diameter of 1 nm.

Figure 34C:
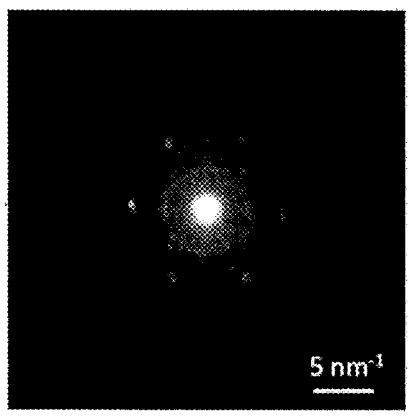

Furthermore, an electron diffraction pattern in which spots are arranged in an approximately hexagonal shape is observed in some cases as shown in FIG. 34C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 34D:
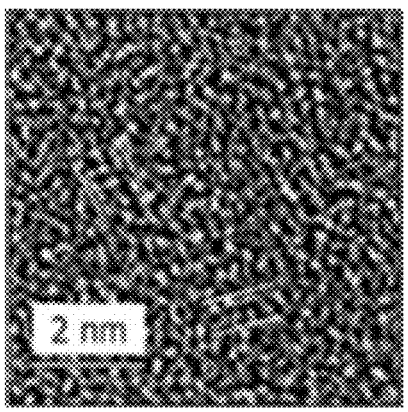

FIG. 34D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 34D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. For example, in a high-resolution TEM image of the nc-OS film, a grain boundary is not always found clearly. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

Figure 35A:
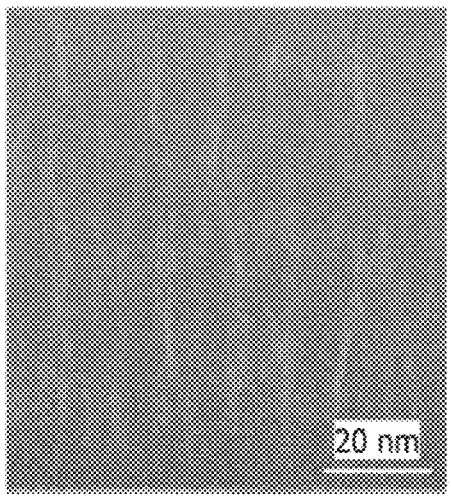
FIGS. 35A and 35B show cross-sectional TEM images of an a-like OS.
Figure 35B:
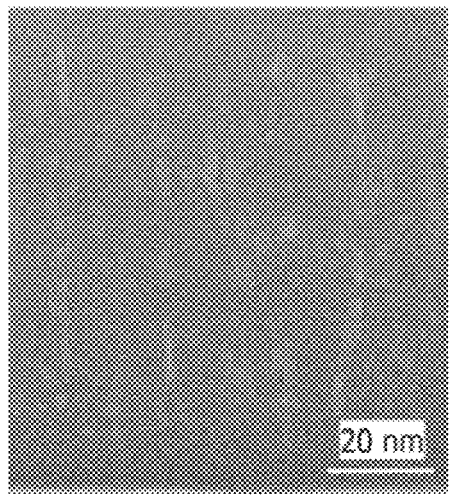

FIGS. 35A and 35B are high-resolution cross-sectional TEM images of an a-like OS. FIG. 35A is the high-resolution cross-sectional TEM image of the a-like OS at the start of the electron irradiation. FIG. 35B is the high-resolution cross-sectional TEM image of a-like OS after the electron ($e^-$) irradiation at $4.3 \times 10^8$ $e^-/nm^2$. FIGS. 35A and 35B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it includes a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 36:
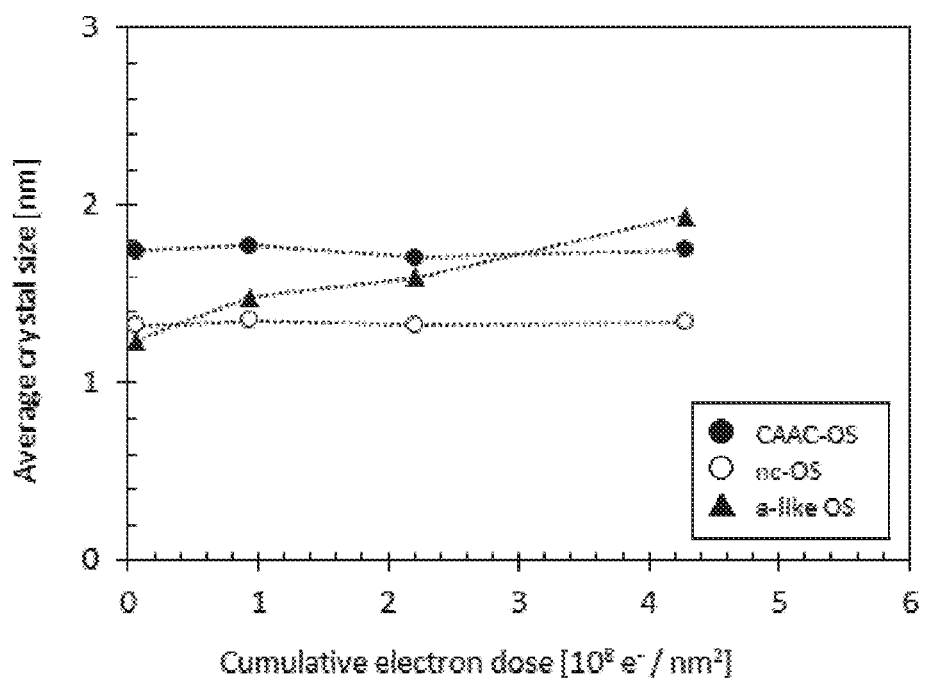
FIG. 36 shows a change of crystal parts of an In—Ga—Zn oxide owing to electron irradiation.

FIG. 36 shows change in the average size of crystal parts (at 22 points to 30 points) in each sample. Note that the crystal part size corresponds to the length of a lattice fringe. FIG. 36 indicates that the crystal part size in the a-like OS increases with an increase in the cumulative electron dose in obtaining TEM images, for example. As shown in FIG. 36, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 36, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiations were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

This embodiment can be combined with any of the other embodiments in this specification as appropriate.

Embodiment 6

Composition of CAC-OS

Described below is the composition of a cloud aligned complementary oxide semiconductor (CAC-OS) applicable to a transistor disclosed in one embodiment of the present invention.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification, a metal oxide in which regions functioning as a conductor and regions functioning as a dielectric are mixed and which functions as a semiconductor as a whole is defined as a CAC-OS or a CAC-metal oxide.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 0.5 nm and less than or equal to 3 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0), gallium zinc oxide (Ga$_{X4}$Zn$_{Y4}$O$_{Z4}$, where X4, Y4, and Z4 are real numbers greater than 0), or the like, and a mosaic pattern is formed. Then, InO$_{X1}$ and In$_{X2}$Zn$_{Y2}$O$_{Z2}$ forming the mosaic pattern are evenly distributed in the film. This composition is also referred to as a cloud-like composition.

That is, the CAC-OS is a composite oxide semiconductor with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the ab plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part thereof, and these nanoparticle regions are randomly dispersed to form a mosaic pattern in the CAC-OS.

<Analysis of CAC-OS>

Next, measurement results of an oxide semiconductor over a substrate by a variety of methods are described.

<<Structure of Samples and Formation Method Thereof>>

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R. T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

<<Analysis by X-Ray Diffraction>>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 37:
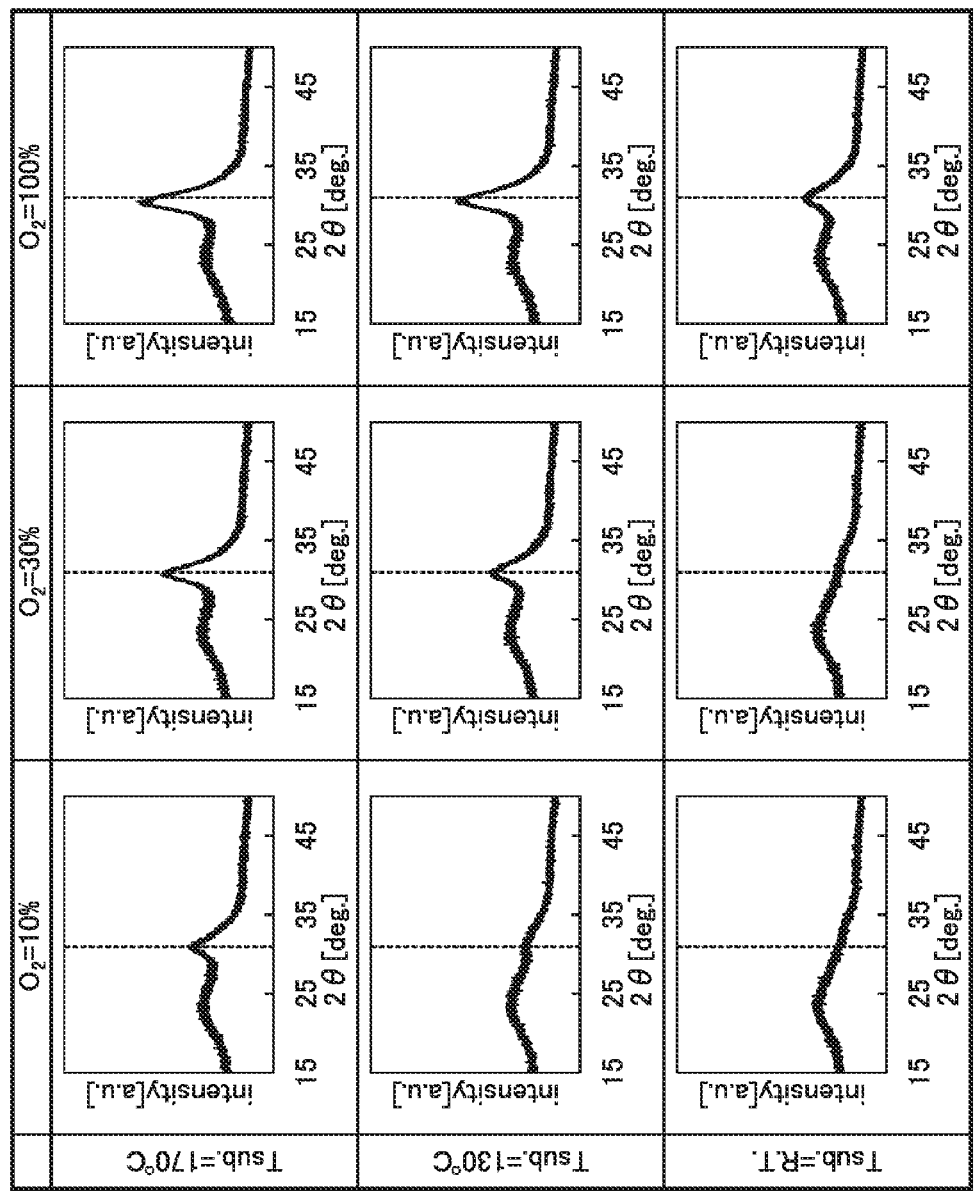
FIG. 37 shows measured XRD spectra of samples.

FIG. 37 shows XRD spectra measured by an out-of-plane method. In FIG. 37, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 37, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 37, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<<Analysis with Electron Microscope>>

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 38A is a plan-view TEM image of the sample formed at a substrate temperature of R.T. and with an oxygen gas flow rate ratio of 10%. FIG. 38B is a cross-sectional TEM image of the sample formed at a substrate temperature of R.T. and with an oxygen gas flow rate ratio of 10%.

<<Analysis of Electron Diffraction Patterns>>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Figure 38C:
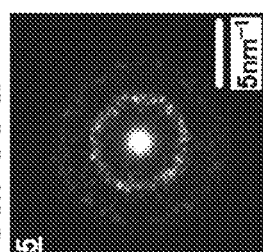
Figure 38D:
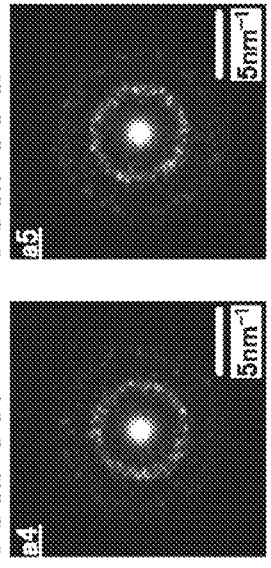
Figure 38E:
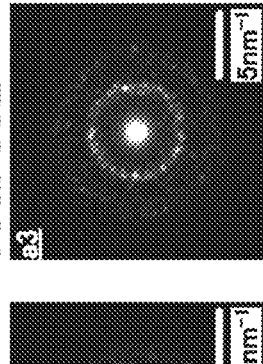
Figure 38F:
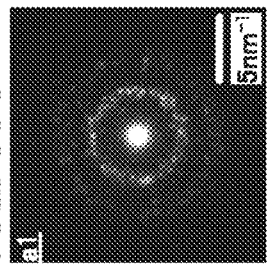
Figure 38H:
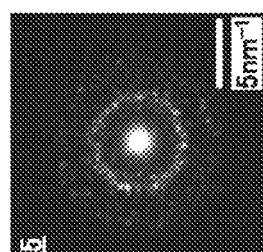
Figure 38I:
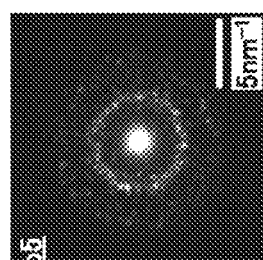
Figure 38J:
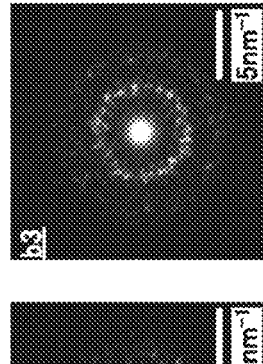
Figure 38K:
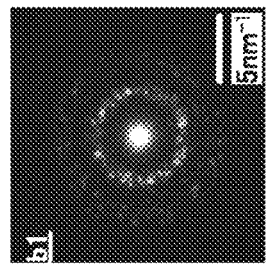

Electron diffraction patterns of points indicated by black dots a1, a2, a3, a4, and a5 in the plan-view TEM image in FIG. 38A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 38C, 38D, 38E, 38F, and 38G show the results of the points indicated by the black dots a1, a2, a3, a4, and a5, respectively.

In FIGS. 38C, 38D, 38E, 38F, and 38G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 38B of the sample formed at a substrate temperature of R.T. and an oxygen gas flow rate ratio of 10% are observed. FIGS. 38H, 38I, 38J, 38K, and 38L show the results of the points indicated by the black dots b1, b2, b3, b4, and b5, respectively.

In FIGS. 38H, 38I, 38J, 38K, and 38L, regions with high luminance in a ring pattern can be shown. Furthermore, a plurality of spots can be shown in a ring-like shape.

For example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 39A:
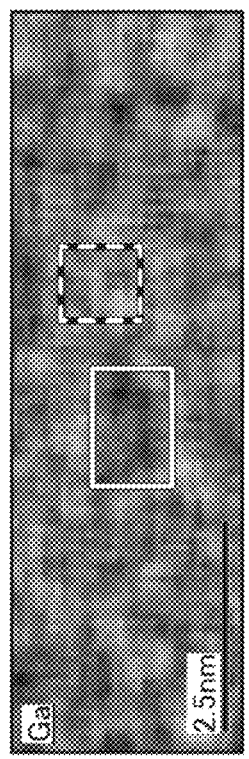
FIGS. 39A to 39C show EDX mapping images of a sample.
Figure 39B:
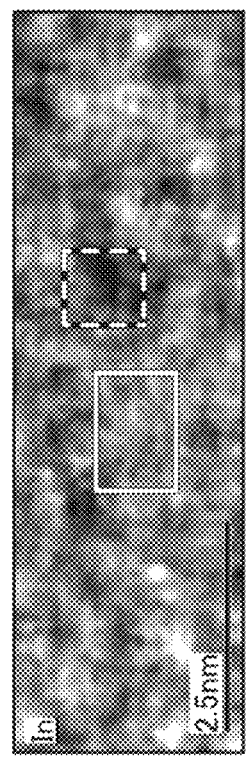
Figure 39C:
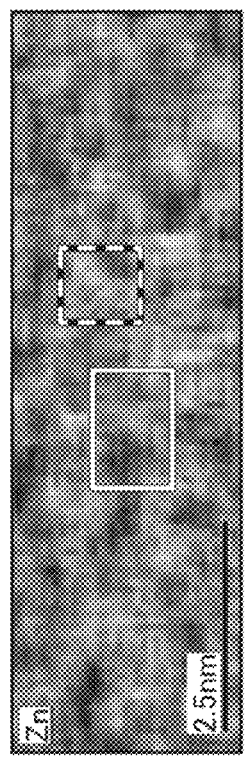

FIGS. 39A to 39C show EDX mapping images in a cross section of the sample formed at a substrate temperature of R.T. and with an oxygen gas flow rate ratio of 10%. FIG. 39A shows an EDX mapping image of Ga atoms. The proportion of the Ga atoms in all the atoms is 1.18 atomic % to 18.64 atomic %. FIG. 39B shows an EDX mapping image of In atoms. The proportion of the In atoms in all the atoms is 9.28 atomic % to 33.74 atomic %. FIG. 39C shows an EDX mapping image of Zn atoms. The proportion of the Zn atoms in all the atoms is 6.69 atomic % to 24.99 atomic %. FIGS. 39A to 39C show the same region in the cross section of the sample formed at a substrate temperature of R.T. and with an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 39A to 39C is 7200000 times.

The EDX mapping images in FIGS. 39A to 39C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 39A to 39C are examined.

In FIG. 39A, a relatively dark region occupies a large area in the area surrounded by the solid line, while a relatively bright region occupies a large area in the area surrounded by the dashed line. In FIG. 39B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 39C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, and the like as main components.

The area surrounded by the solid line is a region including a relatively small number of Ga atoms and the area surrounded by the dashed line is a region including a relatively large number of Ga atoms. In FIG. 39C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, and the like as main components.

Furthermore, as shown in FIGS. 39A to 39C, the In atoms are relatively more uniformly distributed than the Ga atoms, and regions including $InO_{X1}$ as a main component is seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or the like as a main component and the regions including $In_{x2}Zn_{y2}O_{z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIGS. 39A to 39C, each of the regions including $GaO_{X3}$ or the like as a main component and the regions including $In_{x2}Zn_{y2}O_{z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{x2}Zn_{y2}O_{z2}$ or $InO_{X1}$ as a main component are separated to form a mosaic pattern.

The conductivity of a region including $In_{x2}Zn_{y2}O_{z2}$ or $InO_{X1}$ as a main component is higher than that of a region including $GaO_{X3}$ or the like as a main component. In other words, when carriers flow through regions including $In_{x2}Zn_{y2}O_{z2}$ or $InO_{X1}$ as a main component, the conductivity of an oxide semiconductor exhibits. Accordingly, when regions including $In_{x2}Zn_{y2}O_{z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{x2}Zn_{y2}O_{z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{x2}Zn_{y2}O_{z2}$ or $InO_{X1}$ complement each other, whereby high on-state current (Ion) and high field-effect mobility ($\mu$) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments described in this specification as appropriate.

(Supplementary Notes on the Description in this Specification and the Like)

The following are notes on the description of the above embodiments and structures in the embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structural examples is given in one embodiment, any of the structure examples can be combined as appropriate.

Note that what is described (or part thereof) in an embodiment can be applied to, combined with, or replaced with another content (or part thereof) in the same embodiment and/or what is described (or part thereof) in another embodiment or other embodiments.

Note that in each embodiment, a content described in the embodiment is a content described with reference to a variety of diagrams or a content described with a text described in this specification.

Note that by combining a diagram (or part thereof) illustrated in one embodiment with another part of the diagram, a different diagram (or part thereof) illustrated in the embodiment, and/or a diagram (or part thereof) illustrated in one or a plurality of different embodiments, much more diagrams can be formed.

<Notes on Ordinal Numbers>

In this specification and the like, ordinal numbers such as first, second, and third are used in order to avoid confusion among components. Thus, the terms do not limit the number or order of components. In the present specification and the like, a "first" component in one embodiment can be referred to as a "second" component in other embodiments or claims. Furthermore, in the present specification and the like, a "first" component in one embodiment can be referred to without the ordinal number in other embodiments or claims.

<Notes on the Description for Drawings>

Embodiments are described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the description of the embodiments. Note that in the structures of the embodiments, the same portions or portions having similar functions are denoted by the same reference numerals in different drawings, and the description of such portions is not repeated.

In this specification and the like, terms for explaining arrangement, such as over and under, are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "under" does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, the segmentation of a block in the block diagrams is not limited by any of the components described in the specification, and can be differently determined as appropriate depending on situations.

In drawings, the size, the layer thickness, or the region is determined arbitrarily for description convenience. Therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as plan views (also referred to as layout views) and perspective views, some of components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification and the like, in describing connections of a transistor, expressions "one of a source and a drain" (or a first electrode or a first terminal) and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film", "layer", and the like can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer". For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring," "signal line," "power supply line," and the like can be interchanged with each other depending on circumstances or conditions. For example, the term "wiring" can be changed into the term such as "signal line" or "power supply line" in some cases. The term such as "signal line" or "power supply line" can be changed into the term "wiring" in some cases. The term such as "power supply line" can be changed into the term such as "signal line" in some cases. The term such as "signal line" can be changed into the term such as "power supply line" in some cases. The term "potential" that is applied to a wiring can be changed into the term "signal" or the like depending on circumstances or conditions. Inversely, the term "signal" or the like can be changed into the term "potential" in some cases.

<Notes on Definitions of Terms>

The following are definitions of the terms mentioned in the above embodiments.

<<Semiconductor>>

In this specification, a "semiconductor" may have characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components; specific examples are hydrogen (included in water), lithium, sodium, silicon, boron, phosphorus, carbon, and nitrogen. In the case of an oxide semiconductor, oxygen vacancy may be formed by entry of impurities such as hydrogen. Furthermore, when the semiconductor is a silicon layer, examples of an impurity which changes the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor includes a channel formation region between the drain (a drain terminal, a drain region, or a drain electrode) and the source (a source terminal, a source region, or a source electrode) and current can flow through the drain, the channel formation region, and the source. Note that in this specification and the like, a channel formation region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

<<Switch>>

In this specification and the like, a switch is in a conductive state (on state) or in a non-conductive state (off state) to determine whether current flows therethrough or not. Alternatively, a switch has a function of selecting and changing a current path.

For example, an electrical switch, a mechanical switch, or the like can be used as a switch. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically disconnected. In the case where a transistor operates just as a switch, the polarity (conductivity type) of the transistor is not particularly limited to a certain type.

An example of a mechanical switch is a switch formed using a technology of micro electro mechanical systems (MEMS), such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

In one transistor, channel lengths in all regions are not necessarily the same. In other words, the channel length of one transistor is not limited to one value in some cases. Therefore, in this specification, the channel length is any one of values, the maximum value, the minimum value, or the average value, in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

In one transistor, channel widths in all regions do not necessarily have the same value. In other words, a channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that a semiconductor has a known shape. Therefore, in the case where the shape of a semiconductor is unclear, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

<<High Level Potential and Low Level Potential>>

In this specification, when there is a description saying that a high level potential is applied to a wiring, the high level potential sometimes means at least one of the following potentials: a potential high enough to turn on an n-channel transistor with a gate connected to the wiring; and a potential high enough to turn off a p-channel transistor with a gate connected to the wiring. Thus, when high level potentials are applied to different two or more wirings, the high level potentials applied to the wirings may be at different levels.

In this specification, when there is a description saying that a low level potential is applied to a wiring, the low level potential sometimes means at least one of the following potentials: a potential low enough to turn off an n-channel transistor with a gate connected to the wiring; and a potential low enough to turn on a p-channel transistor with a gate connected to the wiring. Thus, when low level potentials are applied to different two or more wirings, the low level potentials applied to the wirings may be at different levels.

<<Connection>>

In this specification and the like, when it is described that X and Y are connected, the case where X and Y are electrically connected, the case where X and Y are functionally connected, and the case where X and Y are directly connected are included therein. Accordingly, a connection relation other than the predetermined connection relation, for example, a connection relation other than that shown in drawings and texts, is also allowed.

Here, X, Y, and the like each denote an object (e.g., a device, an element, a circuit, a wiring, an electrode, a terminal, a conductive film, a layer, or the like).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. Note that, for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

<<Trigonal and Rhombohedral>>

In this specification, trigonal and rhombohedral crystal systems are included in a hexagonal crystal system.

This application is based on Japanese Patent Application serial no. 2015-143919 filed with Japan Patent Office on Jul. 21, 2015 and Japanese Patent Application serial no. 2016-119551 filed with Japan Patent Office on Jun. 16, 2016, the entire contents of which are hereby incorporated by reference.

What is claimed is:

1. A semiconductor device comprising:
   a memory cell;
   a first circuit;
   a second circuit; and
   a first wiring,
   wherein the memory cell is electrically connected to the first wiring,
   wherein the first circuit is electrically connected to the first wiring,
   wherein the second circuit is electrically connected to the first wiring,
   wherein the first circuit is configured to supply the first wiring with a first current corresponding to first data and to supply the first wiring with a second current corresponding to second data,
   wherein the memory cell is configured to store a charge corresponding to the first current and to determine the amount of a current to be flown from the first wiring to the memory cell, and
   wherein the second circuit is configured to generate a differential current between the amount of the current and the amount of the second current.

2. The semiconductor device according to claim 1,
   wherein the memory cell includes a first transistor, a second transistor, a third transistor, and a capacitor, wherein one of a source and a drain of the first transistor is electrically connected to one of a source and a drain of the second transistor and one of a source and a drain of the third transistor, wherein the other of the source and the drain of the first transistor is electrically connected to a first electrode of the capacitor, wherein a gate of the first transistor is electrically connected to the other of the source and the drain of the third transistor and a second electrode of the capacitor, wherein the other of the source and the drain of the second transistor is electrically connected to the first wiring, and wherein the other of the source and the drain of the first transistor is supplied with a first potential.

3. The semiconductor device according to claim 2,
wherein each of the first, second, and third transistors includes an oxide semiconductor in a channel formation region.

4. The semiconductor device according to claim 1,
wherein the second circuit includes a fourth transistor, a fifth transistor, a sixth transistor, a second wiring, and a third wiring, wherein one of a source and a drain of the fourth transistor is electrically connected to one of a source and a drain of the fifth transistor, one of a source and a drain of the sixth transistor, and a gate of the sixth transistor, wherein the other of the source and the drain of the fourth transistor is electrically connected to the first wiring, wherein the other of the source and the drain of the fifth transistor is electrically connected to a gate of the fifth transistor and the second wiring, and wherein the other of the source and the drain of the sixth transistor is electrically connected to the third wiring.

5. The semiconductor device according to claim 4,
wherein the second circuit further includes a seventh transistor, an eighth transistor, a ninth transistor, a tenth transistor, an eleventh transistor, a first comparator, a second comparator, a first current mirror circuit, and a fourth wiring, wherein an inverting input terminal of the first comparator is supplied with a second potential, wherein a non-inverting input terminal of the first comparator is electrically connected to the second wiring and one of a source and a drain of the seventh transistor, wherein an output terminal of the first comparator is electrically connected to a gate of the seventh transistor and a gate of the eighth transistor, wherein one of a source and a drain of the eighth transistor is electrically connected to an output terminal of the first current mirror circuit, one of a source and a drain of the eleventh transistor, and the fourth wiring, wherein an inverting input terminal of the second comparator is supplied with a third potential, wherein a non-inverting input terminal of the second comparator is electrically connected to the third wiring and one of a source and a drain of the ninth transistor, wherein an output terminal of the second comparator is electrically connected a gate of the ninth transistor and a gate of the tenth transistor, wherein one of a source and a drain of the tenth transistor is electrically connected to an input terminal of the first current mirror circuit, wherein the other of the source and the drain of the seventh transistor, the other of the source and the drain of the eighth transistor, and a potential input terminal of the first current mirror circuit are supplied with a fourth potential, wherein the other of the source and the drain of the ninth transistor and the other of the source and the drain of the tenth transistor are supplied with a fifth potential, wherein the other of the source and the drain of the eleventh transistor is supplied with a sixth potential, wherein the seventh transistor and the eighth transistor are p-channel transistors, wherein the ninth transistor, the tenth transistor, and the eleventh transistor are n-channel transistors, and wherein the fourth wiring outputs an analog value.

6. The semiconductor device according to claim 4,
wherein the second circuit further includes a seventh transistor, an eighth transistor, a ninth transistor, a tenth transistor, an eleventh transistor, a first comparator, a second comparator, a first current mirror circuit, and a fourth wiring, wherein an inverting input terminal of the first comparator is supplied with a second potential, wherein a non-inverting input terminal of the first comparator is electrically connected to the second wiring and one of a source and a drain of the seventh transistor, wherein an output terminal of the first comparator is electrically connected to a gate of the seventh transistor and a gate of the eighth transistor, wherein an inverting input terminal of the second comparator is supplied with a third potential, wherein a non-inverting input terminal of the second comparator is electrically connected to the third wiring and one of a source and a drain of the ninth transistor, wherein an output terminal of the second comparator is electrically connected a gate of the ninth transistor and a gate of the tenth transistor, wherein one of a source and a drain of the tenth transistor is electrically connected to an output terminal of the first current mirror circuit, one of a source and a drain of the eleventh transistor, and the fourth wiring, wherein one of a source and a drain of the eighth transistor is electrically connected to an input terminal of the first current mirror circuit, wherein the other of the source and the drain of the seventh transistor and the other of the source and the drain of the eighth transistor are supplied with a fourth potential, wherein the other of the source and the drain of the ninth transistor, the other of the source and the drain of the tenth transistor, and a potential input terminal of the first current mirror circuit are supplied with a fifth potential, wherein the other of the source and the drain of the eleventh transistor is supplied with a sixth potential, wherein the seventh transistor and the eighth transistor are p-channel transistors, wherein the ninth transistor, the tenth transistor, and the eleventh transistor are n-channel transistors, and wherein the fourth wiring outputs an analog value.

7. The semiconductor device according to claim 1,
wherein the first circuit includes twelfth[1] to twelfth[s] transistors, a second current mirror circuit, and fifth[1] to fifth[s] wirings (s is an integer number of 1 or greater), wherein the channel width ratio of the twelfth[1] transistor to the twelfth[t] transistor is $1:2^{t-1}$ (t is an integer number greater than or equal to 1 and less than or equal to s), wherein an input terminal of the second current mirror circuit is electrically connected to one of a source and a drain of each of the twelfth[1] to twelfth[s] transistors, wherein an output terminal of the second current mirror circuit is electrically connected to the first wiring, wherein the other of the source and the drain of each of the twelfth[1] to twelfth[s] transistors is supplied with a first potential, wherein gates of the twelfth[1] to twelfth[s] transistors are electrically connected to the fifth[1] to fifth[s] wirings, respectively, and wherein each of the fifth[1] to fifth[s] wirings is supplied with a plurality of potentials constituting the first data or the second data.

8. The semiconductor device according to claim 1, wherein the first circuit includes $2^u - 1$ twelfth[1] to twelfth[$2^u - 1$] transistors, a second current mirror circuit, and u fifth[1] to fifth[u] wirings (u is an integer number of 1 or greater), wherein an input terminal of the second current mirror circuit is electrically connected to one of a source and a drain of each of the twelfth[1] to twelfth[$2^u - 1$] transistors, wherein an output terminal of the second current mirror circuit is electrically connected to the first wiring, wherein gates of the twelfth[$2^{v-1}$] to twelfth[$2^v - 1$] transistors are electrically connected to the fifth[v] wiring (v is an integer number greater than or equal to 1 and less than or equal to u), wherein the other of the source and the drain of each of the twelfth[1] to twelfth[$2^u - 1$] transistors is supplied with a first potential, and wherein each of the fifth[1] to fifth[u] wirings is supplied with a plurality of potentials constituting the first data or the second data.

9. A method of driving a semiconductor device comprising a memory cell, a first circuit, a second circuit, and a first wiring, wherein the memory cell is electrically connected to the first wiring, wherein the first circuit is electrically connected to the first wiring, wherein the second circuit is electrically connected to the first wiring, and wherein the method comprises the steps of:

supplying the memory cell with a first current corresponding to first data by the first circuit;

storing a charge corresponding to the first current in the memory cell and determining the amount of a current to be flown from the first wiring to the memory cell from the amount of the stored charge;

supplying the first wiring with a second current corresponding to second data by the first circuit; and supplying the second circuit with a difference between the amount of the current and the amount of the second current so that the first data and the second data are compared.

10. The method of driving the semiconductor device according to claim 9, wherein the memory cell includes a first transistor, a second transistor, a third transistor, and a capacitor, wherein one of a source and a drain of the first transistor is electrically connected to one of a source and a drain of the second transistor and one of a source and a drain of the third transistor, wherein the other of the source and the drain of the first transistor is electrically connected to a first electrode of the capacitor, wherein a gate of the first transistor is electrically connected to the other of the source and the drain of the third transistor and a second electrode of the capacitor, wherein the other of the source and the drain of the second transistor is electrically connected to the first wiring, and wherein the other of the source and the drain of the first transistor is supplied with a first potential.

11. The method of driving the semiconductor device according to claim 10, wherein each of the first, second, and third transistors includes an oxide semiconductor in a channel formation region.

12. The method of driving the semiconductor device according to claim 9, wherein the second circuit includes a fourth transistor, a fifth transistor, a sixth transistor, a second wiring, and a third wiring, wherein one of a source and a drain of the fourth transistor is electrically connected to one of a source and a drain of the fifth transistor, one of a source and a drain of the sixth transistor, and a gate of the sixth transistor, wherein the other of the source and the drain of the fourth transistor is electrically connected to the first wiring, wherein the other of the source and the drain of the fifth transistor is electrically connected to a gate of the fifth transistor and the second wiring, and wherein the other of the source and the drain of the sixth transistor is electrically connected to the third wiring.

13. The method of driving the semiconductor device according to claim 12, wherein the second circuit further includes a seventh transistor, an eighth transistor, a ninth transistor, a tenth transistor, an eleventh transistor, a first comparator, a second comparator, a first current mirror circuit, and a fourth wiring, wherein an inverting input terminal of the first comparator is supplied with a second potential, wherein a non-inverting input terminal of the first comparator is electrically connected to the second wiring and one of a source and a drain of the seventh transistor, wherein an output terminal of the first comparator is electrically connected to a gate of the seventh transistor and a gate of the eighth transistor, wherein one of a source and a drain of the eighth transistor is electrically connected to an output terminal of the first current mirror circuit, one of a source and a drain of the eleventh transistor, and the fourth wiring, wherein an inverting input terminal of the second comparator is supplied with a third potential, wherein a non-inverting input terminal of the second comparator is electrically connected to the third wiring and one of a source and a drain of the ninth transistor, wherein an output terminal of the second comparator is electrically connected a gate of the ninth transistor and a gate of the tenth transistor, wherein one of a source and a drain of the tenth transistor is electrically connected to an input terminal of the first current mirror circuit, wherein the other of the source and the drain of the seventh transistor, the other of the source and the drain of the eighth transistor, and a potential input terminal of the first current mirror circuit are supplied with a fourth potential, wherein the other of the source and the drain of the ninth transistor and the other of the source and the drain of the tenth transistor are supplied with a fifth potential, wherein the other of the source and the drain of the eleventh transistor is supplied with a sixth potential, wherein the seventh transistor and the eighth transistor are p-channel transistors, wherein the ninth transistor, the tenth transistor, and the eleventh transistor are n-channel transistors, and wherein the fourth wiring outputs an analog value.

14. The method of driving the semiconductor device according to claim 12, wherein the second circuit further includes a seventh transistor, an eighth transistor, a ninth transistor, a tenth transistor, an eleventh transistor, a first comparator, a second comparator, a first current mirror circuit, and a fourth wiring, wherein an inverting input terminal of the first comparator is supplied with a second potential, wherein a non-inverting input terminal of the first comparator is electrically connected to the second wiring and one of a source and a drain of the seventh transistor, wherein an output terminal of the first comparator is electrically connected to a gate of the seventh transistor and a gate of the eighth transistor, wherein an inverting input terminal of the second comparator is supplied with a third potential, wherein a non-inverting input terminal of the second comparator is electrically connected to the third wiring and one of a source and a drain of the ninth transistor, wherein an output terminal of the second comparator is electrically connected a gate of the ninth transistor and a gate of the tenth transistor, wherein one of a source and a drain of the tenth transistor is electrically connected to an output terminal of the first current mirror circuit, one of a source and a drain of the eleventh transistor, and the fourth wiring, wherein one of a source and a drain of the eighth transistor is electrically connected to an input terminal of the first current mirror circuit, wherein the other of the source and the drain of the seventh transistor and the other of the source and the drain of the eighth transistor are supplied with a fourth potential, wherein the other of the source and the drain of the ninth transistor, the other of the source and the drain of the tenth transistor, and a potential input terminal of the first current mirror circuit are supplied with a fifth potential, wherein the other of the source and the drain of the eleventh transistor is supplied with a sixth potential, wherein the seventh transistor and the eighth transistor are p-channel transistors, wherein the ninth transistor, the tenth transistor, and the eleventh transistor are n-channel transistors, and wherein the fourth wiring outputs an analog value.

15. The method of driving the semiconductor device according to claim 9, wherein the first circuit includes twelfth[1] to twelfth[s] transistors, a second current mirror circuit, and fifth[1] to fifth[s] wirings (s is an integer number of 1 or greater), wherein the channel width ratio of the twelfth[1] transistor to the twelfth[t] transistor is $1:2^{t-1}$ (t is an integer number greater than or equal to 1 and less than or equal to s), wherein an input terminal of the second current mirror circuit is electrically connected to one of a source and a drain of each of the twelfth[1] to twelfth[s] transistors, wherein an output terminal of the second current mirror circuit is electrically connected to the first wiring, wherein the other of the source and the drain of each of the twelfth[1] to twelfth[s] transistors is supplied with a first potential, wherein gates of the twelfth[1] to twelfth[s] transistors are electrically connected to the fifth[1] to fifth[s] wirings, respectively, and wherein each of the fifth[1] to fifth[s] wirings is supplied with a plurality of potentials constituting the first data or the second data.

16. The method of driving the semiconductor device according to claim 9, wherein the first circuit includes $2^u-1$ twelfth[1] to twelfth[$2^u-1$] transistors, a second current mirror circuit, and u fifth[1] to fifth[u] wirings (u is an integer number of 1 or greater), wherein an input terminal of the second current mirror circuit is electrically connected to one of a source and a drain of each of the twelfth[1] to twelfth[$2^u-1$] transistors, wherein an output terminal of the second current mirror circuit is electrically connected to the first wiring, wherein gates of the twelfth[$2^{v-1}$] to twelfth[$2^v-1$] transistors are electrically connected to the fifth[v] wiring (v is an integer number greater than or equal to 1 and less than or equal to u), wherein the other of the source and the drain of each of the twelfth[1] to twelfth[$2^u-1$] transistors is supplied with a first potential, and wherein each of the fifth[1] to fifth[u] wirings is supplied with a plurality of potentials constituting the first data or the second data.

* * * * *